(12) United States Patent
Shibuya

(10) Patent No.: US 7,267,925 B2
(45) Date of Patent: Sep. 11, 2007

(54) PHOTOSENSITIVE COMPOSITION AND NOVEL COMPOUND USED THEREFOR

(75) Inventor: Akinori Shibuya, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/813,136

(22) Filed: Mar. 31, 2004

(65) Prior Publication Data

US 2004/0191679 A1    Sep. 30, 2004

(30) Foreign Application Priority Data

Mar. 31, 2003 (JP) .................. P. 2003-096765
Sep. 3, 2003 (JP) .................. P. 2003-311253

(51) Int. Cl.
*G03F 7/031* (2006.01)
*G03F 7/032* (2006.01)

(52) U.S. Cl. .................. 430/286.1; 430/270.1; 430/281.1; 430/905; 430/913; 430/926

(58) Field of Classification Search .......... 430/270.1, 430/281.1, 286.1, 913, 926, 905
See application file for complete search history.

(56) References Cited

U.S. PATENT DOCUMENTS

| 2,739,888 | A |   | 3/1956  | Sawdey |
| 3,678,041 | A |   | 7/1972  | Mousseron |
| 4,195,179 | A |   | 3/1980  | Wells et al. |
| 6,322,950 | B1 |   | 11/2001 | Sorori et al. |
| 6,335,144 | B1 | * | 1/2002  | Murota et al. ........... 430/281.1 |
| 6,846,615 | B2 | * | 1/2005  | Okamoto ................... 430/302 |

FOREIGN PATENT DOCUMENTS

| EP | 1 048 982 A1 | 11/2000 |
| EP | 1 445 120 A2 | 8/2004 |
| JP | 2000-258910 A | 9/2000 |
| JP | 2001-100412 A | 4/2001 |

* cited by examiner

*Primary Examiner*—Barbara L. Gilliam
(74) *Attorney, Agent, or Firm*—Sughrue Mion, PLLC

(57) ABSTRACT

A photosensitive composition containing: a sensitizing dye represented by the formula (1) as defined herein; an initiator compound capable of generating a radical, an acid, or a base; and a compound whose physical or chemical characteristic irreversibly changes by at least one of a radical, an acid, and a base.

10 Claims, 3 Drawing Sheets

PHOTOSENSITIVE COMPOSITION AND NOVEL COMPOUND USED THEREFOR

FIELD OF THE INVENTION

The present invention relates to a photosensitive composition that is cured at a high sensitivity upon exposure and to a novel dye compound used therefor. In detail, the invention relates to a photosensitive composition useful as a photosensitive layer of a lithographic printing plate precursor capable of forming an image upon scanning exposure based on digital signals and to a novel dye compound that is excellent in a light-heat conversion ability.

BACKGROUND OF THE INVENTION

Hither, PS plates having a constitution in which an oleophilic photosensitive resin layer is provided on a hydrophilic support have been widely used as a lithographic printing plate. With respect to the production method thereof, in general, desired printing plates have been obtained by after mask exposure (surface exposure) through a lith film, dissolving and removing a non-image area.

In recent years, digital techniques for electronic processing, storage and output of image information using a computer have become widespread, and a variety of new image output systems corresponding thereto have been put into practical use. As a result, a computer-to-plate (CTP) technique in which light having high directivity, such as laser, is scanned according to digitalized image information, thereby directly producing a printing plate without the aid of a lith film is desired, and it is an important technical problem to obtain a printing plate precursor adaptive thereto.

As one of systems of obtaining such a scanning exposable lithographic printing plate, a system of forming an ink absorbing resin layer region on a support having a hydrophilic surface is employed. This is a material in which a negative working photosensitive layer that is cured upon scanning exposure to form an ink absorbing region is provided on a support, and a constitution using a photopolymerization system composition excellent in photosensitive speed is already proposed and put into practical use. A lithographic printing plate precursor of such a constitution is simple in development processing and has desired printing performance such that it is excellent in resolution, ink acceptability, printing resistance and staining property.

The foregoing photopolymerizable composition basically contains an ethylenically unsaturated bond-containing polymerizable compound and a photopolymerization initiation system, and a binder resin, if desired. In the photopolymerizable composition, the photoinitiation system absorbs light upon scanning exposure to generate an active seed such as an active radical, thereby causing and promoting polymerization reaction of the polymerizable compound, and an exposed region is cured to form an image.

In such a scanning exposable photopolymerizable composition, a variety of photoinitiation systems having excellent photosensitivity are disclosed (for example, see Bruce M. Monroe, et al., *Chemical Revue*, Vol. 93 (1993), pp. 435-448, and R. S. Davidson, *Journal of Photochemistry and Biology, A: Chemistry*, Vol. 73 (1993), pp. 81-96). In the case where the photoinitiation system described in these documents is applied to the conventional CTP system using, as an exposure light source, a visible light source having a long wavelength such as Ar laser (488 nm) and FD-YAG laser (532 nm), in the present circumstances, a sufficient sensitivity is not obtained due to the matter that an output of the light source is not sufficiently high or other reasons. Therefore, initiation systems of high sensitivity that are adaptive to exposure at a higher speed are desired.

On the other hand, in recent years, for example, semiconductor lasers using an InGaN based material and capable of continuously causing oscillation in a region of from 350 nm to 450 nm are in the stage of practical use. Such a scanning exposure system using short wavelength light sources has such an advantage that an economical system can be constituted while keeping a sufficient output since the semiconductor laser can be produced at low costs from the structural standpoint. Further, the system can use photosensitive materials having photosensitivity in short wavelength regions and capable of working under a lighter safe light compared with existent systems of using FD-YAG or Ar laser. However, no photoinitiation systems having sufficient sensitivity against the scanning exposure in the short wavelength region of from 350 nm to 450 nm have not yet been known at present.

In view of the above, while the present applicants proposed a photosensitive composition containing highly sensitive sensitizing dyes in the short wavelength region (refer to JP-A-2000-258910), further improvement for the sensitivity of the photoinitiation system containing such sensitizing dyes has been demanded.

Further, for example, as described in J. P. Faussier, *Photoinitiated Polymerization-Theory and Applications: Rapra Review*, Vol. 9, Report, Rapra Technology (1998) and M. Tsunooka et al., *Prog. Polym. Sci.*, 21, 1 (1996), it is an eagerly desired technique in the imaging field to obtain a photoinitiation system of high sensitivity. A photoinitiation system composed of a sensitizing dye and an initiator compound can generate an acid and a base in addition to the foregoing active radical by choosing the initiator compound and can be utilized in, for example, image forming such as photo shaping, holography, and color hard copying and in the field of manufacture of electronic materials such as photoresists and applied to photocurable resin materials such as inks, paints, and adhesives. In these industrial fields, in order to cause decomposition of an initiator compound with good efficiency, it is desired to find out sensitizing dyes having excellent light absorption and sensitizing ability.

SUMMARY OF THE INVENTION

Taking into consideration the foregoing problems, an object of the invention is to provide a photosensitive composition useful as a photosensitive layer of a lithographic printing plate precursor for scanning exposure adaptive to the CTP system having excellent workability and economy and using a novel photoinitiation system having a high sensitivity against an oscillation wavelength of a cheap short wave semiconductor laser and a high sensitivity against a wide wavelength of from 350 nm to 450 nm. Also, a secondary object of the invention is to provide a novel dye compound capable of being used in a photosensitive composition having a high sensitivity against an oscillation wavelength of the foregoing short wave semiconductor laser.

For the sake of achieving the foregoing objects, the present inventors made extensive and intensive investigations. As a result, it has been found that a novel photoinitiation system comprising a sensitizing dye having a specific structure and an initiator compound gives high photosensitivity and especially has a high sensitivity in a region of from around 350 nm to 450 nm, leading to accomplishment of the invention.

Specifically, the photosensitive composition of the invention is characterized by containing (A) a sensitizing dye represented by the following formula (1), (B) an initiator compound capable of generating a radical, an acid, or a base, and (C) a compound whose physical or chemical characteristic irreversibly changes by at least one kind of a radical, an acid, and a base.

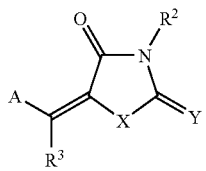
(1)

In the foregoing formula (1), A represents an optionally substituted aromatic ring or heterocyclic ring; X represents an oxygen atom, a sulfur atom, or —N($R^1$)—; Y represents an oxygen atom or —N($R^1$)—; $R^1$, $R^2$, and $R^3$ each independently represents a hydrogen atom or a monovalent non-metallic atomic group; and A and $R^1$, $R^2$ or $R^3$ can be bonded to each other to form an aliphatic or aromatic ring.

Also, in the foregoing photosensitive composition, in the combination of (A) a sensitizing dye represented by the formula (1) and (B) an initiator compound capable of generating a radical, an acid, or a base, both of which constitute a high-sensitivity photoinitiation system, an iminooxazolidinone derivative compound represented by the following formula (2) according to a second embodiment of the present invention is enumerated as a preferred embodiment of the sensitizing dye (A) represented by the formula (1), and this compound is a novel compound.

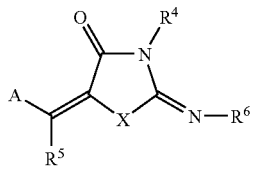
(2)

In the foregoing formula (2), A represents an optionally substituted aromatic ring or heterocyclic ring; X represents an oxygen atom, a sulfur atom, or —N(R )—; Y represents an oxygen atom or —N($R^1$)—; $R^1$, $R^4$, $R^5$, and $R^6$ each independently represents a hydrogen atom or a monovalent non-metallic atomic group; and A and $R^1$, $R^4$, $R^5$ or $R^6$ can be bonded to each other to form an aliphatic or aromatic ring.

Incidentally, the initiator compound as referred to in the invention means a compound that when given energy, generates a radical, an acid, or a base, each of which is an initiation seed for initiating and promoting polymerization (crosslinking) reaction of a coexistent addition polymerizable compound.

The photosensitive composition according to a third embodiment of the invention contains (A-1) a sensitizing dye represented by the following formula (3), (B-1) a titanocene compound, and (C-1) an addition polymerizable compound capable of being reacted by at least one of radical, acid and base;

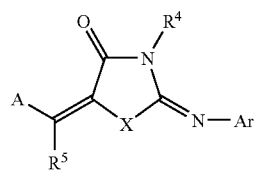
(3)

wherein A represents an optionally substituted aromatic ring or heterocyclic ring; X represents an oxygen atom, a sulfur atom, or —N($R^1$)—; $R^1$, $R^4$ and $R^5$ each independently represents a hydrogen atom or a monovalent non-metallic atomic group; and A and $R^1$, $R^4$ and $R^5$ can be bonded to each other to form an aliphatic or aromatic ring, providing that substituent(s) having the total for Hamet's value(s) of more than 0 is present on the Ar skeleton.

The action mechanism of the invention is not always clear. The sensitizing dye represented by the foregoing formula (1) has a high sensitivity against a wavelength of from 350 nm to 450 nm; it becomes in the electron excited state with a high sensitivity against irradiation (exposure) of an oscillation wavelength of a cheap short wave semiconductor laser; and electron transfer, energy transfer, heat generation, or the like according to the electron excited state caused by the light absorption acts to the coexistent initiator compound, thereby chemically changing the initiator compound to generate a radical, an acid, or a base. Further, at least one kind of the thus generated radical, acid or base causes irreversible changes such as color development, color decolorization, and polymerization in a compound whose physical or chemical characteristic irreversibly changes by at least one kind of a radical, an acid, and a base. Of such compounds, an ethylenically unsaturated bond-containing addition polymerizable compound is preferable. By using this ethylenically unsaturated bond-containing addition polymerizable compound, curing reaction starts and proceeds, whereby an exposed region is cured. For this, use of the photosensitive composition of the invention gives rise to advantages such that it has a sufficient sensitivity against scanning exposure by a short wave semiconductor laser and that since it does not have a maximum absorption in an ultraviolet region, it is excellent in stability under a white lamp and can be handled under a light fluorescent lamp or the like. Accordingly, it is considered that a lithographic printing plate precursor made of this photosensitive composition using a photosensitive layer containing such an addition polymerizable compound can be recorded at high sensitivity, is excellent in safe light stability, is retarded with respect to the generation of undesirable stains in a non-image area, and has excellent printing performance.

Figure 1:
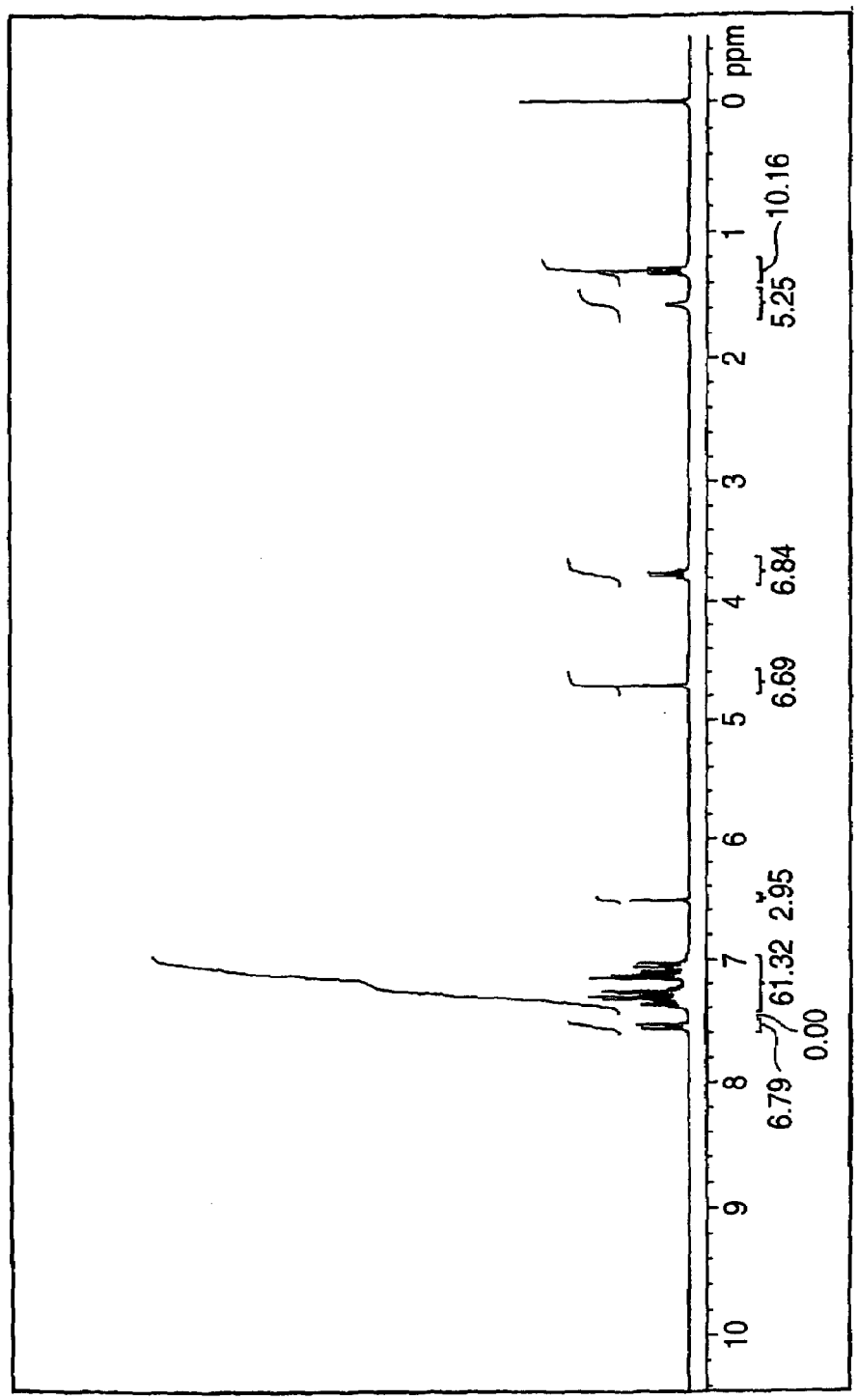
[FIG. 1]
An $^1$H-NMR chart of Illustrative Compound D3 that is a sensitizing dye having an iminooxazolidinone structure represented by the formula (1) according to the invention.

An ¹H-NMR chart of Illustrative Compound D31 that is a sensitizing dye having an iminooxazolidinone structure represented by the formula (1) according to the invention.

DETAILED DESCRIPTION OF THE INVENTION

The invention will be described below in detail.

The photosensitive composition of the invention contains (A) a sensitizing dye represented by the following formula (1), (B) an initiator compound capable of generating a radical, an acid, or a base, and (C) a compound whose physical or chemical characteristic irreversibly changes by at least one kind of a radical, an acid, and a base. A photoinitiation system of this photosensitive composition is constituted of (A) a sensitizing dye represented by the formula (1) and (B) an initiator compound capable of generating a radical, an acid, or a base. In this system, the initiator compound chemically changes due to an action such as electron transfer, energy transfer, and heat generation due to the electron excited state caused by the light absorption of the sensitizing dye (A) represented by the formula (1), thereby generating a radical, an acid, or a base.

First of all, this photoinitiation system will be described below.

One of characteristic features of the iminooxazolinedinone derivative sensitizing dye (A) having a specific structure resides in that it has especially excellent absorption characteristic in a region of from 350 nm to 450 nm. Further, the specific iminooxazolinedinone derivative (A) causes decomposition of the initiator compound (B) with good efficiency and exhibits very high photosensitivity. In general, with respect to the sensitization mechanism of the photoinitiation system comprising the sensitizing dye and the initiator compound, there are known routes such as (a) reductive decomposition of the initiator compound based on electron transfer reaction from the electron excited state of the sensitizing dye to the initiator compound, (b) oxidative decomposition of the initiator compound based on electron transfer from the initiator compound to the electron excited state of the sensitizing dye, and (c) decomposition of the initiator compound from the electron excited state based on energy transfer from the electron excited state of the sensitizing dye to the initiator compound. It has been noted that the sensitizing dye of the invention causes any of these types of sensitization reaction with excellent efficiency.

The present inventors have found that in order to obtain high sensitivity, it is very important to have a partial structure represented by the formula (1). However, its action mechanism is not always clear. The sensitizing dye of the invention exhibits a high-intensity emission (fluorescence and/or phosphorescence) spectrum. From this fact, it is considered as one possibility that since the sensitizing dye of the invention having the foregoing partial structure is relatively long in the life of the excited state, it efficiently acts to the reaction with the initiator compound. As other possibilities, it may be considered that the partial structure represented by the formula (1) contributes to making the initial stage of sensitization reaction (such as electron transfer) efficient and to making the subsequent reactions until decomposition of the initiator compound efficient.

(A) Sensitizing Dye:

The sensitizing dye that is used in the invention is represented by the following formula (1).

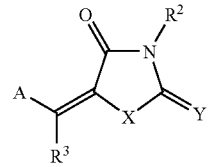

(1)

In the foregoing formula (1), A represents an optionally substituted aromatic ring or heterocyclic ring; X represents an oxygen atom, a sulfur atom, or —N($R^1$)—; Y represents an oxygen atom or —N($R^1$)—; $R^1$, $R^2$, and $R^3$ each independently represents a hydrogen atom or a monovalent non-metallic atomic group; and A and $R^1$, $R^2$ or $R^3$ can be bonded to each other to form an aliphatic or aromatic ring.

Here, when $R^1$, $R^2$, or $R^3$ represents a monovalent non-metallic atomic group, it preferably represents a substituted or unsubstituted alkyl group or aryl group.

Next, preferred examples of $R^1$, $R^2$, and $R^3$ will be specifically described below. Preferred examples of the alkyl group include linear, branched or cyclic alkyl groups having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Of these, linear alkyl groups having from 1 to 12 carbon atoms, branched alkyl groups having from 3 to 12 carbon atoms, and cyclic alkyl groups having from 5 to 10 carbon atoms are preferable.

As the substituent of the substituted alkyl group, monovalent non-metallic atomic groups other than hydrogen are used. Preferred examples thereof include a halogen atom (for example, —F, —Br, —Cl, and —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acyloxy group, an acylthio group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO₃H) and a conjugated base group thereof (hereinafter referred to as "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO₃H₂) and a conjuagated base group thereof (hereinafter referred to as "phosphonato group"), a dialkylphosphono group (—PO₃(alkyl)₂), a diarylphosphono group (—PO₃(aryl)₂), an alkylarylphosphono group (—PO₃(alkyl)(aryl)), a monoalkylphosphono group (—PO₃H—(alkyl)) and a conjugated base group thereof (hereinafter referred to as "alkylphosphonato group"), a monoarylphosphono group (—PO₃H(aryl)) and a conjugated base group thereof (hereinafter referred to as "arylphosphonato group"), a phosphonoxy group (—OPO₃H₂) and a conjugated base group thereof (hereinafter referred to as "phosphonatoxy group"), a dialkylphosphonoxy group (—OPO₃(alkyl)₂), a diarylphosphonoxy group (—OPO₃(aryl)₂), an alkylarylphosphonoxy group (—OPO₃(alkyl)(aryl)), a monoalkylphosphonoxy group (—OPO₃H(alkyl)) and a conjugated base group thereof (hereinafter referred to as "alkylphosphonatoxy group"), a monoarylphosphonoxy group (—OPO₃H(aryl)) and a conjugated base group thereof (hereinafter referred to as "arylphosphonatoxy group"), a cyano group, a nitro group, an aryl group, a heteroaryl group, an alkenyl group, an alkynyl group, and a silyl group.

As specific examples of the alkyl group in these substituents, the foregoing alkyl groups are enumerated, and these groups may further have a substituent.

Also, specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxylphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group, and a phosphonatophenyl group.

As the heteroaryl group, groups derived from monocyclic or polycyclic aromatic rings containing at least one of nitrogen, oxygen and sulfur atoms are used. Examples of the heteroaryl ring in the especially preferred heteroaryl group include thiophene, thianthrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indoyl, indazole, purine, quinolidine, isoquinoline, phthalazine, naphthyridine, quinazoline, cinnoline, pteridine, carbazole, carboline, phenanthrene, acridine, pyrimidine, phenanthroline, phthalazine, phenarsazine, phenoxazine, furazne, and phenoxazine. These rings may be further benzo-fused or may further have a substituent.

Also, examples of the alkenyl group include a vinyl group, a 1-propenyl group, a 1-butenyl group, a cinnamyl group, and a 2-chloro-1-ethenyl group. Examples of the alkynyl group include an ethynyl group, a 1-propynyl group, a 1-butynyl group, and a trimethylsilylethynyl group. Examples of $G^1$ in the acyl group ($G^1CO$—) include hydrogen and the foregoing alkyl groups and aryl groups. Of these substituents, a halogen atom (for example, —F, —Br, —Cl, and —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group, an alkenyl group, and an alkylidene group (for example, a methylene group) are more preferable.

On the other hand, as the alkylene group in the substituted alkyl group, divalent organic residues resulting from elimination of any one of hydrogen atoms on the foregoing alkyl group having from 1 to 20 carbon atoms can be enumerated. Of these, linear alkyl groups having from 1 to 12 carbon atoms, branched alkyl groups having from 3 to 12 carbon atoms, and cyclic alkyl groups having from 5 to 10 carbon atoms are preferable.

Specific examples of the substituted alkyl group preferred as $R^1$, $R^2$, or $R^3$ obtained by combining the foregoing substituent with the alkylene group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chloro-phenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatopropyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl) sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

Specific examples of the preferred aryl group as $R^1$, $R^2$, or $R^3$ include those in which from one to three benzene rings form a fused ring and those in which a benzene ring and a 5-membered unsaturated ring form a fused ring. Specific examples thereof include a phenyl group, a naphthyl group, an anthryl group, a phenanthryl group, an indenyl group, an acenaphthenyl group, and a fluorenyl group. Of these, a phenyl group and a naphthyl group are more preferable.

As specific examples of the preferred substituted aryl group as $R^1$, $R^2$, or $R^3$, those having a monovalent non-metallic atomic group (other than a hydrogen atom) as a substituent on the ring-forming carbon atom of the foregoing aryl group are used. As examples of the preferred substituent, the foregoing alkyl groups and substituted alkyl groups, and those enumerated as the substituent in the foregoing substituted alkyl group can be enumerated. Specific examples of such substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group, and a 3-butynylphenyl group.

Incidentally, more preferred examples of $R^2$ and $R^3$ include substituted or unsubstituted alkyl groups. Also, more preferred examples of $R^1$ include substituted or unsubstituted aryl groups. Though that reason is not always clear, it is assumed that when such a substituent is present, a mutual action between the electron excited state caused by light absorption and the initiator compound becomes especially large, whereby an efficiency of the initiator compound for generating a radical, an acid or a base is enhanced.

Next, A in the formula (1) will be described below. A represents an optionally substituted aromatic ring or heterocyclic ring. As specific examples of the optionally substituted aromatic ring or heterocyclic ring, those enumerated previously for $R^1$, $R^2$ or $R^3$ in the formula (1) are enumerated.

Above all, preferred examples of A include aryl groups containing an alkoxy group, a thioalkyl group, or an amino group. Of these, aryl groups containing an amino group are especially preferable as A.

Next, Y in the formula (1) will be described below. Y represents a non-metallic atomic group necessary for forming a heterocyclic ring together with the foregoing A and adjacent carbon atom. Examples of such a heterocyclic ring include 5-, 6- or 7-membered nitrogen-containing or sulfur-containing heterocyclic rings which may contain a fused ring, and preferably 5- or 6-membered heterocyclic rings.

As examples of the nitrogen-containing heterocyclic ring, all of those which are known to constitute a basic nucleus in merocyanine dyes describedin L. G. Brooker, et al., *J. Am. Chem. Soc.*, Vol. 73 (1951), pp. 5326-5358 and reference documents cited therein can be suitably used.

Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl) thiazole, and 4,5-di(2-furyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole, and 5-ethoxycarbonylbenzothiazole); naphthothiazoles (for example, naphtho[1,2]-thiazole, naphtho[2,1]thiazole, 5-methoxynaphtho[2,1]thiazole 5-ethoxynaphtho[2,1]thiazole, 8-methoxynaphtho[1,2]-thiazole, and 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole, and 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, and 6-hydroxybenzoxazole); naphthoxazoles (for example, naphth[1,2]oxazole and naphth[2,1]oxazole); selenazoles (for example, 4-methylselenazole and 4-phenylselenazole); benzoselenazoles (for example, benzoselenazole, 5-chlorobenzoselenazole, 5-methoxybenzoselenazole, 5-hydroxybenzoselenazole, and tetrahydrobenzoselenazole); naphthoselenazoles (for example, naphtho[1,2]selenazole and naphtho[2,1]selenazole); thiazolines (for example, thiazoline, 4-methylthiazoline, 4,5-dimethylthiazoline, 4-phenylthiazoline, 4,5-di-(2-furyl)thiazoline, 4,5-diphenylthiazoline, and 4,5-di-(p-methoxyphenyl) thiazoline); 2-quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, and 8-hydroxyquinoline); 4-quinolines (for example, quinoline, 6-methoxyquinoline, 7-methylquinoline, and 8-methylquinoline); 1-isoquinolines (for example, isoquinoline and 3,4-dihydroisoquinoline); 3-isoquinolines (for example, isoquinoline); benzimidazoles (for example, 1,3-dimethylbenzimidazole, 1,3-diethylbenzimidazole, and 1-ethyl-3-phenylbenzimidazole); 3,3-dialkylindolenines (for example, 3,3-dimethylindolenine, 3,3,5-trimethylindolenine, and 3,3,7-trimethylindolenine); 2-pyridines (for example, pyridine and 5-methylpyridine); and 4-pyridines (for example, pyridine). Also, in these rings, the substituents may be bonded to each other to form a ring.

Also, as examples of the sulfur-containing heterocyclic ring, dithiol partial structures in the dyes described in JP-A-3-296759 can be enumerated.

Specific examples thereof include benzodithiols (for example, benzodithiol, 5-t-butylbenzodithiol, and 5-methylbenzodithiol); naphthodithiols (for example, naphtho-[1,2] dithiol and naphtho[2,1]dithiol); and dithiols (for example, 4,5-dimethyldithiol, 4-phenyldithiol, 4-methoxycarbonyldithiol, 4,5-dimethoxycarbonyldithiol, 4,5-diethoxycarbonyldithiol, 4,5-ditrifluoromethyldithiol, 4,5-dicyanodithiol, 4-methoxycarbonylmethyldithiol, and 4-carboxymethyldithiol).

Of the dyes represented by the formula (1) wherein Y forms a nitrogen-containing or sulfur-containing heterocyclic ring together with the foregoing A and adjacent carbon atom, dyes having a structure represented by a partial structural formula of the following formula (2) are especially preferable because not only they have a high sensitization ability, but also they give a photosensitive composition having very excellent storage stability. Dyes having the structure represented by the formula (2) are a novel compound.

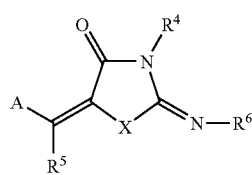

(2)

In the foregoing formula (2), A represents an optionally substituted aromatic ring or heterocyclic ring; X represents an oxygen atom, a sulfur atom, or —N(R$^1$)—; Y represents an oxygen atom or —N(R$^1$)—; R$^1$, R$^4$, R$^5$, and R$^6$ each independently represents a hydrogen atom or a monovalent non-metallic atomic group; and A and R$^1$, R$^4$, R$^5$ or R$^6$ can be bonded to each other to form an aliphatic or aromatic ring.

In the formula (2), A and R$^1$ are synonymous with A and R$^1$ in the formula (1); R$^4$ is synonymous with R$^2$ in the formula (1); R$^5$ is synonymous with R$^3$ in the formula (1); and R$^6$ is synonymous with R$^1$ in the formula (1), respectively.

Then, a compound represented by the formula (3) as a preferred embodiment of the compound represented by the formula (1) used in the invention is to be described.

In the foregoing formula (3), A represents an optionally substituted aromatic ring or heterocyclic ring; X represents an oxygen atom, a sulfur atom, or —N(R$^1$)—; R$^1$, R$^4$, and R$^5$ each independently represents a hydrogen atom or a monovalent non-metallic atomic group; and A and R$^1$, R$^4$and R$^5$ can be bonded to each other to form an aliphatic or aromatic ring. Ar represents an aromatic ring or heterocyclic ring having a substituent group. However, it is necessary that the substituent(s) on the Ar skeleton has the total for the Hamet's value(s) of more than 0. For the total of the Hamet's values being more than 0, the skeleton may have one substituent with the Hamet's value for the substituent being more than 0, or it has plural substituents with the total for the Hamet's values in the substituents thereof being more than 0.

In the formula (3), A and R$^1$ have identical meanings for those in the formula (1), R$^4$ has the same meanings as those for R$^2$ in the formula (1), and R$^5$ has the same meanings as those for R$^3$ in the formula (1). Further, Ar represents an aromatic ring or heterocyclic ring having substituent(s) and specific examples thereof can include those described previously in the explanation for A for the formula (1), concerning the aromatic ring or heterocyclic ring having the substituent (s). However, for the substituent that can be introduced to Ar in the formula (3) it is necessary that the total for the Hamet's values is 0 or more and examples of such substituent(s) can include, for example, trifluoromethyl group, carbonyl group, ester group, halogen atom, nitro group, cyano group, sulfoxide group, amide group, and carboxyl group. The Hamet's values for the substituent(s) are shown below. They include, for example, trifluoro methyl group (—CF$_3$, m: 0.43, p: 0.54), carbonyl group (for example, —COH, m: 0.36, p: 0.43), ester group (—COOCH$_3$, m: 0.37, p: 0.45), halogen atom (for example, Cl, m: 0.37, p: 0.23), cyano group (—CN, m: 0.56, p: 0.66), sulfoxide group (for example, —SOCH$_3$, m: 0.52, p: 0.45), amide group (for example, —NHCOCH$_3$, m: 0.21, p: 0.00), carboxyl group (—COOH, m: 0.37, p: 0.45). Descriptions in brackets represent the introduction position of the substituent on the aryl skeleton and the Hamet's value thereof. (m: 0.50) shows that the Hamet's value is 0.50 when the substituent is introduced to the meta-position. Among them, a preferred example for Ar can include a phenyl group having a substituent and a preferred substituent on the Ar skeleton can include ester group and cyano group. As the substitution position, it is particularly preferred that it situates at the ortho-position on the Ar skeleton.

Preferred specific examples (Illustrative Compounds D1 to illustrated compound D44) of the sensitizing dye represented by the formula (1) according to the invention will be given below, but it should not be construed that the invention is limited thereto. Incidentally, of these compounds, Illustrative Compounds D2, D6, D10, D18, D21, D28, D31, D33, D35, D38, D41, and D45 to D57 correspond to the novel compounds represented by the formula (2).

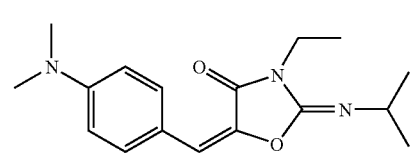

(D1)

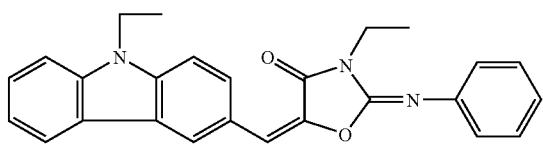

(D2)

-continued
(D3) 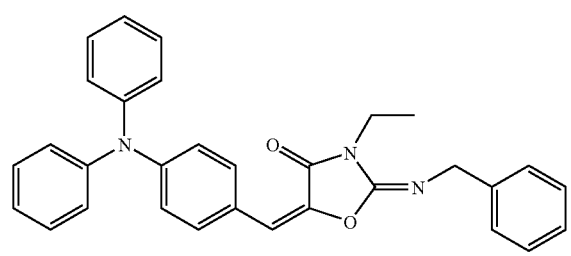
(D4) 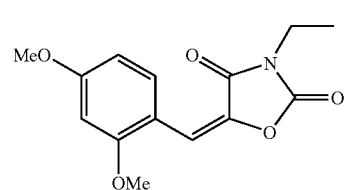
(D5) 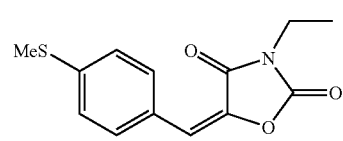
(D6) 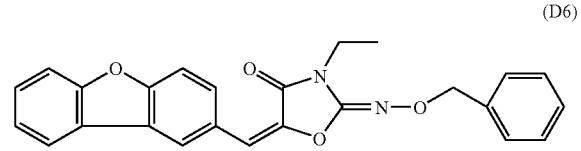
(D7) 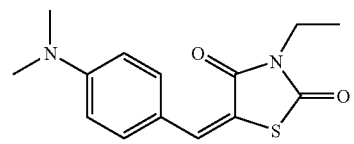
(D8) 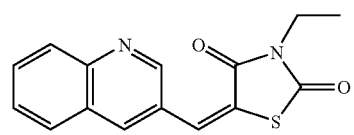
(D9) 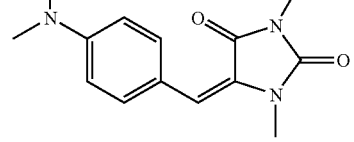
(D10) 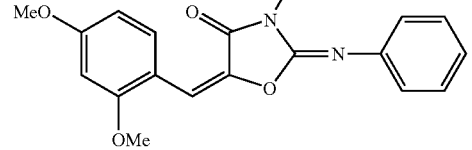
-continued
(D11) 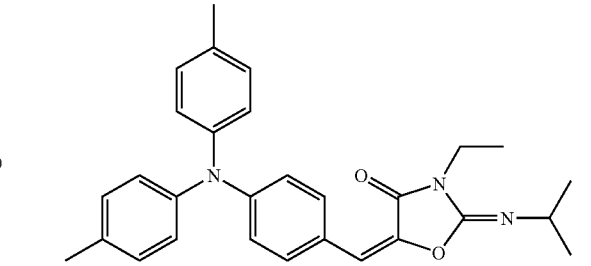
(D12) 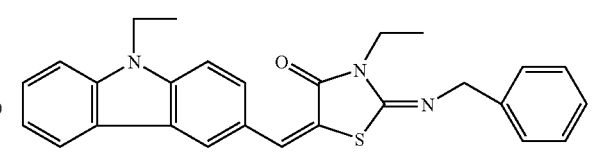
(D13) 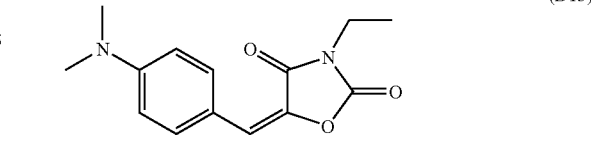
(D14) 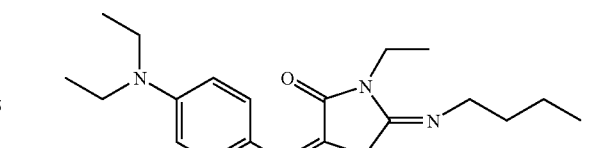
(D15) 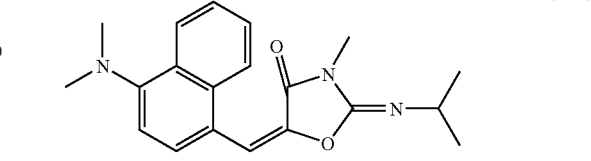
(D16) 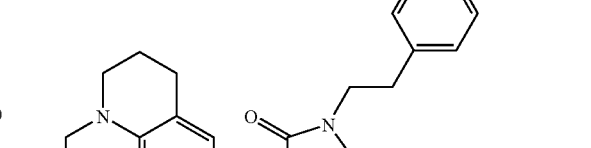
(D17) 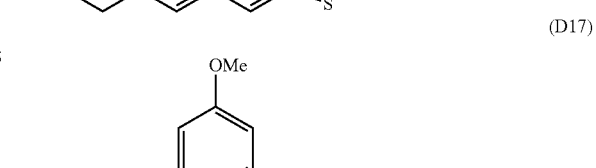

-continued
(D11)
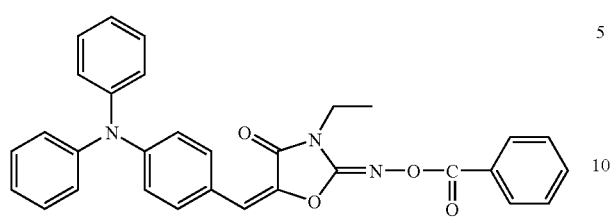
(D19)
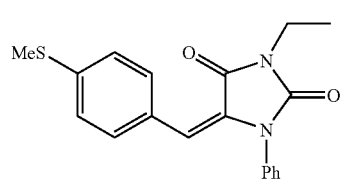
(D20)
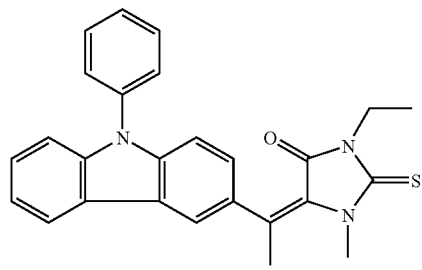
(D21)
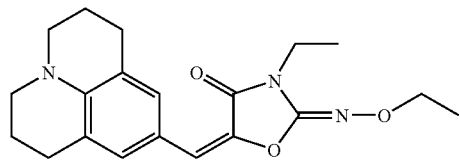
(D22)
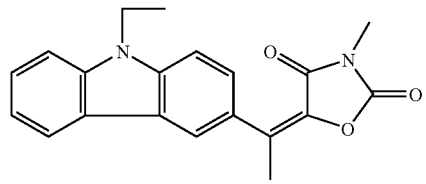
(D23)
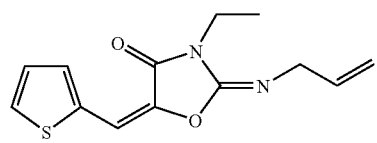
(D24)
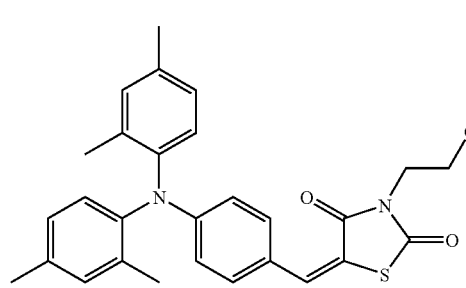
-continued
(D25)
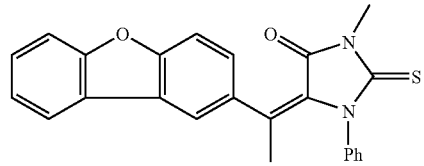
(D26)
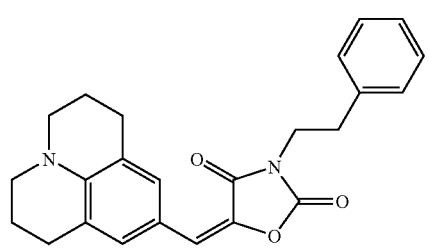
(D27)
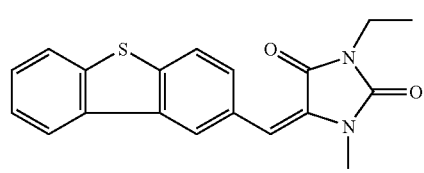
(D28)
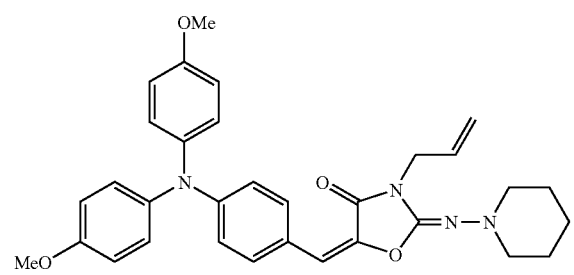
(D29)
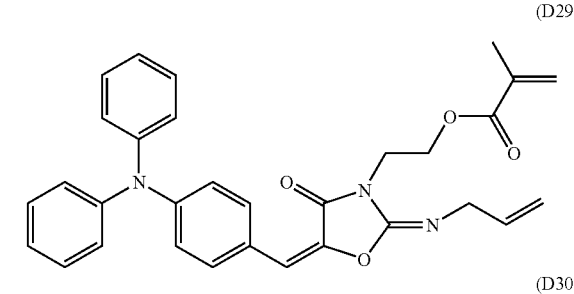
(D30)
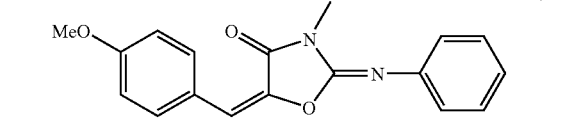
(D31)
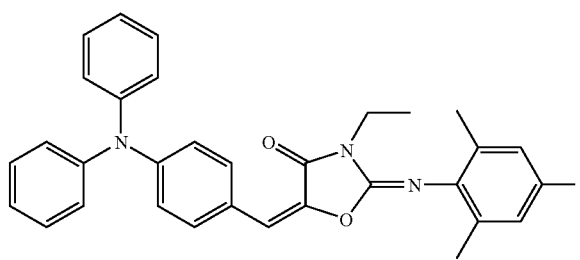

-continued
(D32)
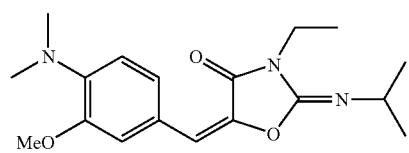
(D33)
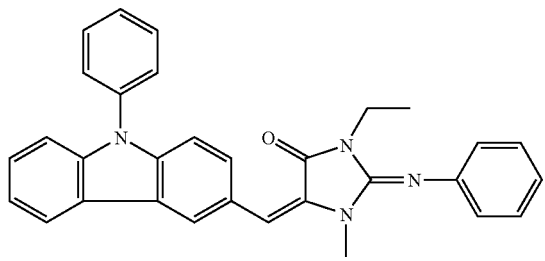
(D34)
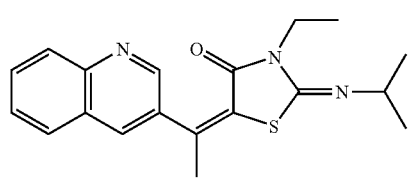
(D35)
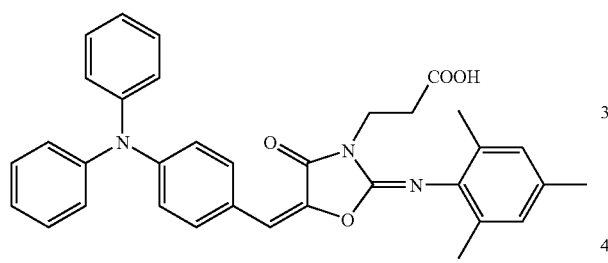
(D36)
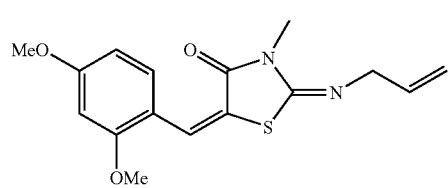
(D37)
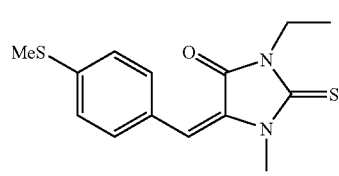
(D38)
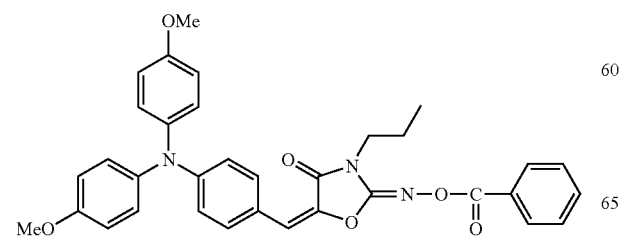
-continued
(D39)
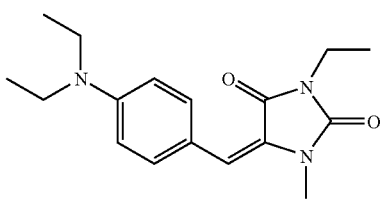
(D40)
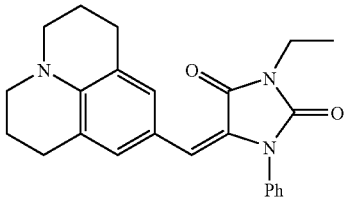
(D41)
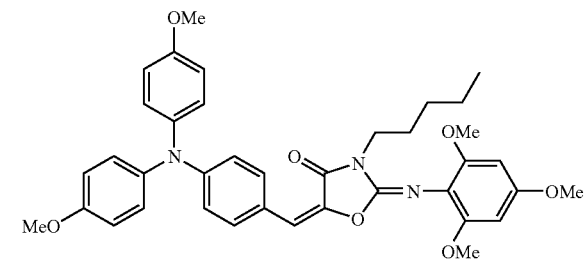
(D42)
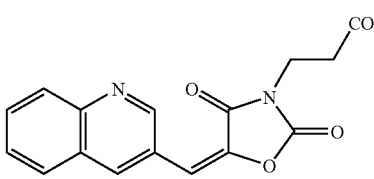
(D43)
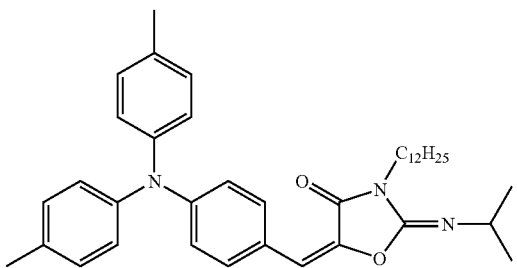
(D44)
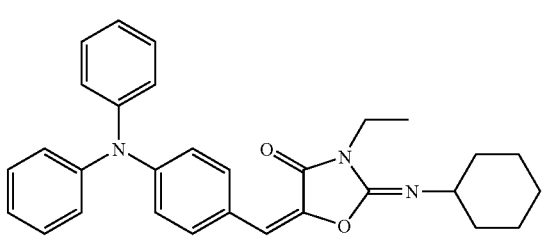

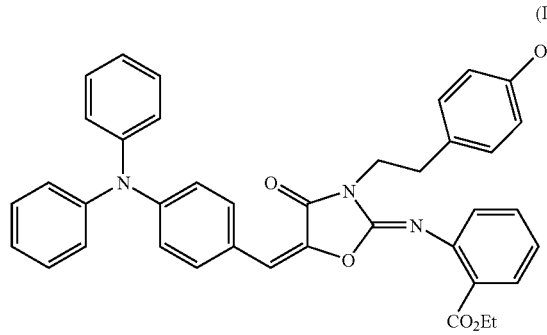
(D45)
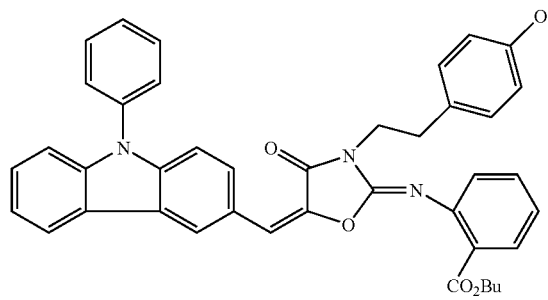
(D46)
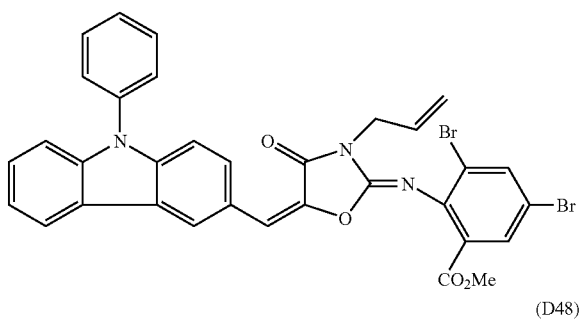
(D47)
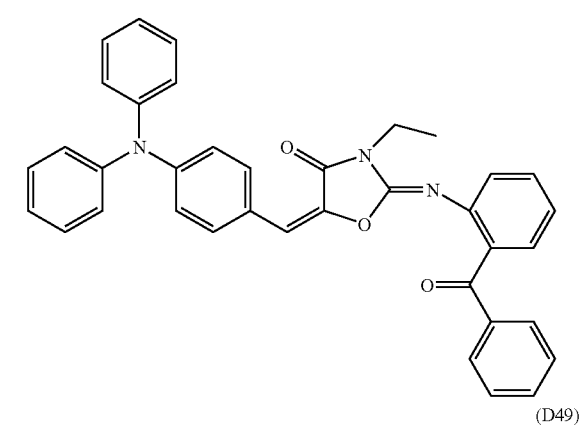
(D48)
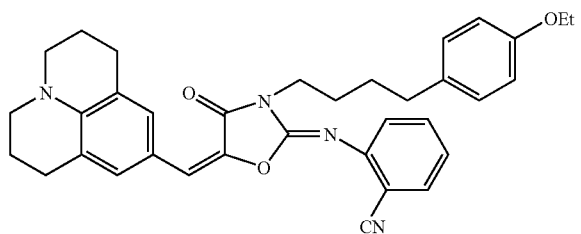
(D49)
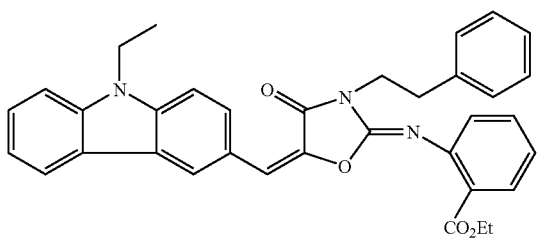
(D50)
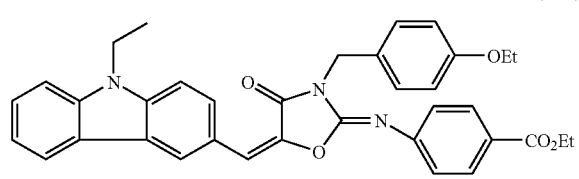
(D51)
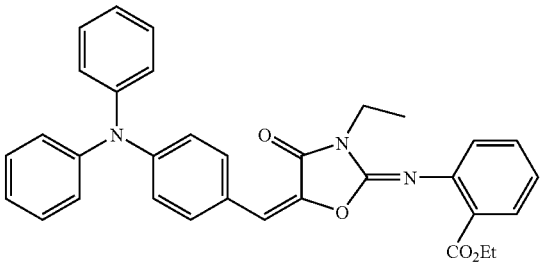
(D52)
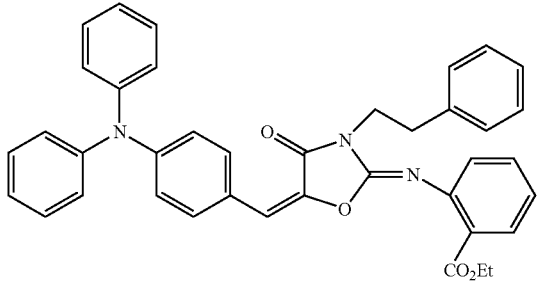
(D53)
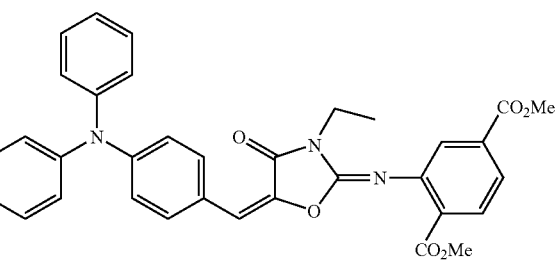
(D54)
(D55)

-continued (D56)

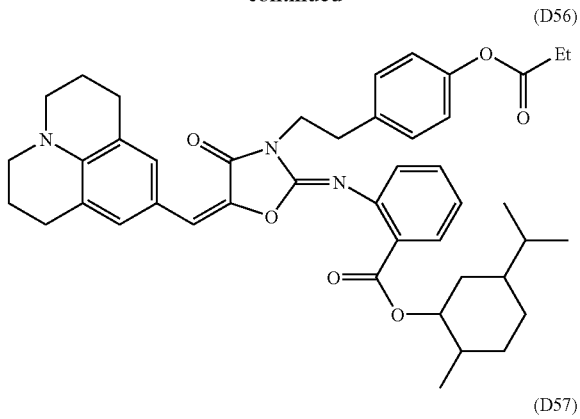

(D57)

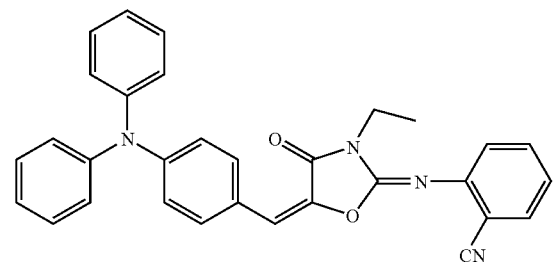

A synthesis method of the compound represented by the formula (1) will be described below.

The compound represented by the formula (1) is usually obtained by condensation reaction of an acid nucleus containing an active methylene group and a substituted or unsubstituted aromatic ring or heterocyclic ring and can be synthesized while referring to JP-B-59-28329. For example, a synthesis method utilizing condensation reaction of an acid nuclear compound and a basic nuclear raw material having an aldehyde group or carbonyl group on a heterocyclic ring thereof, as shown in the following reaction scheme (1) is enumerated. The condensation reaction is carried out in the presence of a base, as the need arises. As the base, generally employed bases such as amines and pyridines (for example, trialkylamines, dimethylaminopyridine, and diazabicycloundecene (DBU)), metal amides (for example, lithium diisopropylamide), metal alkoxides (for example, sodium methoxide and sodium t-butoxide), and metal hydrides (for example, sodium hydride and potassium hydride) can be used without limitations.

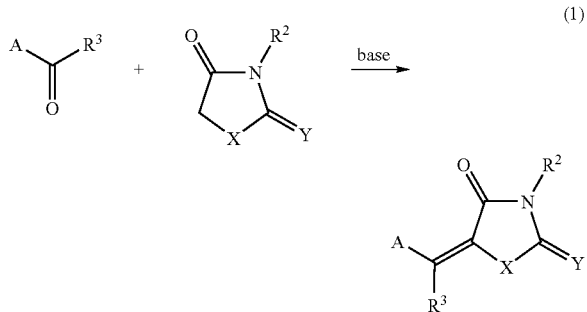

Also, as other desired synthesis method, a method according to the following reaction scheme (2) is enumerated. That is, this method is concerned with a reaction in which the same procedures as in the foregoing reaction scheme (1) are followed until a step of synthesizing a dye precursor by using, as the raw material, an acid nuclear compound in the reaction scheme (1) wherein Y represents a sulfur atom and subjecting it to condensation reaction with a basic nuclear raw material having an aldehyde group or carbonyl group on a heterocyclic ring thereof, and a metal salt capable of mutually chemically acting to the sulfur atom to form a metal sulfide and water or a primary amine compound (R—$NH_2$, wherein R represents a monovalent non-metallic atomic group) is further made to act to the dye precursor.

Of these, the reaction represented by the reaction scheme (2) is especially preferable from the standpoint of synthetic efficiency because the yield is high in each of the reactions. Especially, in the case of synthesizing a novel compound represented by the formula (2), the reaction shown in the reaction scheme (2) is useful.

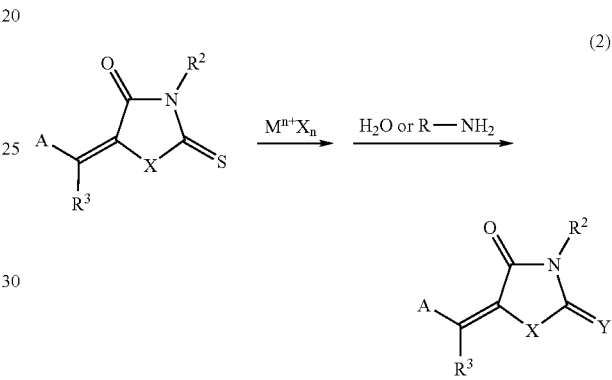

Incidentally, in the reaction scheme (2), $M^{n+}X_n$ represents a metal salt capable of mutually chemically acting to a sulfur atom of a thiocarbonyl group to form a metal sulfide. Specific examples of compounds include compounds wherein M represents Al, Au, Ag, Hg, Cu, Zn, Fe, Cd, Cr, Co, Ce, Bi, Mn, Mo, Ga, Ni, Pd, Pt, Ru, Rh, Sc, Sb, Sr, Mg, Ti, or the like; and X represents F, Cl, Br, I, $NO_3$, $SO_4$, $NO_2$, $PO_4$, $CH_3CO_2$, or the like, such as AgBr, AgI, AgF, AgO, AgCl, $Ag_2O$, $Ag(NO_3)$, $AgSO_4$, $AgNO_2$, $Ag_2CrO_4$, $Ag_3PO_4$, $Hg_2(NO_3)_2$, $HgBr_2$, $Hg_2Br_2$, HgO, $HgI_2$, $Hg(NO_3)_2$, $Hg(NO_2)_2$, $HgBr_2$, $HgSO_4$, $Hg_2I_2$, $Hg_2SO_4$, $Hg(CH_3CO_2)_2$, AuBr, $AuBr_3$, AuI, $AuI_3$, $AuF_3$, $Au_2O_3$, AuCl, $AuCl_3$, CuCl, CuI, $CuI_2$, $CuF_2$, CuO, $CuO_2$, $Cu(NO_3)_2$, $CuSO_4$, and $Cu_3(PO_4)_2$. Of these, silver salts can be used as the most preferred metal salt from the standpoint that they likely mutually act to the sulfur atom.

With respect to the sensitizing dye represented by the formula (1) to be used in the invention, a variety of chemical modifications can be further applied for the purpose of improving the characteristics of the photosensitive layer. For example, by binding the sensitizing dye with an addition polymerizable compound structure (for example, an acryloyl group and a methacryloyl group) by a method such as covalent binding, ionic binding, and hydrogen binding, it is possible enhance the strength of the exposed film and to suppress unnecessary deposition of the dye from the exposed film.

Also, by binding the sensitizing dye with a partial structure of the initiator compound having a radical generation ability as described later (for example, alkyl halides, oniums, peroxides, biimidazoles, reduction decomposable sites of oniums, bimidazoles, etc., and oxidation cleavable sites of borates, amines, trimethylsilylmethyl, carboxymethyl, carbonyl, imine, etc.), in particular, it is possible to remarkably enhance photosensitivity in the state where the concentration of the initiation system is low.

Further, in the case where the photosensitive composition of the invention is used as a photosensitive layer of a lithographic printing plate precursor as a preferred embodiment for use, for the purpose of enhancing adaptability to processing with an alkaline or aqueous developing solution, it is useful to introduce a hydrophilic site (for example, acid groups or polar groups such as a carboxyl group and an ester thereof, a sulfonic acid group and an ester thereof, and an ethylene oxide group). In particular, an ester type hydrophilic group has excellent affinity because it has a relatively hydrophobic structure in the photosensitive layer and is characterized in that it generates an acid group upon hydrolysis in the developing solution, whereby hydrophilicity increases.

Besides, for example, a substituent can be properly introduced for the purposes of enhancing the affinity in the photosensitive layer and suppressing decomposition of a crystal. For example, in a certain photosensitive system, there may be the case where an aryl group or an unsaturated bon such as an allyl group is very effective for enhancing the affinity. Also, by introducing a steric hindrance between dye $\pi$-planes by introduction of a branched alkyl structure or other methods, it is possible to remarkably suppress decomposition of a crystal. Also, it is possibility to enhance adhesion to an inorganic material such as metlas and metal oxides by introduction of a phosphonic acid group, an epoxy group, a trialkoxysilyl group, or the like. Besides, a method of polymerizing the sensitizing dye can be utilized depending upon the object.

As the sensitizing dye to be used in the invention, at least one kind of a sensitizing dye represented by the foregoing formula (1) may be used. So far as the sensitizing dye to be used is limited to one represented by the formula (1), details of the use method, for example, what kind of structure of a dye should be used, including modified dyes, whether the dye should be used singly or in admixture of two or more thereof, and what addition amount of a dye be employed, can be properly set up so as to coincide with the design of the final performance of photosensitive material. For example, by using two or more kinds of sensitizing dyes jointly, it is possible to enhance affinity with the photosensitive layer.

In selecting the sensitizing dye, in addition to the photosensitivity, a molar absorption coefficient at an emission wavelength of a light source to be used is an important factor. Use of a dye having a large molar absorption coefficient is economical and advantageous from the standpoint of film physical properties of the photosensitive layer because the addition amount of the dye can be made relatively small.

Incidentally, in the invention, so far as the effects of the invention are not hindered, other generally used sensitizing dyes can be used jointly in addition to the foregoing specific sensitizing dye (A).

Since the photosensitivity and resolution of the photosensitive layer and the physical properties of the exposed film are largely influenced by an absorbance at the light source wavelength, the addition amount of the sensitizing dye is properly selected while taking into consideration these matters. For example, the sensitivity lowers in a region where the absorbance is low as not more than 0.1. Also, the resolution becomes low due to influence of halation. However, for the purpose of curing a thick film of, for example, 5 µm or more, there may be the case where the degree of curing is rather increased at a low absorbance. Also, in a high region where the absorbance is 3 or more, the major part of light is absorbed on the surface of the photosensitive layer, whereby curing is retarded in the inside thereof. For example, when applied to a printing plate, the film strength or adhesion to a substrate becomes insufficient.

For example, in the case where the photosensitive composition of the invention is applied to a photosensitive layer of a lithographic printing plate precursor to be used at a relatively thin film thickness, it is preferable to set up the addition amount of the sensitizing dye such that the absorbance of the photosensitive layer is in the range of from 0.1 to 1.5, and preferably from 0.25 to 1. Since the absorbance is determined by the addition amount of the sensitizing dye and the thickness of the photosensitive layer, a prescribed absorbance is obtained by controlling the conditions of the both. Examples of the measurement method include a method in which a photosensitive layer having a thickness properly determined within the range of the addition amount after drying necessary as a lithographic printing plate is formed on a transparent or white support, and the optical density is then measured by a transmission type optical densitometer; and a method in which a recording layer is formed on a reflective support such as aluminum, and the reflection density is then measured.

In a case of utilizing the photosensitive composition of the invention as a photosensitive layer in a lithographic printing plate precursor, the addition amount of the sensitizing dye represented by the formula (1) or the formula (3) as the ingredient (A) or the ingredient (A-1) is usually within a range from 0.05 to 30 parts by weight, preferably, from 0.1 to 20 parts by weight and, more preferably, from 0.2 to 10 parts by weight based on 100 parts by weight of the entire solid ingredients constituting the photosensitive layer.

Next, the initiator compound (A) that is a second essential component of the photoinitiation system in the photosensitive composition of the invention will be described below.

(B) Initiator Compound:

In the invention, the initiator compound is a compound that chemically changes due to an action such as electron transfer, energy transfer, and heat generation due to the electron excited state of the sensitizing dye, thereby generating at least one kind selected from a radical, an acid, and a base.

The thus generated radical, acid or base will be hereinafter simply referred to as "active seed". In the case where such a compound is not present, or in the case where only the initiator compound is used singly, a practically useful, sufficient sensitivity is not obtained. However, as one embodiment of using the foregoing sensitizing dye and active compound jointly, it is possible to utilize them as a single compound through a proper chemical method (for example, connection of the sensitizing dye to the initiator compound by chemical binding).

In general, it is thought that most of initiator compounds generate an active seed through an initial chemical process represented by the following (1) to (3), that is, (1) reductive decomposition of an initiator compound based on electron transfer reaction from the electron excited state of the sensitizing dye to the initiator compound, (2) oxidative decomposition of the initiator compound based on electron transfer from the initiator compound to the electron excited state of the sensitizing dye, and (3) decomposition of the initiator compound from the electron excited state based on energy transfer from the electron excited state of the sensitizing dye to the initiator compound. What the individual initiator compound belongs to in the types (1) to (3) is obscure, but in the invention, an important characteristic feature of the sensitizing dye resides in the matter that the sensitizing dye exhibits a very high sensitization effect even by a combination with any type of the initiator compound.

In the invention, as the initiator compound, those known in the art can be used without limitations. Specific examples thereof include many compounds described in Bruce M. Monore, et al., *Chemical Revue*, Vol. 93, 435 (1993); R. S. Davidson, *Journal of Photochemistry and Biology, A: Chemistry*, Vol. 73, 81 (1993); J. P. Faussier, *Photoinitiated Polymerization-Theory and Applications: Rapra Review*, Vol. 9, Report, Rapra Technology (1998); and M. Tsunooka et al., *Prog. Polym. Sci.*, 21, 1 (1996). Also, as other group of compounds having the foregoing function (1) or (2), a group of compounds capable of generating oxidative or reductive bond cleavage as described in F. D. Saeva, *Topics in Current Chemistry*, 156, 59 (1990); G. C. Maslak, *Topics in Current Chemistry*, 168, 1 (1993); H. B. Shuster, et al., *JACS*, 112, 6329 (1990); and I. D. F. Eaton, et al., *JACS*, 102, 3298 (1980) can be further used as the initiator compound.

Specific examples of preferred initiator compounds will be described below while classifying into (a) ones capable of causing bond cleavage upon reduction to generate an active seed, (b) ones capable of causing bond cleavage upon oxidation to generate an active seed, and (c) others. However, in many cases, there is no commonly accepted theory on what the individual initiator compound belongs to, and therefore, it should not be construed that the invention is limited to these descriptions regarding the reaction mechanism.

(a) Initiator Compound Capable of Causing Bond Cleavage Upon Reduction to Generate an Active Seed:

Compound Containing a Carbon-halogen Bond:

It is considered that a carbon-halogen bond is reductively cleaved to generate an active seed (for example, described in *Polymer Preprints, Jpn.*, 41 (3), 542 (1992)). This compound can generate a radical or an acid as the active seed. Specifically, halomethyl-s-triazines; halomethyl oxazoles that can be easily synthesized by those skilled in the art by the synthesis method described in M. P. Hutt, E. F. Elslager and L. M. Merbel, *Journal of Heterocyclic Chemistry*, 7, 511 (1970); and compounds described in German Patent Nos. 2,641,100, 3,333,450, 3,021,590 and 3,021,599 can be suitably used.

Compound Containing a Nitrogen-nitrogen Bond or a Nitrogen-containing Heterocyclic Ring-nitrogen-containing Heterocyclic Bond:

The compound causes reductively bond cleavage (for example, described in *J. Pys. Chem.*, 96, 207 (1992)). Specifically, hexaaryl biimidazoles are suitably used. The generated active seed is a lophine radical. It is known that not only this radical starts a radical chain reaction through joint use of a hydrogen providing compound, if desired, but also the lophine radical undergoes image formation through oxidation reaction (for example, described in *J. Imaging Sci.*, 30, 215 (1986)).

Compound Containing an Oygen-oxygen Bond:

It is considered that an oxygen-oxygen bond is reductively cleaved to generate an active radical (for example, described in *Polym. Adv. Technol.*, 1, 287 (1990)). Specifically, for example, organic peroxides are suitably used. A radical can be generated as the active seed.

Onium Compound:

It is considered that a carbon-hetero bond or an oxygen-nitrogen bond is reductively cleaved to general an active seed (for example, described in *J. Photopolym. Sci. Technol.*, 3, 149 (1990)). Specifically, examples of compounds that are suitably used include iodonium salts described in European Patent No. 104,143, U.S. Pat. No. 4,837,124, JP-A-2-150848, and JP-A-2-96514; sulfonium salts described in European Patent Nos. 370,693, 233,567, 297,443, 297,442, 279,210 and 422,570 and U.S. Pat. Nos. 3,902,144, 4,933, 377, 4,760,013, 4,734,444 and 2,833,827; diazonium salts (for example, optionally substituted benzenediazoniums); diazonium salt resins (for example, formaldehyde resins of diazodiphenylamine); N-alkoxypyridinium salts (for example, those described in U.S. Pat. No. 4,743,528, JP-A-63-138345, JP-A-63-142345, JP-A-63-142346, and JP-B-46-42363, specifically 1-methoxy-4-phenylpyridinium tetrafluoro-borate); and compounds described in JP-B-52-147277, JP-B-52-14278, and JP-B-52-14279. A radical or an acid is generated as the active seed.

Active Ester:

Nitrobenzyl esters of a sulfonic acid or a carboxylic acid, esters of a sulfonic acid or a carboxylic acid and an N-hydroxy compound (for example, N-hydroxyphthalimide or oxime), sulfonic acid esters of pyrogallol, and naphthoquinonediazide-4-sulfonic acid esters can be reductively decomposed. A radical or an acid can be generated as the active seed. Specific examples of sulfonic acid esters include nitrobenzyl ester compounds described in European Patent Nos. 290,750, 46,083, 156,153, 271,851 and 388,343, U.S. Pat. Nos. 3,901,710 and 4,181,531, JP-A-60-198538, and JP-A-53-133022; iminosulfonated compounds described in European Patent Nos. 199,672, 84,515, 199,672, 44,115 and 101,122, U.S. Pat. Nos. 4,618,564, 4,371,605 and 4,431, 774, JP-A-64-18143, JP-A-2-245756, and JP-A-4-365048; and compounds described in JP-B-62-6223, JP-B-63-14340, and JP-A-59-174831. Further, the following compounds are enumerated.

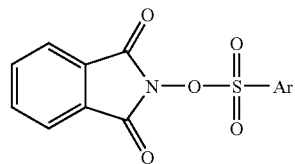

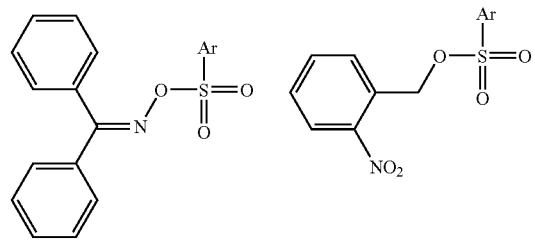

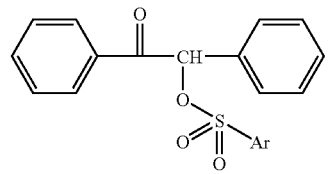

-continued

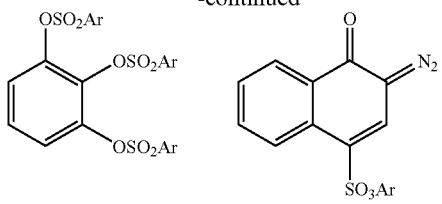

In the formulae, Ar represents an optionally substituted aromatic group or aliphatic group.

Also, it is possible to generate a base as the active seed, and the following group of compounds is known.

Ferrocene or iron arene complex:

This compound can reductively generate an active radical. Specific examples thereof are disclosed in JP-A-1-304453 and JP-A-1-152109.

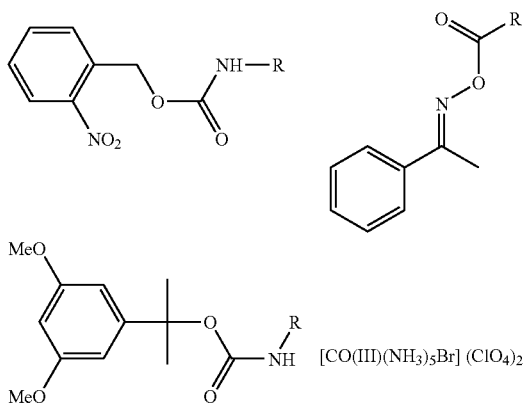

In the formulae, R represents an optionally substituted aliphatic group or aromatic group.

Disulfone:

This compound can reductively cause S—S bond cleavage to generate an acid. For example, diphenyldisulfones described in JP-A-61-166544 are known.

(b) Initiator Compound Capable of Causing Bond Cleavage Upon Oxidation to Generate an Active Seed:

Alkylate Complex:

It is considered that a carbon-hetero bond is oxidatively cleaved to generate an active radical (for example, described in *J. Am. Chem. Soc.*, 112, 6329 (1990)). Specifically, for example, triarylalkylborates are suitably used.

Alkylamine Compound:

It is considered that a C—X bond on carbon adjacent to nitrogen is oxidatively cleaved to generate an active radical (for example, described in *J. Am. Chem. Soc.*, 116, 4211 (1994)) Suitable examples of X include a hydrogen atom, a carboxyl group, a trimethylsilyl group, and a benzyl group. Specific examples of the compound include ethanolamines, N-phenylglycines, and N-trimethylsilylmethylanilines.

Sulfur-containing or Tin-containing Compound:

The foregoing amines in which, however, the nitrogen atom is substituted with a sulfur atom or a tin atom can generate an active radical upon the same action. Also, it is known that compounds containing an S—S bond cause sensitization upon S—S cleavage.

α-Substituted Methylcarbonyl Compound:

This compound causes bond cleavage between carbonyl and α-carbon upon oxidation, thereby generating an active radical. Also, compounds in which the carbonyl is substituted with an oxime ether exhibit the same action. Specific examples of the compound include 2-alkyl-1-[4-(alkylthio)phenyl]-2-morpholinopronone-1 compounds and oxime ethers obtained by reacting such a compound with a hydroxylamine and then etherifying N—OH.

Sulfinic Acid Salt:

This compound can reductively generate an active radical. Specific examples thereof include sodium arylsulfinates.

(c) Compound Capable of Functioning as an Initiator Compound though its Sensitization Mechanism is not Always Clear:

There are a lot of other compounds capable of functioning as an initiator compound, whose sensitization mechanism is, however, not always clear, and these compounds can also be used as the initiator compound in the invention. Examples thereof include organometallic compounds such as ferrocenes, aromatic ketones, acyl phosphines, and bisacyl phosphines. A radical or an acid can be generated as the active seed.

Among the initiator compounds to be used in the invention, a group of compounds especially excellent in sensitivity or stability will be specifically enumerated below.

(1) Halomethyltriazine:

As halomethyltriazines, compounds represented by the following formula [II] are enumerated. These compounds are especially excellent in radical generation or acid generation ability.

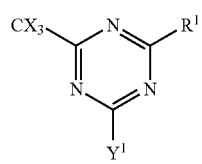

[II]

In the foregoing formula [II], X represents a halogen atom; $Y^1$ represents —$CX'_3$, —$NH_2$, —$NHR^{1'}$, —$NR^{1'}_2$, or —$OR^{1'}$, ; $R^{1'}$ represents an alkyl group, a substituted alkyl group, an aryl group, or a substituted aryl group; and $R^1$ represents —$CX_3$, an alkyl group, a substituted alkyl group, an aryl group, a substituted aryl group, or a substituted alkenyl group.

Specific examples of such compounds include compounds described in Wakabayashi, et al., *Bull. Chem. Soc. Japan*, 42, 2924 (1969), such as 2-phenyl-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichlorometh-yl)-s-triazine, 2-(2',4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine, and 2-(α,α,β-trichloroethyl)-4,6-bis(trichloromethyl)-s-triazine; compounds described in British Patent No. 1,388,492, such as 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine, and 2-(p-methoxystyryl)-4-amino-6-trichloromethyl-s-triazine; compounds described in JP-A-53-133428, such as 2-(4-methoxy-naphtho-1-yl)-4,6-bis-trichloromethyl-s-triazine, 2-(4-ethoxy-naphtho-1-yl)-

4,6-bis-trichloromethyl-s-triazine, 2-[4-(2-ethoxyethyl)-naphtho-1-yl]-4,6-bis-trichloromethyl-s-triazine, 2-(4,7-dimethoxynaphto-1-yl)-4,6-bis-trichloromethyl-s-triazine, and 2-(acenaphto-5-yl)-4,6-bis-trichloromethyl-s-triazine; and compounds described in German Patent No. 3,337,024, such as the following compound

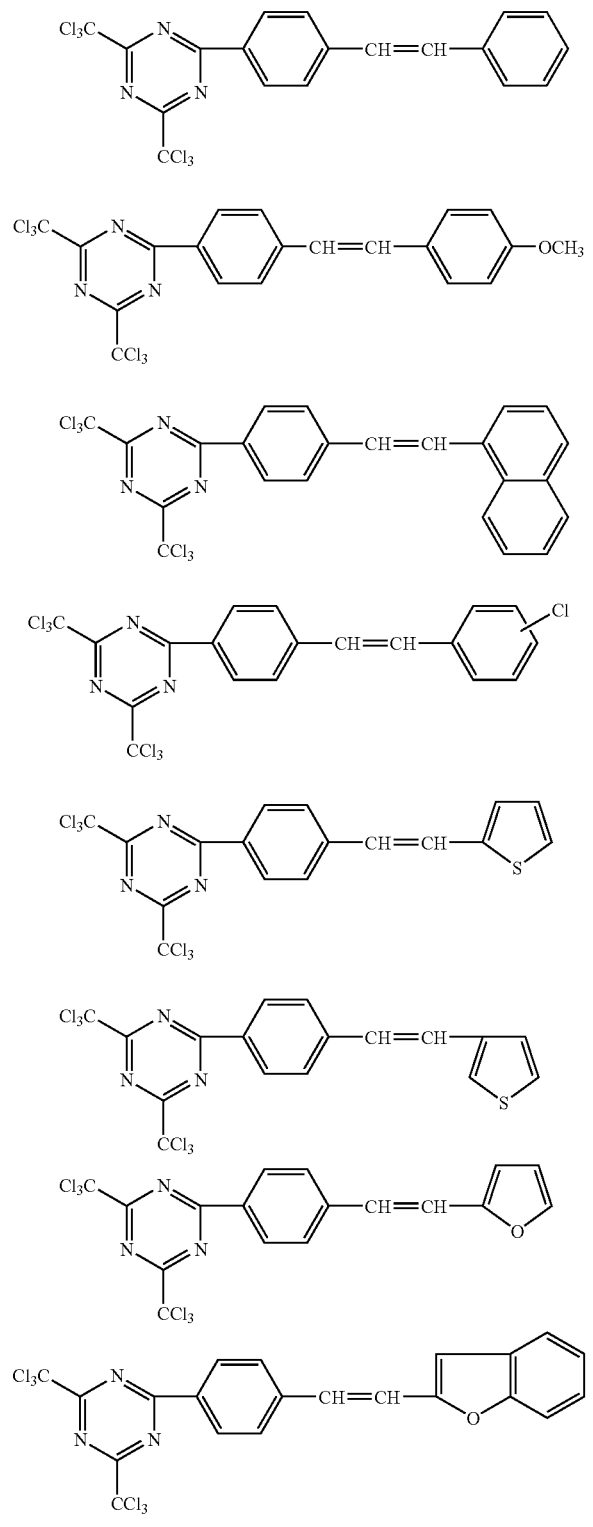

Also, compounds described in F. C. Schaefer, et al., *J. Org. Chem.*, 29, 1527 (1964), such as 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine, and 2-methoxy-4-methyl-6-trichloromethyl-s-triazine can be enumerated.

Further, compound described in JP-A-62-58241, such as the following compounds, can be enumerated.

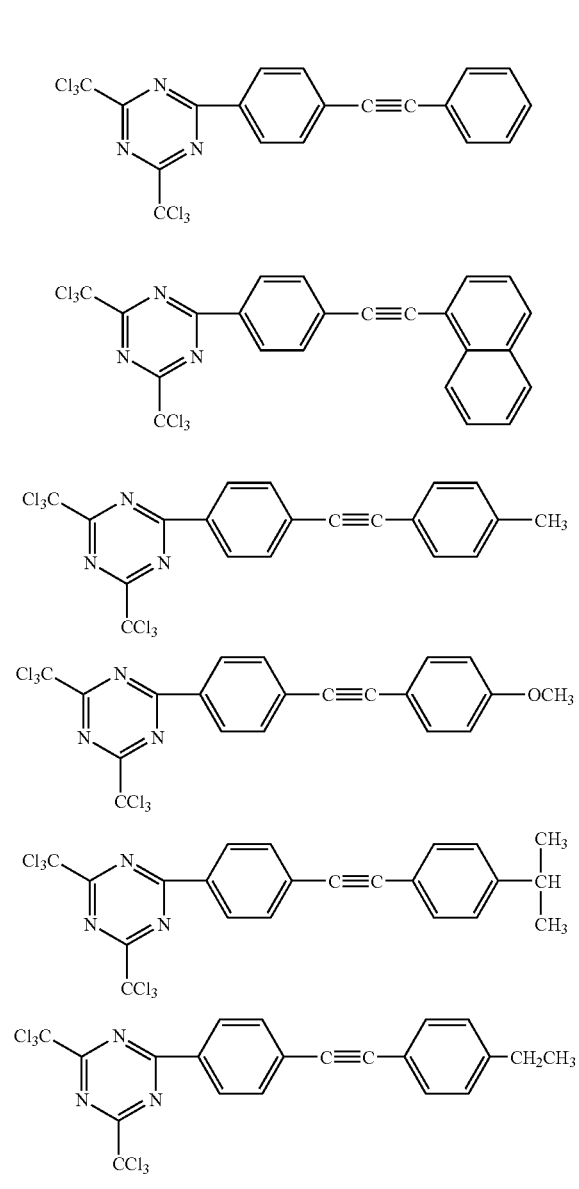

Moreover, compound described in JP-A-5-281728, such as the following compounds, can be enumerated.

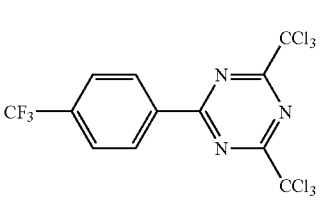

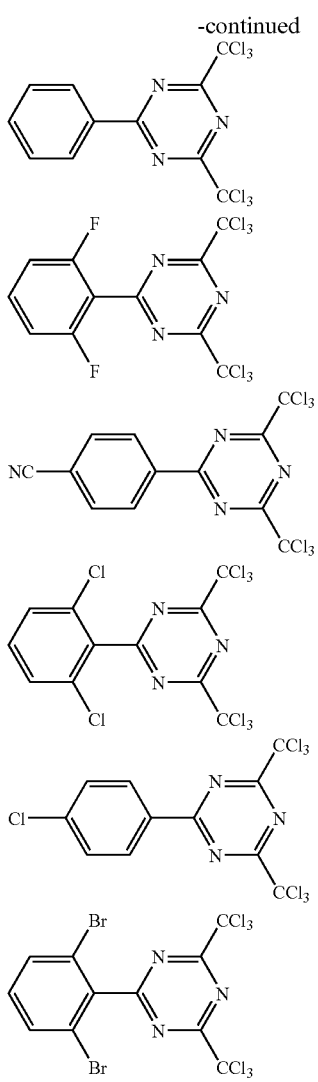

(3) Borate Salt Compound:

A borate salt represented by the following formula [III] is excellent in radical generation ability.

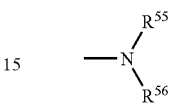

[III]

In the foregoing formula [III], $R^{51}$, $R^{52}$, $R^{53}$, and $R^{54}$ may be the same as or different from each other and each represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group, and two or more of $R^{51}$, $R^{52}$, $R^{53}$, and $R^{54}$ may be bonded to each other to form a cyclic structure. However, at least one of $R^{51}$, $R^{52}$, $R^{53}$, and $R^{54}$ represents a substituted or unsubstituted alkyl group. $Z^+$ represents an alkali metal cation or a quaternary ammonium cation.

The alkyl group represented by $R^{51}$ to $R^{54}$ includes linear, branched or cyclic alkyl groups, and those having from 1 to 18 carbon atoms are preferable. Specific examples include methyl, ethyl, propyl, isopropyl, butyl, hexyl, octyl, stearyl, cyclobutyl, cyclopentyl, and cyclohexyl. Also, examples of the substituted alkyl group include the foregoing alkyl groups which are, however, substituted with a halogen atom (for example, —Cl and —Br), a cyano group, a nitro group, an aryl group (preferably a phenyl group), a hydroxyl group, a group represented by the following formula:

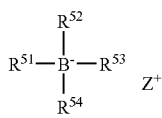

(wherein $R^{55}$ and $R^{56}$ each independently represents a hydrogen atom, an alkyl group having from 1 to 14 carbon atoms, or an aryl group), —COOR$^{57}$ (wherein $R^{57}$ a hydrogen atom, an alkyl group having from 1 to 14 carbon atoms, or an aryl group) or —OR$^{59}$ (wherein $R^{59}$ represents a hydrogen atom, an alkyl group having from 1 to 14 carbon atoms, or an aryl group ) as a substituent.

The aryl group represented by $R^{51}$ to $R^{54}$ includes monocyclic to tricyclic aryl groups such as a phenyl group and a naphthyl group. Examples of the substituted aryl group include the foregoing aryl groups which are, however, substituted with the substituent enumerated in the foregoing substituted alkyl group or an alkvl group having from 1 to 1 carbon atoms.

The alkenyl group represented by $R^{51}$ to $R^{54}$ includes linear, branched or cyclic alkenyl groups having from 2 to 18 carbon atoms. The substituent of the substituted alkenyl group includes those enumerated as the substituent of the foregoing substituted alkyl group.

The alkynyl group represented by $R^{51}$ to $R^{54}$ includes linear or branched alkynyl groups having from 2 to 28 carbon atoms. The substituent of the substituted alkynyl group includes those enumerated as the substituent of the foregoing substituted alkyl group.

Also, examples of the heterocyclic group represented by $R^{51}$ to $R^{54}$ include 5- or more membered heterocyclic groups containing at least one of N, S and O, and of these, 5-membered to 7-membered heterocyclic groups are preferable. The heterocyclic group may contain a fused ring. Further, the heterocyclic group may have a substituent such as those enumerated as the substituent of the foregoing substituted aryl group.

Specific examples of the compound represented by the formula [III] include compounds described in U.S. Pat. Nos. 3,567,453 and 4,343,891 and European Patent Nos. 109,772 and 109,773 and the following compounds.

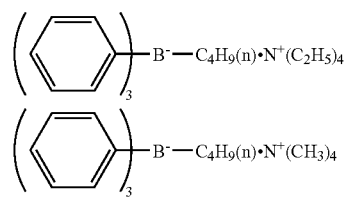

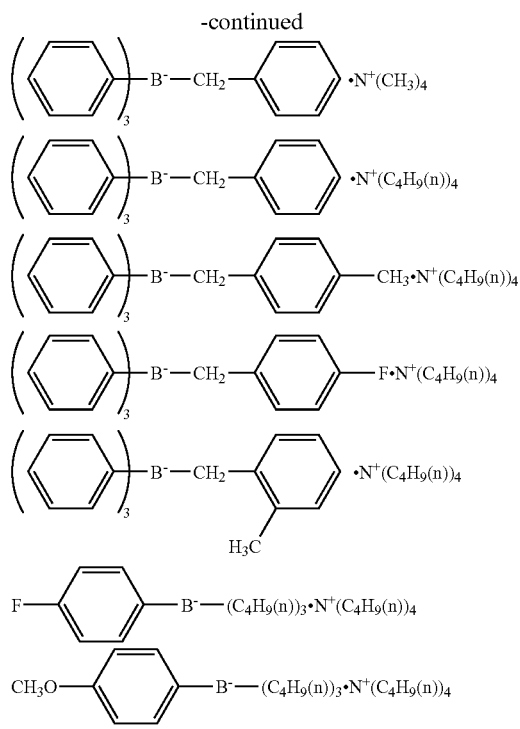

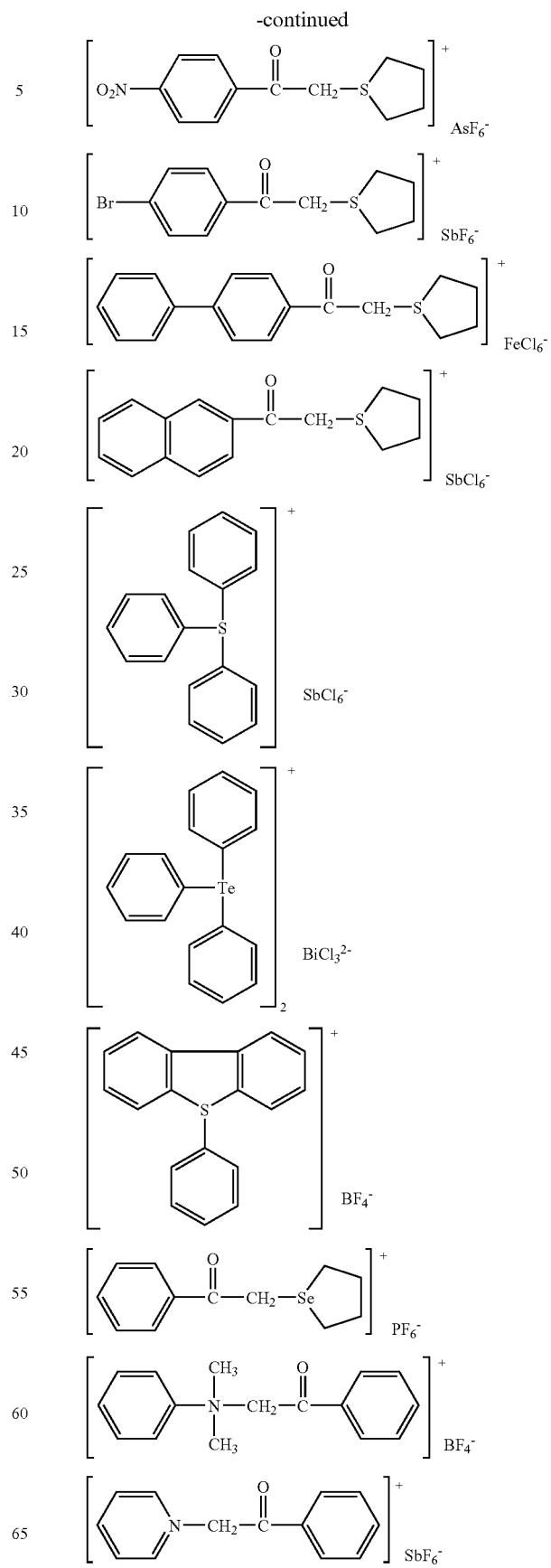

(4) Hexaaryl Biimidazole:

This compound is excellent in stability and can generate a radical at a high sensitivity. Specific examples include 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole, and 2,2'-bis(o-trifluoromethylphenyl)-4,4',5,5'-tetraphenyl biimidazole.

(5) Onium Salt Compound:

Onium compounds of an element belonging to the group 15(5B), 16(6B) or 17(7B) of the periodic table, specifically N, P, As, Sb, Bi, O, S, Se, Te, or I are an initiator compound having excellent sensitivity. In particular, iodonium salts and sulfonium salts, especially diaryl iodonium and triaryl sulfonium salt compounds are extremely excellent from the viewpoints of both of sensitivity and storage stability. This compound can generate an acid and/or a radical. These can be properly used by properly choosing the use condition depending upon the object. Specific examples thereof will be given below.

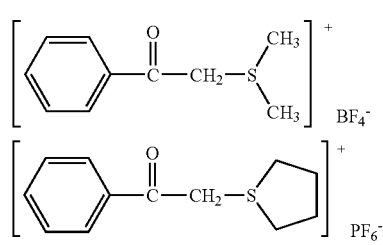

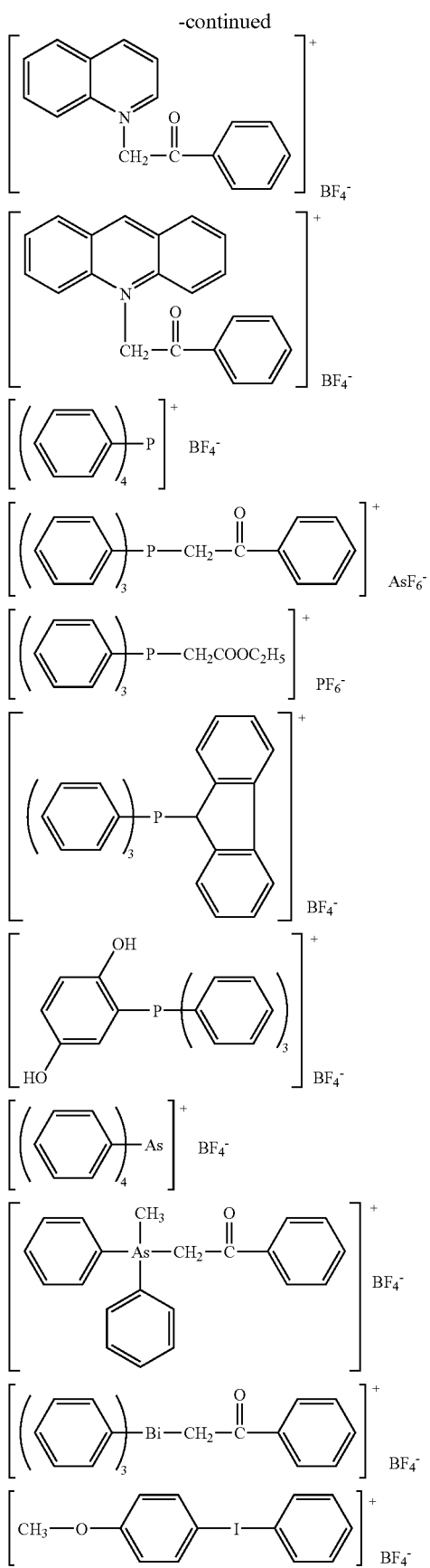

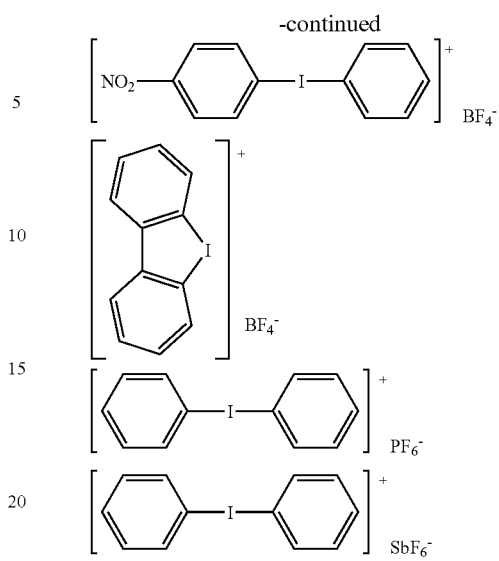

(6) Organic Peroxide:

In the case where an organic peroxide type initiator compound is used, it is possible to undergo the generation of a radical as the active seed at a very high sensitivity.

The "organic peroxide" (6) as other example of the initiator compound (compound (B)) to be used in the invention includes almost all of organic compounds containing one or more oxygen-oxygen bonds in the molecule. Examples thereof include methyl ethyl ketone peroxide, cyclohexanone peroxide, 3,3,5-trimethylcyclohexanone peroxide, methylcyclohexanone peroxide, acetylacetone peroxide, 1,1-bis(t-butylperoxy)-3,3,5-trimethylcyclohexane, 1,1,-bis(t-butylperoxy)-cyclohexane, 2,2-bis(t-butylperoxy)butane, t-butyl hydroperoxide, cumene hydroperoxide, diisopropylbenzene hydroperoxide, p-methane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, bis(t-butylperoxyisopropyl)benzene, 2,5-dimethyl-2,5-di(t-butylperoxy)hexane, 2,5-dimeth-yl-2,5-di(t-butylperoxy)hexyne-3, acetyl peroxide, isobutyryl peroxide, octanoyl peroxide, decanoyl peroxide, lauroyl peroxide, 3,5,5-trimethylhexanoyl peroxide, succinic peroxide, benzoyl peroxide, 2,4-dichlorobenzoyl peroxide, m-toluoyl peroxide, diisopropylperoxy dicarbonate, di-2-ethylhexylperoxy dicarbonate, di-2-ethoxyethylperoxy dicarbonate, dimethoxyisopropylperoxy carbonate, di-(3-methyl-3-methoxybutyl)peroxy dicarbonate, t-butylperoxy acetate, t-butylperoxy pivalate, t-butylperoxy neodecanoate, t-butylperoxy octanoate, t-butylperoxy-3,5,5-trimethylhexanoate, t-butylperoxy laurate, t-butylperoxy benzoate, di-t-butylperoxy isophthalate, 2,5-dimethyl-2,5-di-(benzoylperoxy)hexane, t-butylperoxy maleate, t-butylperoxyisopropyl carbonate, 3,3',4,4'-tetra(t-butylperoxycarbonyl)benzophenone, 3,3',4,4'-tetra(t-amylperoxycarbonyl)-benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, carbonyl di(t-butylperoxy dihydrogendiphthalate), and carbonyl di(t-hexylperoxy dihydrogendiphthalate).

Of these, ester peroxides such as 3,3',4,4'-tetra-(t-butylperoxycarbonyl)benzophenone, 3,3',4,4'-tetra-(t-amylperoxycarbonyl)benzophenone, 3,3',4,4'-tetra-(t-hexylperoxycarbonyl)benzophenone, 3,3',4,4'-tetra-(t-octylperoxycarbonyl)benzophenone, 3,3',4,4'-tetra-(cumylperoxycarbonyl)benzophenone, 3,3',4,4'-tetra(p-isopropylcumylperoxycarbonyl)benzophenone, and di-t-butyldiperoxy isophthalate are preferable.

(7) Titanocene Compound

The titanocene compound suitable to the initiator compound can include titanocene compounds described in JP-A No. 59-152396, 61-151197, 63-41484, 2-249, and 2-4705.

Specific examples for the titanocene compounds can include, for example,
di-cyclopentadienyl-Ti-bis-phenyl,
di-cyclopentadienyl-Ti-bis-2,3,4,5,6-pentafluorophen-1-y 1,
di-cyclopentadienyl-Ti-bis-2,3,5,6-tetrafluorophen-1-yl,
di-cyclopentadienyl-Ti-2,4,6-trifluorophen-1-yl,
di-cyclopentadiethnyl-Ti-2,6-difluorophen-1-yl,
di-cyclopentadienyl-Ti-bis-2,4-difluorophenyl-1-yl,
di-methylcyclopentadienyl-Ti-bis-2,3,4,5,6-pentafluorophen-1-yl,
di-methylcyclopentadienyl-Ti-bis-2,3,5,6-tetrafluorophen-1-yl,
di-methylcyclopentadienyl-Ti-bis-2,4-difluorophen-1-yl,
bis(cyclopentadienyl)-bis(2,6-difluoro-3-(pyry-1-yl)phenyl) titanium,
bis(cyclopentadienyl)bis[2,6-difluoro-3-(methylsulfoneamide)phenyl]titanium,
bis(cyclopentadienyl)bis[2,6-difluoro-3-)N-butylbiaroylamino)phenyl]titanium,
bis(cyclopentadienyl)bis[2,6-difluoro-3-(N-ethylacetylamino)phenyl]titanium,
bis(cyclopnetadienyl)bis[2,6-difluoro-3-(N-methylacetylamino)phenyl]titanium,
bis(cyclopentadienyl)bis[2,6-difluoro-3-(N-ethylpropyonylamino)phenyl]titanium,
bis(cyclopentadienyl)bis[2,6-difluoro-3-(N-ethyl-(2,2-dimethylbutanoyl)amino)phenyl]titanium,
bis(cyclopentadienyl)bis[2,6-difluoro-3-(N-butyl-(2,2-dimethylbutanoyl)amino)phenyl]titanium,
bis(cyclopentadienyl)bis[2,6-difluoro-3-(N-pentyl-(2,2-dimethylbutanoyl)amino)phenyl]titanium,
bis(cyclopentadienyl)bis[2,6-difluoro-3-(N-hexyl)-(2,2-dimethylbutanoyl)phenyl]titanium,
bis(cyclopentadienyl)bis[2,6-difluoro-3-(N-methylbutylylamino)phenyl]titanium,
bis(cyclopentadienyl)bis[2,6-difluoro-3-(N-methylpentanoylamino)phenyl]titanium,
bis(cyclopentadienyl)bis[2,6-difluoro-3-(N-ethylcyclohexylcarbonylamino)phenyl]titanium,
bis(cyclopentadienyl)bis[2,6-difluoro-3-(N-ethylisobutylylamino)phenyl]titanium,
bis(cyclopentadienyl)bis[2,6-difluoro-3-(N-ethylacetylamino)phenyl]titanium,
bis(cyclopentadienyl)bis[2,6-difluoro-3-(2,2,5,5-tetramethyl-1,2,5-azadicycloridin-1-yl)phenyl]titanium,
bis(cyclopentadienyl)bis[2,6-difluoro-3-(ocrylsulfoneamide)phenyl]titanium,
bis(cyclopentadienyl)bis[2,6-difluoro-3-(4-tolylsulfoneamide)phenyl]titanium,
bis(cyclopentadienyl)bis[2,6-difluoro-3-(4-dodecylphenylsulfonylamide)phenyl]titanium,
bis(cyclopentadienyl)bis[2,6-difluoro-3-(4-(1-pentylheptyl)phenylsulfonylamide)phenyl]titanium,
bis(cyclopentadienyl)bis[2,6-difluoro-3-(ethylsulfonylamide)phenyl]titanium,
bis(cyclopentadienyl)bis[2,6,-difluoro-3-((4-bromophenyl)sulfonylamide)phenyl]titanium,
bis(cyclopentadienyl)bis[2,6-difluoro-3-(2-naphthylsulfonylamide)phenyl]titanium,
bis(cyclopentadienyl)bis[2,6-difluoro-3-(hexadecylsulfonylamide)phenyl]titanium,
bis(cyclopentadienyl)bis[2,6-difluoro-3-(N-methyl-(4-dodecylphenyl)sulfonylamide)phenyl]titanium,
bis(cyclopentadienyl)bis[2,6-difluoro-3-(N-methyl-4-(1-pentylheptyl)phenyl)sulfonylamide)]titanium,
bis(cyclopentadienyl)bis[2,6-difluoro-3-(N-hexyl-(4-toly1)-sulfonylamide)phenyl]titanium,
bis(cyclopentadienyl)bis[2,6-difluoro-3-(pyrolidine-2,5-dion-1-yl)phenyl]titanium,
bis(cyclopentadienyl)bis[2,6-difluoro-3-(3,4-dimethyl-3-pyrolidine-2,5-dion-1-yl)phenyl]titanium,
bis(cyclopentadienyl)bis[2,6-difluoro-3-(phthalimide)phenyl]titanium,
bis(cyclopentadienyl)bis[2,6-difluoro-3-isobuthoxycarbonylamino)phenyl]titanium,
bis(cyclopentadienyl)bis[2,6-difluoro-3-(ethoxycarbonylamino)phenyl]titanium,
bis(cyclopentadienyl)bis[2,6-difluoro-3-((2-chloroethoxy)-carbonylamino)phenyl]titanium,
bis(cyclopentadienyl)bis[2,6-difluoro-3-(phenoxycarbonylamino)phenyl]titanium,
bis(cyclopentadienyl)bis[2,6-difluoro-3-(3-phenylthioureido)phenyl]titanium,
bis(cyclopentadienyl)bis[2,6-difluoro-3-(3-butylthioureido)phenyl]titanium,
bis(cyclopentadienyl)bis[2,6-difluoro-3-(3-phenylureido)phenyl]titanium,
bis(cyclopentadienyl)bis[2,6-difluoro-3-(3-butylureido)phenyl]titanium,
bis(cyclopentadienyl)bis[2,6-difluoro-3-[N,N-diacetylamino)phenyl]titanium,
bis(cyclopentadienyl)bis[2,6-difluoro-3-(3,3-dimethylureido)phenyl]titanium,
bis(cyclopentadienyl)bis[2,6-difluoro-3-(acetylamino)phenyl]titanium,
bis(cyclopentadienyl)bis[2,6-difluoro-3-(butylylamino)phenyl]titanium,
bis(cyclopentadienyl)bis[2,6-difluoro-3-(decanoylamino) phenyl]titanium,
bis(cyclopentadienyl)bis[2,6-difluoro-3-(octadecanoylamino)phenyl)titanium,
bis(cyclopentadienyl)bis[2,6-difluoro-3-(isobutyrylamino) phenyl]titanium,
bis(cyclopentadienyl)bis[2,6-difluoro-3-(2-ethylhexanoylamino)phenyl]titanium,
bis(cyclopentadienyl)bis[2,6-difluoro-3-(2-methylbutanoylamino)phenyl]titanium,
bis(cyclopentadienyl)bis]2,6-difluoro-3-(pivaloylamino) phenyl]titanium,
bis(cyclopentadienyl)bis[2,6-difluoro-3-(2,2-dimethylbutanoylamino)phenyl]titanium,
bis(cyclopentadienyl)bis[2,6-difluoro-3(2-enyl-2-methylheptanoylamino)phenyl]titanium,
bis(cyclopentadienyl)bis[2,6-difluoro-3-(cyclohexylcarbonylamino)phenyl]titanium,
bis(cyclopentadienyl)bis[2,6-difluoro-3-(2,2-dimethyl-3-chloropropanoylamino)phenyl]titanium,
bis(cyclopentadienyl)bis[2,6-difluoro-3-(3-phenylpropanoylamino)phenyl]titanium,
bis(cyclopentadienyl)bis[2,6-difluoro-3-(2-chloromethyl-2-methyl-3-chloropropanoylamino)phenyl]titanium, bis(cyclopentadienyl)bis[2,6-difluoro-3-(3,4-xyloylamino) phenyl]titanium,
bis(cyclopentadienyl)bis[2,6-difluoro-3-(4-ethylbenzoylamino)phenyl]titanium,
bis(cyclopentadienyl)bis[2,6-difluoro-3-(2,4,6-mesitylcarbonylamino)phenyl]titanium,
bis(cyclopentadienyl)bis[2,6-difluoro-3-(benzoylamino) phenyl]titanium,
bis(cyclopentadienyl)bis[2,6-difluoro-3-N-(3-phenylpropy1)benzoylamino(phenyl]titanium,
bis(cyclopentadienyl)bis[2,6-difluoro-3-(N-(3-ethylhepty1)-2,2-dimethylpentanoylamino]phenyltitanium,
bis(cyclopentadienyl)bis[2,6-difluoro-3-(N-isobutyl-(4-toluyl)amino)phenyl]titanium,
bis(cyclopentadienyl)bis[2,6-difluoro-3-(N-isobutylbenzoylamino)phenyl]titanium,
bis(cyclopentadienyl)bis[2,6-difluoro-3-(N-cyclohexylmethylpivaloylamino)phenyl]titanium,
bis(cyclopentadienyl)bis[2,6-difluoro-3-(N-(oxolan-2-ylmethyl)benzoylamino)phenyl]titanium,
bis(cyclopentadienyl)bis[2,6-difluoro-3-(N-(3-ethylhepty1)-2,2-dimethylbutanoylamino)phenyl]titanium,
bis(cyclopentadienyl)bis[2,6-difluoro-3-(N-(3-phenylpropyl-4-toluyl)amino)phenyl]titanium,
bis(cyclopentadienyl)bis[2,6-difluoro-3-(N-oxolan-2-ylmethyl)-(4-toluyl)amino)phenyl]titanium,
bis(cyclopentadienyl)bis[2,6-difluoro-3-(N-4-toluylmethyl) benzoylamino)phenyl]titanium,
bis(cyclopentadienyl)bis[2,6-difluoro-3-(N-(4-toluylmethyl)-(4-toluyl)amino)phenyl]titanium,
bis(cyclopentadienyl)bis[2,6-difluoro-3-(N-butylbenzoylamino)phenyl]titanium,
bis(cyclopentadienyl)bis[2,6-difluoro-3-(N-butyl-(4-toluyl) amino)phenyl]titanium,
bis(cyclopentadienyl)bis[2,6-difluoro-3-(N-hexyl-(4-toluyl) amino)phenyl]titanium,
bis(cyclopentadienyl)bis[2,6-difluoro-3-(N-(2,4-dimethylpentyl)-2,2-dimethylbutanoylamino)phenyl]titanium,
bis(cyclopentadienyl)bis[2,6-difluoro-3-(2,4-dimethylpentyl)-2,2-dimethylpentanoylamino)phenyl}titanium,
bis(cyclopentadienyl)bis[2,6-difluoro-3-((4-toluyl)aminophenyl]titanium,
bis(cyclopentadienyl)bis[2,6-difluoro-3-(2,2-dimethylpentanoylamino)phenyl]titanium,
bis(cyclopentadienyl)bis[2,6-difluoro-3-(2,2-dimethyl-3-ethoxypropanoylamino)phenyl]titanium,
bis(cyclopentadienyl)bis[2,6-difluoro-3-(2,2-dimenyl-3-allyloxypropanoylamino)phenyl]titanium,
bis(cyclopentadienyl)bis[2,6-difluoro-3-(N-allylacetylaminophenyl]titanium,
bis(cyclopentadienyl)bis[2,6-difluoro-3-(2-ethylbutanoylamino)phenyl]titanium,
bis(cyclopentadienyl)bis[2,6-difluoro-3-(N-cyclohexylmethylbenzoylamino)phenyl]titanium,
bis(cyclopentadienyl)bis[2,6-difluoro-3-(N-cyclohexylmethyl-(4-toluyl)amino)phenyl]titanium,
bis(cyclopentadienyl)bis[2,6-difluoro-3-(N-(2-ethylhexyl) benzoylamino)phenyl]titanium,
bis(cyclopentadienyl)bis[2,6-difluoro-3-(N-isopropylbenzoylamino)phenyl]titanium,
bis(cyclopentadienyl)bis[2,6-difluoro-3-(N-(3-phenylpropyl)-2,2-dimethylpentanoyl)amino)phenyl]titanium,
bis(cyclopentadienyl)bis[2,6-difluoro-3-(N-hexylbenzoylamino)phenyl]titanium,
bis(cyclopentadienyl)bis[2,6-difluoro-3-(N-cyclohexylmethyl-2,2-dimethylpentanoyl)amino)phenyl]titanium,
bis(cyclopentadienyl)bis[2,6-difluoro-3-(N-butylbenzoylamino)phenyl]titanium,
bis(cyclopentadienyl)bis[2,6-difluoro-3-(N-(2-ethylhexyl)-2,2-dimethylpentanoyl)amino)phenyl]titanium,
bis(cyclopentadienyl)bis[2,6-difluoro-3-(N-hexyl-2,2-dimethylpentanoylamino)phenyl]titanium,
bis(cyclopentadienyl)bis[2,6-difluoro-3-(N-isopropyl-2,2-dimethylpentanoylamino)phenyl]titanium,
bis(cyclopentadienyl)bis[2,6-difluoro-3-(N-(3-phenylpropyl)pivaloylamino)phenyl]titanium,
bis(cyclopentadienyl)bis[2,6-difluoro-3-(N-butyl-2,2-dimethylpentanoylamino)phenyl]titanium,
bis(cyclopentadienyl)bis[2,6-difluoro-3-(N-(2-methoxyethyl)benzoylamino)phenyl]titanium,
bis(cyclopentadienyl)bis[2,6-difluoro-3-(N-benzylbenzoylamino)phenyl]titanium,
bis(cyclopentadienyl)bis[2,6-difluoro-3-(N-benzyl-(4-toluyl)amino)phenyl]titanium,
bis(cyclopentadienyl)bis[2,6-difluoro-3-(N-(2-methoxyethyl)-(4-toluyl)amino)phenyl]titanium,
bis(cyclopentadienyl)bis[2,6-difluoro-3-(N-4-methylphenylmethyl)-2,2-dimethylpentanoylamino)phenyl]titanium,
bis(cyclopentadienyl)bis[2,6-difluoro-3-(N-(2-methoxyethyl)-2,2-dimethylpentanoylamino)phenyl]titanium,
bis(cyclopentadienyl)bis[2,6-difluoro-3-(N-cyclohexylmethyl)-(2-ethyl-2-methylheptanoyl)amino)phenyl]titanium,
bis(cyclopentadienyl)bis[2,6-difluoro-3-(N-butyl-(4-chlorobenzoyl)amino)phenyl]titanium,
bis(cyclopentadienyl)bis[2,6-difluro-3-(N-hexyl-(2-ethyl-2-methylbutanoyl)amino)phenyl]titanium,
bis(cyclopentadienyl)bis[2,6-difluoro-3-(N-cyclohexyl-2,2-dimethylpentanoyl)amino)phenyl]titanium,
bis(cyclopentadienyl)bis[2,6-difluoro-3-(N-oxolan-2-ylmethyl)-2,2-dimethylpentanoyl)amino)phenyl]titanium,
bis(cyclopentadienyl)bis[2,6-difluoro-3-(N-cyclohexyl-(4-chlorobenzoyl)amino)phenyl]titanium,
bis(cyclopentadienyl)bis[2,6-difluoro-3-(N-cyclohexyl-(2-chlorobenzoyl)amino)phenyl]titanium,
bis(cyclopentadienyl)bis[2,6-difluoro-3-(3,3-dimethyl-2-azetidinon-1-yl)phenyl]titanium,
bis(cyclopentadienyl)bis[2,6-difluoro-3-isocyanatophenyl) titanium,
bis(cyclopentadienyl)bis[2,6-difluoro-3-(N-ethyl-(4-tolylsulfonyl)amino)phenyl]titanium,
bis(cyclopentadienyl)bis[2,6-difluoro-3-(N-hexyl-(4-tolylsulfonyl)amino)phenyl]titanium,
bis(cyclopentadienyl)bis[2,6-difluoro-3-(N-butyl-(4-tolylsulfonyl)amino)phenyl]titanium,
bis(cyclopentadienyl)bis[2,6-difluoro-3-(N-isobutyl-(4-tolylsulfonyl)amino)phenyl]titanium,
bis(cyclopentadienyl)bis[2,6-difluoro-3-(N-butyl-(2,2-dimethyl-3-chloropropanoyl)amino)phenyl]titanium,
bis(cyclopentadienyl)bis[2,6-difluoro-3-(N-(3-phenylpropanoyl)-2,2-dimethyl-3-chloropropanoyl)amino)phenyl] titanium,
bis(cyclopentadienyl)bis[2,6-difluoro-3-(N-cyclohexylmethyl-(2,2-dimethyl-3-chloropropanoyl)amino) phenyl]titanium,
bis(cyclopentadienyl)bis[2,6-difluoro-3-(N-isobutyl-(2,2-dimethyl-3-chloropropanoyl)phenyl]titanium,
bis(cyclopentadienyl)bis[2,6-difluoro-3-(N-butyl-(2-chloromethyl-2-methyl-3-chloropropanoyl)amino)phenyl]titanium,
bis(cyclopentadienyl)bis[2,6-difluoro-3-(butylthiocarbonylamino)phenyl]titanium, bis(cyclopentadienyl)bis[2,6-difluoro-3-(phenylthiocarbonylamino)phenyl]titanium,
bis(cyclopentadienyl)bis[2,6-difluoro-3-isocyanatophenyl)titanium,
bis(cyclopentadienyl)bis[2,6-difluoro-3-(N-ethyl-(4-tolylsulfonyl)amino)phenyl]titanium,
bis(cyclopentadienyl)bis[2,6-difluoro-3-(N-hexyl-(4-tolylsulfonyl)amino)phenyl]titanium,
bis(cyclopentadienyl)bis[2,6-difluoro-3-(N-butyl-(4-tolylsulfonyl)amino)phenyl]titanium,
bis(cyclopentadienyl)bis[2,6-difluoro-3-(N-isobutyl-(4-tolylsulfonyl)amino)phenyl]titanium,
bis(cyclopentadienyl)bis[2,6-difluoro-3-(N-butyl-(2,2-dimethyl-3-chloropropanoyl)amino)phenyl]titanium,
bis(cyclopentadienyl)bis[2,6-difluoro-3-(N-(3-phenylpropanoyl)-2,2-dimethyl-3-chloropropanoyl)amino)phenyl]titanium,
bis(cyclopentadienyl)bis[2,6-difluoro-3-(N-cyclohexylmethyl-(2,2-dimethyl-2-chloropropanoyl)amino) phenyl]titanium,
bis(cyclopentadienyl)bis[2,6-difluoro-3-(N-isobutyl-(2,2-dimethyl-3-chloropropanyl)phenyl]titanium,
bis(cyclopentadienyl)bis[2,6-difluoro-3-(N-butyl-(2-chloromethyl-2-methyl-3-chloropropanoyl)amino)phenyl]titanium,
bis(cyclopentadienyl)bis[2,6-difluoro-3-(butylthiocarbonylaino)phenyl]titanium,
bis(cyclopentadienyl)bis[2,6-difluoro-3-(phenylthiocarbonylamino)phenyl]titanium,
bis(methylcyclopentadienyl)bis[2,6-difluoro-3-[N-hexyl-2,2-dimethylbutanoyl)amino)phenyl]titanium,
bis(methylcyclopentadienyl)bis[2,6-difluoro-3-(N-hexyl-2,2-dimethylpentanoylamino)phenyl]titanium,
bis(methylcyclopentadienyl)bis[2,6-difluoro-3-(N-ethylacetylamino)phenyl]titanium,
bis(methylcyclopentadienyl)bis[2,6-difluoro-3-(N-ethylpropyonylamino)phenyl]titanium,
bis(trimethylsilylpentadienyl)bis[2,6-difluoro-3-(N-butyl-2,2-dimethylpropanoylamino)phenyl]titanium,
bis(cyclopentadienyl)bis[2,6-difluoro-3-(N-(2-methoxyethyl)-trimethylsilylamino)phenyl]titanium,
bis(cyclopentadienyl)bis[2,6-difluoro-3-(N-butylhexyldimethylsilylamino)phenyl]titanium,
bis(cyclopentadienyl)bis[2,6-difluoro-3-(N-ethyl-(1,1,2-trimethylpropyl)dimethylsilylamino)phenyl]titanium,
bis(cyclopentadienyl)bis[2,6-difluoro-3-(3-ethoxymethyl-3-methyl-2-azethiodinon-1-yl)phenyl]titanium,
bis(cyclopentadienyl)bis[2,6-difluoro-3-(3-allyloxymethyl-3-methyl-2-azetidinon-1-yl)phenyl[titanium,
bis(cyclopentadienyl)bis[2,6-difluoro-3-(3-chloromethyl-3-methyl-2-azetidinon-1-yl)phenyl]titanium,
bis(cyclopentadienyl)bis[2,6-difluoro-3-(N-benzyl-2,2-dimethylpropanoylamino)phenyl]titanium,
bis(cyclopentadienyl)bis[2,6-difluoro-3-(5,5-dimethyl-2-pyrolidinon-1-yl)phenyl]titanium,
bis(cyclopentadienyl)bis[2,6-difluoro-3-(6,6-diphenyl-2-piperidinon-1-yl)phenyl]titanium,
bis(cyclopentadienyl)bis[2,6-difluoro-3-(N-(2,3-dihydro-1,2-benzothiazolo-3-one(1,1-dioxide)-2-yl)phenyl]titanium,
bis(cyclopentadienyl)bis[2,6-difluoro-3-(N-hexyl]-(4-chlorobenzoyl)aminophenl]titanium,
bis(cyclopentadienyl)bis[2,6-difluoro-3-(N-hexyl-(2-chlorobenzoyl)amino)phenyl]titanium,
bis(cyclopentadienyl)bis[2,6-difluoro-3-(N-isopropyl-(4-chlorobenzoyl)amino)phenyl]titanium,
bis(cyclopentadienyl)bis[2,6-difluoro-3-(N-(4-methylphenylmethyl)-(4-chlorobenzoyl)amino)phenyl]titanium,
bis(cyclopentadienyl)bis[2,6-difluoro-3-(N-(4-methylphenylmethyl)-2-(2-chlorobenzoyl)amino)phenyl]titanium,
bis(cyclopentadienyl)bis[2,6-difluoro-3-(N-butyl-(4-chlorobenzoyl)amino)phenyl]titanium,
bis(cyclopentadienyl)bis[2,6-difluoro-3-(N-benzyl-2,2-dimethylpentanoylamino)phenyl]titanium,
bis(cyclopentadienyl)bis[2,6-difluoro-3-(N-(2-ethylhexyl)-4-tolyl-sulfonyl)amino)phenyl]titanium,
bis(cyclopentadienyl)bis[2,6-difluoro-3-(N-(3-oxaheptyl)benzoylamino)phenyl]titanium,
bis(cyclopentadienyl)bis[2,6-difluoro-3-(N-(3,6-dioxadecyl)benzoylamino)phenyl]titanium,
bis(cyclopentadienyl)bis[2,6-difluoro-3-trifluoromethylsulfonyl)amino)phenyl]titanium,
bis(cyclopentadienyl)bis[2,6-difluoro-3-(trifluoroacetylamino)phenyl]titanium,
bis(cyclopentadienyl)bis[2,6-difluoro-3-(2-chlorobenzoyl)amino)phenyl]titanium,
bis(cyclopentadienyl)bis[2,6-difluoro-3-(4-chlorobenzoyl)amino)phenyl]titanium,
bis(cyclopentadienyl)bis[2,6-difluoro-3-(N-(3,6-dioxadecyl)-2,2-dimethylpentanoylamino)phenyl]titanium,
bis(cyclopentadienyl)bis[2,6-difluoro-3-(N-(3,7-dimethyl-7-methoxyoctyl)benzoylamino)phenyl]titanium, and
bis(cyclopentadienyl)bis(2,6-difluoro-3-(N-cyclohexylbenzoylamino)phenyl)titanium.

Likewise the foregoing sensitizing dye, the initiator compound can be also subjected to a variety of chemical modifications for the purpose of improving the characteristics of the photosensitive layer. Examples of methods which can be applied include binding with the sensitizing dye, addition polymerizable unsaturated compound or other initiator compound part, introduction of a hydrophilic site, enhancement of affinity, introduction of a substituent for the purpose of suppressing crystal deposition, introduction of a substituent for the purpose of enhancing adhesion, and polymerization.

With respect to the use method of the initiator compound, likewise the foregoing sensitizing dye, it can be properly and arbitrarily set up according to the design of performance of the photosensitive material. For example, by using two or more kinds of initiator compounds jointly, it is possible to enhance the affinity with the photosensitive layer.

In general, an increased amount of the initiator compound to be used is advantageous from the standpoint of sensitivity. When the initiator compound is used in an amount ranging from 0.5 to 80 parts by weight, and preferably from 1 to 50 parts by weight based on 100 parts by weight of the photosensitive layer components, sufficient sensitivity is obtained.

The "compound (C) whose physical or chemical characteristic irreversibly changes by at least one kind of a radical, an acid, and a base", which is a third essential component in the photosensitive composition of the invention, is a compound in which its physical or chemical characteristic irreversibly changes by the action of an active seed generated by photoreaction of the foregoing photoinitiation system, thereby causing curing reaction, color development, color decolorization, or the like. Any compounds can be arbitrarily used without limitations so far as they have such properties. For example, in many cases, the compounds enumerated above for the initiation system have such properties themselves.

Examples of the characteristic of the compound (C) which changes by a radical, an acid, and/or a base generated from the photoinitiation system include changes of molecular physical properties (for example, absorption spectrum (color), chemical structure, and polarizability) and material physical properties (for example, solubility, strength, refractive index, fluidity, and tackiness).

For example, when a compound whose absorption spectrum changes by the pH, such as a pH indicator, is used as the polymerizable compound as the component (C), and an acid or a base is generated from the initiation system, a color tone can be changed only in an exposed area, and therefore, such a composition is useful as the image forming material. Similarly, in the case where a compound whose absorption spectrum changes by oxidation or reduction or nucleophilic addition reaction is used as the component (C), oxidation or reduction is caused by a radical generated by the initiation system, whereby an image can be formed. Such examples are disclosed in, for example, *J. Am. Chem. Soc.*, 108, 128 (1986), *J. Imaging Soc.*, 30, 215 (1986), and *Israel J. Chem.*, 25, 264 (1986).

Above all, by using, as the compound (C), a polymerizable compound reactive with a radical, an acid, and/or a base (hereinafter properly referred to as "polymerizable compound"), specifically an addition polymerizable or polycondensible compound and combining it with an initiation system, it is possible to form a photocurable resin or a negative working photopolymer. Also, such a composition is useful as a negative working photosensitive layer of a lithographic printing plate precursor.

As the component (C), radical polymerizable compounds (for example, ethylenically unsaturated bond-containing compounds), cationic polymerizable compounds (for example, epoxy compounds, vinyl ether compounds, and methylol compounds), and anionic polymerizable compounds (for example, epoxy compounds) are useful. Such examples are described in, for example, *Photopolymer Handbook*, compiled by The Technical Association of Photopolymers, Japan and published by Kogyo Chosakai Publishing Co., Ltd. (1989) and *Kobunshi*, 45, 786 (1996). Also, compositions using a thiol compound as the component (C) and combining it with a photo-radical generation system are well known.

It is also useful to use an acid decomposable compound as the component (C) and combine it with a photo acid generator. For example, materials in which a polymer whose side change or main chain is decomposed by an acid is used, and solubility, hydrophilicity or hydrophobicity is changed by light are widely practically used as a photodecomposable photosensitive resin or a positive working photopolymer. Specific examples thereof are given in, for example, *ACS. Symp. Ser.*, 242, 11 (1984), JP-A-60-3625, U.S. Pat. Nos. 5,102,771, 5,206,317 and 5,212,047, JP-A-4-26850, JP-A-3-192173, JP-A-60-10247, and JP-A-62-40450.

The invention will be described below in more detail with reference to an example of using an addition polymerizable compound as the compound (C) that is especially excellent for the purpose of obtaining a high-sensitivity lithographic printing plate precursor as one of major applications of the photosensitive composition of the invention.

(C-1) Addition Polymerizable Compound:

An addition polymerizable compound containing at least one ethylenically unsaturated double bond, which is preferred as the compound (C) to be used in the invention, is selected from compounds containing at least one, and preferably two or more terminal ethylenically unsaturated bonds. Such a group of compounds is widely known in the subject industrial field, and these compounds can be used in the invention without particular limitations. These compounds have a chemical morphology such as a monomer or a prepolymer, that is, a dimer, a trimer and an oligomer, a mixture thereof, and a copolymer thereof. Examples of monomers and copolymers thereof include unsaturated carboxylic acids (for example, acrylic acid, methacrylic acid, itaconic acid, crotonic acid, isocrotonic acid, and maleic acid) and esters or amides thereof. Of these, esters of an unsaturated carboxylic acid and an aliphatic polyhydric alcohol compound and amides of an unsaturated carboxylic acid and an aliphatic polyhydric amine compound are preferable. Also, addition reaction products of an unsaturated carboxylic acid ester or amide containing a nucleophilic substituent (for example, a hydroxyl group, an amino group, and a mercapto group) with a monofunctional or polyfunctional isocyanate and an epoxy compound; and dehydration condensation reaction products of the foregoing unsaturated carboxylic acid ester or amide with a monofunctional or polyfunctional carboxylic acid are suitably used. Also, addition reaction products of an unsaturated carboxylic acid ester or amide containing an electrophilic substituent (for example, an isocyanato group and an epoxy group) with a monofunctional or polyfunctional alcohol, an amine and a thiol; and displacement reaction products of an unsaturated carboxylic acid ester or amide containing an eliminating substituent (for example, a halogen group and a tosyloxy group) with a monofunctional or polyfunctional alcohol, an amine and a thiol are suitable. Also, as another example, it is possible to use a group of the foregoing compounds in which, however, the unsaturated carboxylic acid is replaced by an unsaturated phosphonic acid, styrene, or the like.

As specific examples of monomers of an ester of an aliphatic polyhydric alcohol compound and an unsaturated carboxylic acid, examples of acrylic acid esters include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri-(acryloyloxyethyl)isocyanurate, and polyester acrylate oligomers.

Examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaeryhthritol hexamethacrylate, sorbitol trimethacrylate, sorbitol tetramethacrylate, bis[p-(3-methacryloxy-2-hydroxypropoxy)phenyl]dimethylmethane, and bis-[p-(methacryloxyethoxy)phenyl]dimethylmethane.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of crotonic acid esters include ethylene glycol dicrotonate, tetramethylene glycol dicrotonate, pentaerythritol dicrotonate, and sorbitol tetracrtonate.

Examples of isocrotonic acid esters include ethylene glycol diisocrotonate, pentaerythritol diisocrotonate, and sorbitol tetraisocrotonate.

Examples of maleic acid esters include ethylene glycol dimaleate, triethylene glycol dimaleate, pentaerythritol dimaleate, and sorbitol tetramaleate.

As examples of other esters, aliphatic alcohol based esters described in JP-B-46-27926, JP-B-51-47334, and JP-A-57-196231; esters having an aromatic based skeleton described in JP-A-59-5240, JP-A-59-5241, and JP-A-2-226149; and esters containing an amino group described in JP-A-1-165613 are also suitably used.

The foregoing ester monomers can be used as a mixture.

Also, specific examples of monomers of an amide of an aliphatic polyhydric amine compound and an unsaturated carboxylic acid include methylene bis-acrylamide, methylene bis-methacrylamide, 1,6-hexamethylene bis-acrylamide, 1,6-hexamethylene bis-methacrylamide, diethylenetriamine tris-acrylamide, xylylene bis-acrylamide, and xylylene bis-methacrylamide.

As examples of other preferred amide based monomers, those having a cyclohexylene structure described in JP-B-54-21726 are enumerated.

Also, urethane based addition polymerizable compounds produced using addition reaction of an isocyanate with a hydroxyl group are suitable. Specific examples thereof include vinylurethane compounds containing two or more polymerizable vinyl groups in one molecule, which are obtained by adding a hydroxyl group-containing vinyl monomer represented by the following formula (V) to a polyisocyanate compound containing two or more isocyanato groups in one molecule, as described in, for example, JP-B-48-41708.

CH$_2$=C(R)COOCH$_2$CH(R')OH              Formula (V)

In the formula, R and R' each represents H or CH$_3$.

Also, urethane acrylates described in JP-A-51-37193, JP-B-2-32293, and JP-B-2-16765; and urethane compounds having an ethylene oxide based skeleton described in JP-B-58-49860, JP-B-56-17654, JP-B-62-39417, and JP-B-62-39418 are suitable.

Further, by using an addition polymerizable compound having an amino structure or a sulfide structure in the molecule, as described in JP-A-63-277653, JP-A-63-260909, and JP-A-1-105238, it is possible to obtain a photosensitive composition having very excellent photosensitive speed.

Other examples include polyfunctional acrylates or methacrylates such as polyester acrylates and epoxy acrylates obtained by reacting an epoxy resin with (meth)acrylic acid, as described in JP-A-48-64183, JP-B-49-43191, and JP-B-52-30490. Also, specific unsaturated compounds described in JP-B-46-43946, JP-B-1-40337, and JP-B-1-40336 and vinylphosphonic acid based compounds described in JP-A-2-25493 can be enumerated. Also, in some case, structures containing a perfluoroalkyl group described in JP-A-61-22048 are suitably used. Moreover, those introduced as photocurable monomers and oligomers in *Journal of The Adhesion Society of Japan*, Vol. 20, No. 7, pp. 300-308 (1984) can be used.

With respect to these addition polymerizable compounds, details of the use method, for example, what kind of structure of an addition polymerizable compound should be used, whether the addition polymerizable compound should be used singly or jointly, and what addition amount of the addition polymerizable compound be employed, can be properly set up so as to coincide with the design of the final performance of lithographic printing plate precursor. For example, the addition polymerizable compound is selected from the following viewpoints. From the viewpoint of photosensitive speed, a structure in which the content of unsaturated groups is high is preferable, and in many cases, bifunctional or polyfunctional compounds are preferable. Also, in order to increase the strength of an image area, i.e., a cured film, trifunctional or polyfunctional compounds are preferable. Further, a method of adjusting both of sensitivity and strength by using compounds having the different functional number or a different polymerizable group from each other (for example, acrylic acid esters, methacrylic acid esters, styrene based compounds, and vinyl ether based compounds) jointly is also effective. Though compound having a high molecular weight or compounds having high hydrophobicity are excellent in photosensitive speed or film strength, they may be possibly undesirable from the standpoint of development speed or occurrence of deposition in the developing solution. Also, a selection and use method of an addition polymerizable compound is an important factory with respect to affinity and dispersibility with other components in the photosensitive layer (for example, a binder polymer, an initiator, and a colorant). For example, the affinity may be enhanced using a low-purity compound or jointly using two or more kinds of compounds. Also, for the purpose of enhancing adhesion to the substrate or an overcoat layer described later, a specific structure may be selected. It is advantageous that the ratio of the addition polymerizable compound to be compounded in the photosensitive layer is high. However, in the case where it is too high, undesirable phase separation, problems on the production step due to tackiness of the photosensitive layer (for example, production failure caused by transfer or sticking of photosensitive layer components), and problems such as deposition from the developing solution may likely occur. From these viewpoints, the addition polymerizable compound is preferably used in an amount ranging from 5 to 80% by weight, and more preferably from 25 to 75% by weight based on the non-volatile components in the photosensitive layer. Also, the addition polymerizable compound may be used singly or in admixture of two or more thereof. Besides, in the use method of the addition polymerizable compound, adequate structure, compounding and addition amount thereof can be arbitrarily selected from the viewpoints of degree of polymerization inhibition against oxygen, resolution degree, fog property, change in refractive index, surface tackiness, and the like. Further, if desired, layer constitution or coating method such as undercoating and overcoating may be employed.

In the case where other compound than the foregoing polymerizable compound (C-1) is used as the component (C), its optimum content can be properly selected depending upon the desired characteristic change or the compound to be used. In general, in the case where a compound whose absorption spectrum changes by oxidation or reduction or nucleophilic addition reaction, its content is preferably from about 10 to 80% by weight in the whole of the solids in the composition.

(D) Binder Polymer:

In applying the photosensitive composition of the invention to a photosensitive layer of a lithographic printing plate precursor as a preferred embodiment, it is preferable to further use a binder polymer in the photosensitive composition from the viewpoint of enhancement of film properties or the like.

It is preferable to contain a linear organic high-molecular polymer as the binder polymer. As such "linear organic high-molecular polymer", though any compounds may be used, it is preferable to select linear organic high-molecular polymers soluble or swelling in water or a weakly alkaline aqueous solution, which can be subjected to development with water or a weakly alkaline aqueous solution. The linear organic high-molecular polymer is selected and used according to applications as not only a film forming agent of the composition but also a water, weakly alkaline aqueous solution or organic solvent developer. For example, when a water-soluble organic high-molecular polymer is used, it is possible to undergo development with water. Examples of such linear organic high-molecular polymers include addition polymers having a carboxylic acid group in the side chain thereof, for example, those described in JP-A-59-44615, JP-B-54-34327, JP-B-58-12577, JP-B-54-25957, JP-A-54-92723, JP-A-59-53836, and JP-A-59-71048, that is, methacrylic acid copolymers, acrylic acid copolymers, itaconic acid copolymers, crotonic acid copolymers, maleic acid copolymers, and partially esterified maleic acid copolymers. Also, similarly, acidic cellulose derivatives having a carboxylic acid group in the side chain thereof can be enumerated. Besides, those comprising a hydroxyl group-containing addition polymer having a cyclic acid anhydride added thereto are useful.

Especially, a copolymer of benzyl (meth)acrylate, (meth)acrylic acid and optionally, other addition polymerizable vinyl monomer and a copolymer of allyl (meth)acrylate, (meth)acrylic acid and optionally, other addition polymerizable vinyl monomer are excellent in balance among film strength, sensitivity and developability and therefore, are suitable.

Also, acid group-containing urethane based binder polymers described in JP-B-7-120040, JP-B-7-120041, JP-B-7-120042, JP-B-8-12424, JP-B-63-287944, JP-A-63-287947, JP-A-1-271741, and Japanese Patent Application No. 10-116232 are very excellent in strength and therefore, are advantageous from the standpoints of printing resistance and low exposure adaptability.

Also, amide group-containing binders described in Japanese Patent Application No. 9-363195 have both of excellent developability and film strength and therefore, are suitable.

Further, as other water-soluble linear organic high-molecular compounds, polyvinylpyrrolidone and polyethylene oxide are useful. Also, for the sake of enhancing the strength of the cured film, alcohol-soluble nylons and polyethers of 2-bis(4-hydroxyphenyl)propane and epichlorohydrin are useful. These linear organic high-molecular polymers can be mixed in an arbitrary amount in the whole of the composition. However, the amount of the linear organic high-molecular polymer exceeding 90% by weight is not preferable from the standpoint of strength of an image to be formed or the like. The amount of the linear organic high-molecular polymer is preferably from 30 to 85% by weight. Also, it is preferable that a ratio of the photopolymerizable ethylenically unsaturated double bond-containing compound to the linear organic high-molecular polymer is in the range of from 1/9 to 7/3 on a weight basis. In a preferred embodiment, the binder polymer that is substantially insoluble in water and soluble in alkalis is used. Thus, an organic solvent that is not preferable from the environmental standpoint may not be used, or its amount can be controlled to a very small level. In such a use method, an acid value of the binder polymer (an acid content expressed in terms of the chemical equivalent number per gram of the polymer) and a molecular weight thereof are properly selected from the viewpoints of image strength and developability. The acid value is preferably in the range of from 0.4 to 3.0 meq/g, and more preferably from 0.6 to 2.0 meq/g; and the molecular weight is preferably in the range of from 3,000 to 500,000, and more preferably from 10,000 to 300,000 in terms of weight average molecular weight.

(E) Other Components:

In the photosensitive composition of the invention, other compounds can be properly added according to utilities, production method, and others. Preferred additives will be enumerated below.

(E-1) Cosensitizer:

By using a certain kind of additive (hereinafter referred to as "cosensitizer"), it is possible to further enhance the sensitivity. Though an action mechanism thereof is not always clear, it may be considered that in may cases, it is based on the following chemical process. That is, it is estimated that various intermediate active seeds (for example, radicals and cations) generated during the photoreaction initiated by a heat polymerization initiator and the subsequent addition polymerization reaction react with the cosensitizer to generate new active radicals. The cosensitizer can be roughly classified into (a) a compound capable of generating an active radical upon reduction, (b) a compound capable of generating an active radical upon oxidation, and (c) a compound capable of reacting with a radical having low activity to convert it into a radical having higher activity or to act as a chain transfer agent. However, in many cases, there is no commonly accepted theory on what the individual initiator compound belongs to.

(a) Compound Capable of Generating an Active Radical Upon Reduction:

Compound Containing a Carbon-halogen Bond:

It is considered that a carbon-halogen bond is reductively cleaved to generate an active seed. Specifically, halomethyl-s-triazines and halomethyl oxazoles can be suitably used.

Compound Containing a Nitrogen-nitrogen Bond:

It is considered that a nitrogen-nitrogen bond is reductively cleaved to generate an active radical. Specifically, hexaaryl biimidazoles are suitably used.

Compound containing an oxygen-oxygen bond:

It is considered that an oxygen-oxygen bond is reductively cleaved to generate an active radical. Specifically, for example, organic peroxides are suitably used.

Onium Compound:

It is considered that a carbon-hetero bond or an oxygen-nitrogen bond is reductively cleaved to general an active seed. Specifically, diaryl iodonium salts, triaryl sulfonium salts, and N-alkoxypyridinium (azinium) salts are suitably used.

Ferrocene or Iron Arene Complex:

This compound can reductively generate an active radical.

(b) Compound Capable of Generating an Active Seed upon Oxidation:

Alkylborate Complex:

It is considered that a carbon-hetero bond is oxidatively cleaved to generate an active radical. Specifically, for example, triarylalkylborates are suitably used.

Alkylamine Compound:

It is considered that a C—X bond on carbon adjacent to nitrogen is oxidatively cleaved to generate an active radical. Suitable examples of X include a hydrogen atom, a carboxyl group, a trimethylsilyl group, and a benzyl group. Specific examples of the compound include ethanolamines, N-phenyl-glycines, and N-trimethylsilylmethylanilines.

Sulfur-containing or Tin-containing compound:

The foregoing amines in which, however, the nitrogen atom is substituted with a sulfur atom or a tin atom can generate an active radical upon the same action. Also, it is known compounds containing an S—S bond cause sensitization upon S—S cleavage.

α-Substituted Methylcarbonyl Compound:

This compound causes bond cleavage between carbonyl and α-carbon upon oxidation, thereby generating an active radical. Also, compounds in which the carbonyl is substituted with an oxime ether exhibit the same action. Specific examples of the compound include 2-alkyl-1-[4-(alkylthio)phenyl]-2-morpholinopronone-1 compounds and oxime ethers obtained by reacting such a compound with a hydroxylamine and then etherifying N—OH.

Sulfinic Acid Salt:

This compound can reductively generate an active radical. Specific examples thereof include sodium arylsulfinates.

(c) Compound Capable of Reacting with a Radical to Convert it into a Radical having High Activity or to Act as a Chain Transfer Agent:

For example, a group of compounds containing SH, PH, SiH, or GeH in the molecule thereof is useful. These compounds can provide a radical seed having low activity with hydrogen to generate a radical or after oxidation, cause deprotonation to generate a radical. Specifically, for example, 2-mercaptobenzimidazoles are enumerated.

With respect to more specific examples of these cosensitizers, most of them are described as additions for the purpose of enhancing the sensitivity in JP-A-9-236913 and can be applied in the invention. A part of them will be described below, but it should not be construed that the invention is limited thereto. Incidentally, the symbol "-TMS" means a trimethylsilyl group.

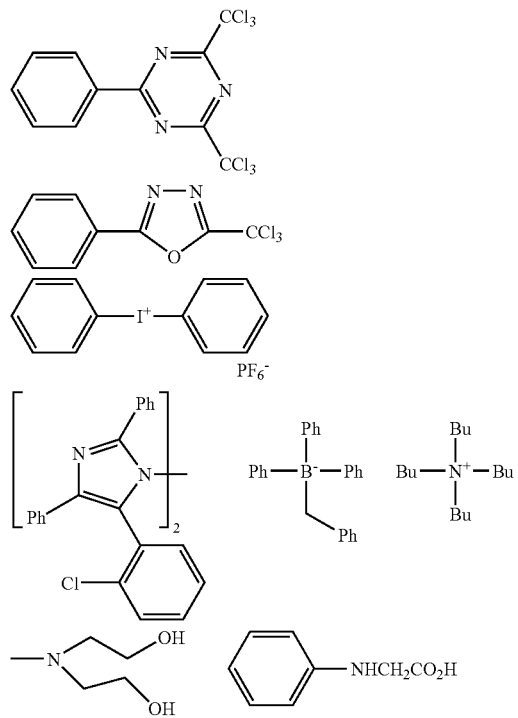

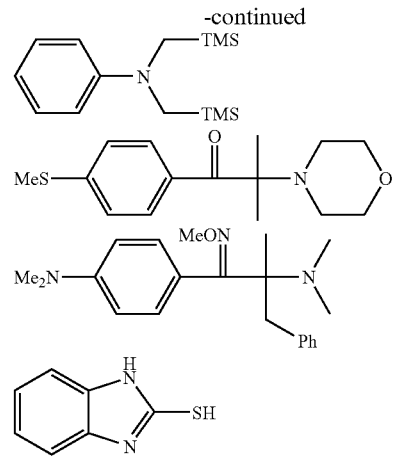

Likewise the foregoing sensitizing dye, the cosensitizer can be also subjected to a variety of chemical modifications for the purpose of improving the characteristics of the photosensitive layer. Examples of methods which can be applied include binding with the sensitizing dye, addition polymerizable unsaturated compound or other initiator compound part, introduction of a hydrophilic site, enhancement of affinity, introduction of a substituent for the purpose of suppressing crystal deposition, introduction of a substituent for the purpose of enhancing adhesion, and polymerization.

The cosensitizer can be used singly or in admixture of two or more thereof. The amount of the cosensitizer to be used is suitably in the range of from 0.05 to 100 parts by weight, preferably from 1 to 80 parts by weight, and more preferably from 3 to 50 parts by weight based on 100 parts by weight of the ethylenically unsaturated double bond-containing compound.

(E-2) Polymerization Inhibitor:

Also, in the invention, it is desired to add a small amount of a heat polymerization inhibitor in addition to the basic components for the purpose of inhibiting unnecessary heat polymerization of the polymerizable ethylenically unsaturated double bond-containing compound during the production or storage of the photosensitive composition. Suitable examples of the heat polymerization inhibitor include hydroquinone, p-methoxyphenol, di-t-butyl-p-cresol, pyrogallol, t-butylcatechol, benzoquinone, 4,4'-thiobis-(3-methyl-6-t-butylphenol), 2,2'-methylenebis(4-methyl-6-t-butylphenol), and N-nitrosophenylhydroxylamine cerium (III) salt. The addition amount of the heat polymerization inhibitor is preferably from about 0.01% by weight to about 5% by weight based on the weight of the whole of the composition. Also, in the case where for the purpose of preventing polymerization hinrance by oxygen, a higher fatty acid derivative such as behenic acid and behenic acid amide is added, if desired, thereby preparing a lithographic printing plate precursor, such a higher fatty acid derivative may be unevenly distributed on the surface of its recording layer during drying after coating on the support or the like. The amount of the higher fatty acid derivative to be added is preferably from about 0.5% by weight to about 10% by weight based on the weight of the whole of the composition.

(E-3) Colorant and the Like:

Further, in the case of the photosensitive composition of the invention is used as a lithographic printing plate precursor, dyes or pigments may be added for the purpose of coloring its recording layer. In this way, it is possible to enhance visibility after plate making or so-called proofing property such as adaptability to an image density analyzer as a printing plate. With respect to the colorant, since most of dyes cause a lowering of the sensitivity of a photopolymerization system recording layer, use of a pigment is especially preferable as the colorant. Specific examples include pigments such as phthalocyanine based pigments, azo based pigments, carbon black, and titanium oxide; and dyes such as Ethyl Violet, Crystal Violet, azo based dyes, anthraquinone based dyes, and cyanine based dyes. The amount of the dye or pigment to be added is preferably from about 0.5% by weight to about 5% by weight of the whole of the composition.

(E-4) Other Additives:

Further, in the case of the photosensitive composition of the invention is used as a lithographic printing plate precursor, inorganic fillers may be added for the purpose of improving physical properties of the cured film. Besides, known additives such as plasticizers and sensitizers capable of enhancing ink acceptability of the surface of the recording layer may be added.

Examples of plasticizers include dioctyl phthalate, didodecyl phthalate, triethylene glycol dicaprylate, dimethylene glycol phthalate, tricresyl phosphate, dioctyl adipate, dibutyl sebacate, and triacetyl glycerin. In the case where a binder is used, the plasticizer can be added in an amount of not more than 10% by weight based on the total weight of the ethylenically unsaturated double bond-containing compound and the binder.

Also, a UV initiator, a heat crosslinking agent, etc. for strengthening effects of heating and exposure after development can be added for the purpose of enhancing the film strength (printing resistance) as described later.

Besides, an additive can be added, or an interlayer can be provided for the purpose of enhancing adhesion between the recording layer and the support or enhancing developing and removing property of an unexposed recording layer. For example, it is possible to enhance the adhesion or printing resistance by adding or undercoating a compound having a relatively strong mutual action with the substrate, such as compounds having a diazonium structure and phosphone compounds. On the other hand, it is possible to enhance the developability of a non-image area and enhance the staining property by adding or undercoating a hydrophilic polymer such as polyacrylic acid and polysulfonic acid.

In preparing a lithographic printing plate precursor, when the photosensitive composition of the invention is coated on a support to form a photosensitive layer, the photosensitive composition is dissolved in a variety of organic solvents and then provided for use. Examples of the solvent which can be used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These solvents can be used singly or in admixture. The concentration of the solid components in the coating solution is suitably from 2 to 50% by weight.

It is desired to properly select the coating amount of the photosensitive layer on the support according to the utility while taking into consideration influences against sensitivity of the photosensitive layer, developability, strength and printing resistance of the exposed film, and the like. In the case where the coating amount is too low, the printing resistance is not sufficient. On the other hand, in the case where it is too high, the sensitivity lowers, it takes a time for exposure, and it takes a long period of time for the development processing, and therefore, such is not preferable. In general, the coating amount of the photosensitive composition of the invention as a photosensitive layer of a lithographic printing plate precursor for scanning exposure as a preferred embodiment of use is suitably in the range of from about 0.1 g/m$^2$ to about 10 g/m$^2$, and preferably from 0.5 to 5 g/m$^2$ in terms of weight after drying.

When the photosensitive composition of the invention is used as a photosensitive layer for the lithographic printing plate precursor, it is preferred to use an initiation system in which a compound represented by the general (3) is used as the sensitizing dye and combined with a titanocene compound as an initiator compound with a view point of sensitivity and the store stability, and an embodiment of containing the initiation system comprising them and addition polymerizable compound (C-1) is particularly preferred.

(Support)

For the sake of obtaining a lithographic printing plate precursor using the photosensitive composition of the invention, it is desired to provide the foregoing photosensitive layer on a support whose surface is hydrophilic. As the hydrophilic support, conventionally known hydrophilic supports that are used in lithographic printing plates can be used without limitations. The support to be used is preferably in a dimensionally stable plate-like state. Examples include papers, papers laminated with plastics (such as polyethylene, polypropylene, and polystyrene), metal plates (such as aluminum, zinc, and copper), and plastic films (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal). These resin films or metal plates may be a plate made of a single material or a lamination made of two or more materials. Examples include papers or plastic films laminated or vapor deposited with the foregoing metals and laminate sheets of films of different plastics. Also, the surface may be subjected to proper known physical or chemical processing for the purposes of imparting hydrophilicity and enhancing the strength as the need arises.

As the support, papers, polyester films, or aluminum plates are especially preferable. Above all, relatively cheap aluminum plates having good dimensional stability and capable of providing the surface having excellent hydrophilicity or strength by the surface processing, if desired are particularly preferable. Also, composite sheets comprising a polyethylene terephthalate film having an aluminum sheet bonded thereon as described in JP-B-48-18327 are preferable.

Suitable aluminum plates are pure aluminum plates and alloy plates containing aluminum as the major component and trace amounts of foreign elements, and further, plastic films laminated or vapor deposited with aluminum may be employed. Examples of foreign elements contained in aluminum alloys include silicon, iron, manganese, copper, magnesium, chromium, zinc, bismuth, nickel, and titanium. The content of foreign elements in the alloy is at most 10% by weight. In the invention, pure aluminum is particularly suitable. However, since it is difficult to produce completely pure aluminum from the standpoint of refining technology, those containing slightly foreign elements may be used. Aluminum plates that are applied in the invention are not specified with respect to their compositions, and those that have hitherto been known and used can be properly utilized. The aluminum plates have a thickness of from about 0.1 to 0.6 mm, preferably from 0.15 to 0.4 mm, and especially preferably from 0.2 to 0.3 mm.

Also, in the case of a support having a surface made of a metal, particularly aluminum, it is preferable that the support is subjected to surface processing such as roughing (sand blasting) processing, dip processing with an aqueous solution of sodium silicate, potassium fluorozirconate, phosphoric acid salt, etc., and anodic oxidation processing.

Prior to roughing the aluminum plate, if desired, the aluminum plate is subjected to degreasing processing with, for example, a surfactant, an organic solvent or an alkaline aqueous solution for the purpose of removing a rolling oil on the surface.

The roughing processing of the surface of the aluminum plate can be carried out by various methods such as a method of mechanically roughing the surface, a method of electrochemically dissolving and roughing the surface, and a method of chemically selectively dissolving the surface. As the mechanical method, known methods such as ball polishing, brush polishing, blast polishing, and buff polishing can be employed. As the electrochemical roughing method, a method of using an alternating current or direct current in a hydrochloric acid or nitric acid electrolytic solution can be employed. Also, a combination of the both methods disclosed in JP-A-54-63902 can also be utilized.

If desired, the thus roughed aluminum plate can be subjected to alkali etching processing, neutralization processing, and then anodic oxidation processing for the purpose of enhancing water retention or abrasion resistance of the surface. As electrolytes to be used for the anodic oxidation processing of the aluminum plate, various electrolytes capable of forming a porous oxidized film can be used. In general, sulfuric acid, phosphoric acid, oxalic acid, chromic acid, or mixed acids thereof can be used. A concentration of such an electrolyte is properly determined depending on the kind of electrolyte.

Further, aluminum plates having been subjected to dip processing with a sodium silicate aqueous solution after roughing can be suitably used. Aluminum plates prepared through anodic oxidation processing and subsequent dip processing with an alkali metal silicate aqueous solution as described in JP-B-47-5125 are suitably used. The anodic oxidation processing is carried out by passing an electric current in an electrolytic liquid made of one or two or more of aqueous solutions or non-aqueous solutions of inorganic acids (for example, phosphoric acid, chromic acid, sulfuric acid, and boric acid), organic acids (for example, oxalic acid and sulfamic acid), or salts thereof using an aluminum plate as an anode.

As the hydrophilic processing of the support, silicate vapor deposition described in U.S. Pat. No. 3,658,662 is also effective. Also, surface processing comprising a combination of a support having been subjected to electrolytic graining, as disclosed in JP-B-46027481, JP-A-52-58602, and JP-A-52-30503 with the foregoing anodic oxidation processing and sodium silicate processing is useful. Also, those prepared by subjecting to mechanical roughing, chemical etching, electrolytic graining, anodic oxidation processing, and sodium silicate processing in that order, as disclosed in JP-A-56-28893, are suitable.

Further, those prepared by after the foregoing processings, undercoating a water-soluble resin (for example, polyvinylsulfonic acid, polymers and copolymers having a sulfonic acid group in the side chain, and polyacrylic acid), a water-soluble metal salt (for examples zinc borate), a yellow dye, an amine salt, and the like are suitable.

Moreover, sol-gel processed substrates covalently bonded with a functional group capable of causing addition polymerization by a radical as disclosed in Japanese Patent Application No. 5-304358 are suitably used.

As other preferred examples, those in which a water-resistant hydrophilic layer is provided as a surface layer on an arbitrary support can be enumerated. Examples of such a surface layer include layers comprising an inorganic pigment and a binder as described in U.S. Pat. No. 3,055,295 and JP-A-56-13168, hydrophilic swelling layers described in JP-A-9-80744, and sol-gel films made of titanium oxide, polyvinyl alcohol, and a silicate as described in JP-T-8-507727.

Such hydrophilic processing is applied for the purposes of not only making the surface of the support hydrophilic, but also preventing noxious reaction of the photosensitive composition to be provided thereon and enhancing adhesion of the photosensitive layer.

(Protective Layer)

In a case of using the photosensitive composition of the invention for the lithographic printing plate precursor for scanning exposure, a protective layer can be provided on the photosensitive layer containing a polymerizable compound. The lithographic printing plate precursor is usually exposed in air, and the protective layer prevents incorporation of low-molecular compounds such as oxygen and basic substances, which are present in air and prevent inhibition of the image formation reaction by exposure in atmospheric air. Accordingly, characteristics desired for the protective layer is that the permeability of low molecular compounds such as oxygen is low and, further, and it is further desirable for good transmittance to a light used for exposure, excellent adhesion with the photosensitive layer, and easy removable in the developing step after exposure.

With respect to such protective layers, there have hitherto been made various devices, the details of which are described in U.S. Pat. No. 3,458,311 and JP-A-55-49729. As materials that can be used for protective layers, water-soluble high-molecular compounds having relatively excellent crystallinity are used preferably. Specifically, water-soluble polymers such as polyvinyl alcohol, polyvinylpyrrolidone, acidic celluloses, gelatin, gum arabic, and polyacrylic acids are known. Among them, use of polyvinyl alcohol as the major component gives the best results with respect to basic characteristics such as oxygen shielding property and development removal property. The polyvinyl alcohol to be used in the protective layer may be partially substituted with an ester, an ether, or an acetal so far as it contains an unsubstituted vinyl alcohol unit for the sake of having necessary oxygen shielding property and water solubility. Also, it may partly have other copolymerization components. Particularly, a mixture in which polyvinyl alcohol is replaced with polyvinyl pyrrolidone within a range from 15 to 50 mass % is preferred with a view point of store stability.

Specific examples of the polyvinyl alcohol include those having been hydrolyzed to an extent of from 71 to 100% by mole and having a weight average molecular weight in the range of from 300 to 2,400. Specific examples includes PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (all of which are manufactured by Kuraray Co., Ltd.).

Components of the protective layer (inclusive of selection of PVA and use of additives), coating amount, etc. are selected while taking into account shielding property of oxygen, development removal property, fogging, adhesion, and scuff resistance. In general, the higher the degree of hydrolysis of PVA to be used (the higher the content of unsubstituted vinyl alcohol unit in the protective layer) and the thicker the film thickness, the higher the shielding property of low-molecular substances, therefore, such is advantageous on the point of sensitivity. However, where the shielding property of low-molecular substances is extremely increased, there are caused problems such that unnecessary polymerization reaction takes place at the time of manufacture and unprocessed stock storage and that unnecessary fogging and thickening of image lines are generated at the time of imagewise exposure. Also, adhesion to an image area and scuff resistance are also extremely important in handling printing plates. That is, when a hydrophilic layer made of a water-soluble polymer is laminated on an oleophilic recording layer, film separation is liable to take place due to shortage of adhesive force, whereby the separated part causes defects such as poor film curing due to polymerization inhibition by oxygen.

In contrast, various proposals have been made for improving the adhesion between these two layers. For example, U.S. Pat. Nos. 292,501 and 44,563 describe that by mixing from 20 to 60% by weight of an acrylic emulsion or a water-insoluble polyvinylpyrrolidone-vinyl acetal copolymer in a hydrophilic polymer mainly composed of polyvinyl alcohol and laminating the mixture on a recording layer, sufficient adhesion is obtained. For the protective layer in the invention, any of these known technologies can be applied. Coating methods of such protective layers are described in detail in, for example, U.S. Pat. No. 3,458,311 and JP-A-55-49729.

Further, it is possible to impart other functions to the protective layer. For example, by adding a colorant (for example, water-soluble dyes) having excellent permeability to light to be used for exposure (for example, infrared laser having a wavelength of from 760 to 1,200 nm) and capable of efficiently absorbing light having a wavelength such that it is not concerned with the exposure, safe light adaptability can be further enhanced without causing a lowering of the sensitivity.

In subjecting a lithographic printing plate precursor using the photosensitive composition of the invention to plate making to form a lithographic printing plate, in general, as described later in detail, exposure processing (image exposure) is carried out, and an unexposed area of the photosensitive layer is then removed with a developing solution to form an image. As the preferred developing solution in using such a photosensitive composition in the preparation of a lithographic printing plate, developing solutions described in JP-B-57-7427 are enumerated, including inorganic alkaline agents (for example, sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, and ammonia water) and organic alkaline agents (for example, monoethanolamine and diethanolamine). Such an alkaline solution is added in an amount such that the concentration is from 0.1 to 10% by weight, and preferably from 0.5 to 5% by weight.

Also, the alkaline aqueous solution can contain a small amount of a surfactant or an organic solvent such as benzyl alcohol, 2-phenoxyethanol, and 2-butoxyethanol, if desired. For example, those described in U.S. Pat. Nos. 3,375,171 and 3,615,480 can be enumerated.

Further, developing solutions described in JP-A-50-26601, JP-A-58-54341, JP-B-56-39464, and JP-B-56-42860 are also excellent.

Especially preferred examples of the developing solution that can be used include developing solutions described in JP-A-2002-202616, containing a nonionic compound represented by the following formula (VI) and having a pH of from 11.5 to 12.8 and an electric conductivity of from 3 to 30 mS/cm.

$$A-W \qquad \text{Formula (VI)}$$

In the foregoing formula (VI), A represents a hydrophobic organic group of 1.5 or more in terms of log P of A-H; and W represents a nonionic hydrophilic organic group of less than 1.0 in terms of log P of W—H.

The term "log P" as referred to herein is generally used as a hydrophobicity parameter described in C. Hansch, A. Leo, *Substituent Constants for Correlation Analysis in Chemistry and Biology*, J. Wile & Sons (1979) and defined as a logarithm of an equilibrium concentration ratio P calculated from a proportion to be distributed into respective layers against an octanol/water two-layer system of the desired molecule (A-H and W—H).

Here, "log P" is used as an index for specifying the respective groups A and W in the formula (VI) and is one calculated and determined from known data based on the method described in A. K. Chose, et al., *J. Comput. Chem.*, 9, 80 (1988) against the A-H and W—H structures in which a hydrogen atom is bonded to each of the organic groups A and W for the sake of convenience.

Specifically, with respect to the structure, the organic groups A and W are different from each other and each represents a monovalent organic residue satisfactory with the foregoing "log P". More preferably, A and W are the same as or different from each other and each represents a hydrogen atom, a halogen atom, an optionally substituted hydrocarbon group that may contain an unsaturated bond, a heterocyclic group, a hydroxyl group, a substituted oxy group, a mercapto group, a substituted thio group, an amino group, a substituted amino group, a substituted carbonyl group, a carboxylato group, a sulfo group, a sulfonato group, a substituted sulfinyl group, a substituted sulfonyl group, a phosphono group, a substituted phosphono group, a phosphonato group, a substituted phosphonato group, a cyano group, or a nitro group.

Examples of the optionally substituted hydrocarbon group that may contain an unsaturated bond include an alkyl group, a substituted alkyl group, an aryl group, a substituted aryl group, an alkenyl group, a substituted alkenyl group, an alkynyl group, and a substituted alkynyl group.

As the alkyl group and substituted alkyl group, those enumerated above as preferred specific examples for $R^1$, $R^2$ and $R^3$ can be enumerated.

Also, as the alkyl group in these substituents, linear, branched or cyclic alkyl groups having from 1 to 20 carbon atoms can be enumerated. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbonyl group. Of these, linear alkyl groups having from 1 to 12 carbon atoms, branched alkyl groups having from 3 to 12 carbon atoms, and cyclic alkyl groups having from 5 to 10 carbon atoms are more preferable.

Specific examples of the aryl group include a phenyl group, a biphenyl group, a naphthyl group, a tolyl group, a xylyl group, a mesityl group, a cumenyl group, a fluorophenyl group, a chlorophenyl group, a bromophenyl group, a chloromethylphenyl group, a hydroxyphenyl group, a methoxyphenyl group, an ethoxyphenyl group, a phenoxylphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a phenyl group, a nitrophenyl group, a cyanophenyl group, a sulfophenyl group, a sulfonatophenyl group, a phosphonophenyl group, and a phosphonatophenyl group.

Also, examples of the alkenyl group include a vinyl group, a 1-propenyl group, a 1-butenyl group, a cinnamyl group, and a 2-chloro-1-ethenyl group. Examples of the alkynyl group include an ethynyl group, a 1-propynyl group, a 1-butynyl group, a trimethylsilylethynyl group, and a phenylethynyl group.

Examples of $R^4$ in the acyl group ($R^4CO-$) include a hydrogen atom and the foregoing alkyl groups, aryl groups, alkenyl group and alkynyl groups.

On the other hand, as the alkylene group in the substituted alkyl group, divalent organic residues resulting from elimination of any one of hydrogen atoms on the foregoing alkyl group having from 1 to 20 carbon atoms can be enumerated. Of these, linear alkyl groups having from 1 to 12 carbon atoms, branched alkyl groups having from 3 to 12 carbon atoms, and cyclic alkyl groups having from 5 to 10 carbon atoms are preferable. Specific examples of the preferred substituted alkyl group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, a methoxycarbonylmethyl group, a methoxycarbonylbutyl group, an ethoxycarbonylmethyl group, a butoxycarbonylethyl group, an alloxycarbonylmethyl group, a benzyloxycarbonylmethyl group, a methoxycarbonylphenylmethyl group, a trichloromethylcarbonylmethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfopropyl group, a sulfobutyl group, a sulfonatobuty group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group and the following functional groups

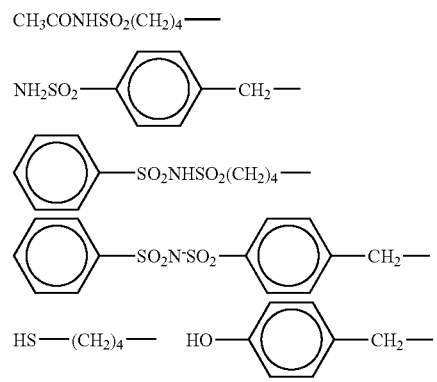

Specific examples of the preferred aryl group include those in which from one to three benzene rings form a fused ring and those in which a benzene ring and a 5-membered unsaturated ring form a fused ring. Specific examples thereof include a phenyl group, a naphthyl group, an anthryl group, a phenanthryl group, an indenyl group, an acenaphthenyl group, and a fluorenyl group. Of these, a phenyl group and a naphthyl group are preferable.

As the preferred substituted aryl group, those having a monovalent non-metallic atomic group (other than a hydrogen atom) as a substituent on the ring-forming carbon atom of the foregoing aryl group are used. As examples of the preferred substituent, the foregoing alkyl groups and substituted alkyl groups, and those enumerated as the substituent in the foregoing substituted alkyl group can be enumerated.

Specific examples of such substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, a phenylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group, and a 3-butynylphenyl group.

As the alkenyl group, the same alkenyl groups described above in the foregoing introducible substituent can be enumerated. The substituted alkenyl group is one in which the hydrogen atom of the alkenyl group is substituted with a substituent. As the substituent, the substituent in the foregoing substituted alkyl group can be used. On the other hand, as the alkenyl group, the foregoing alkenyl group can be used. Examples of the preferred substituted alkenyl group include the following structures.

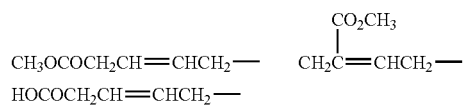
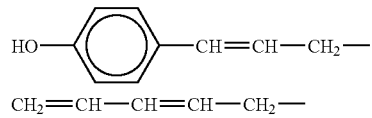
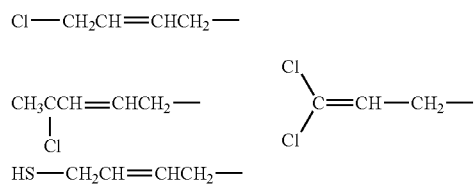

As the alkynyl group, the same alkynyl groups described above in the foregoing introducible substituent can be enumerated. The substituted alkynyl group is one in which the hydrogen atom of the alkynyl group is substituted with a substituent. As the substituent, the substituent in the foregoing substituted alkyl group can be used. On the other hand, as the alkynyl group, the foregoing alkynyl group can be used.

The heterocyclic group as referred to herein means a monovalent group resulting from elimination of one hydrogen on a hetero ring or a monovalent group (substituted heterocyclic group) resulting from further elimination of one hydrogen from the foregoing monovalent group and bonding of a substituent in the foregoing substituted alkyl group. Preferred examples of the hetero ring include the following structures.

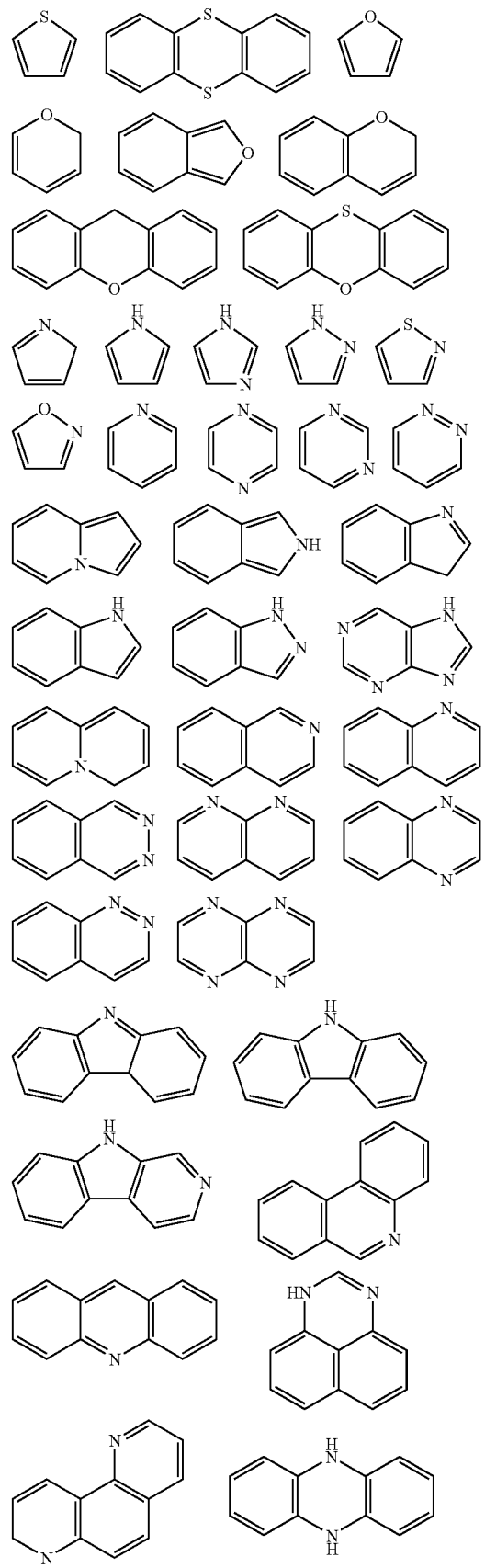

-continued

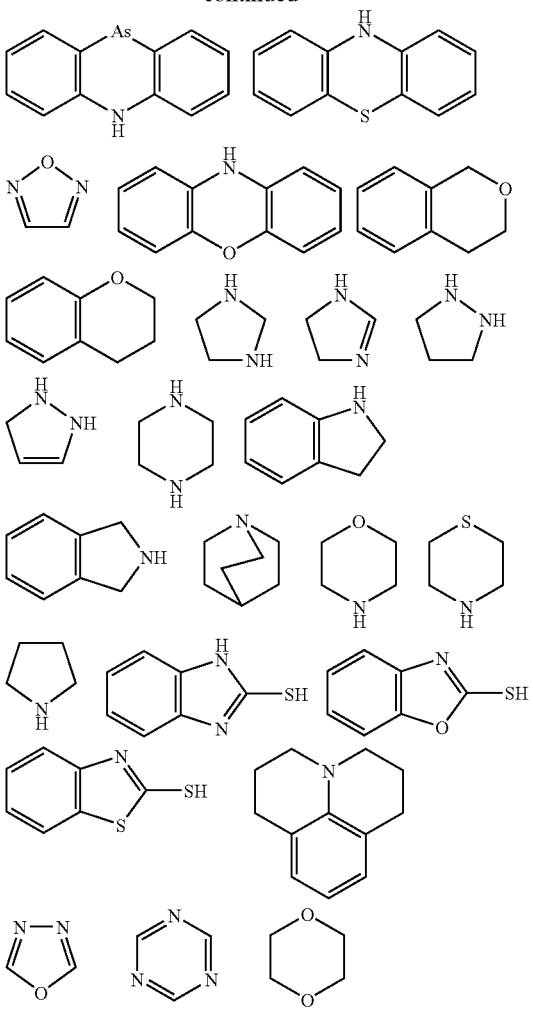

As the substituted oxy group ($R^5O$—), ones in which $R^5$ represents a monovalent non-metallic atomic group other than hydrogen can be used. Examples of the preferred substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonoxy group, and a phosphonatoxy group. In these, as the alkyl group and aryl group, those enumerated above for the alkyl group, substituted alkyl group, aryl group and substituted aryl group can be enumerated.

Also, as the acyl group ($R^6CO$—) in the acyloxy group, ones in which $R^6$ represents the foregoing alkyl group, substituted alkyl group, aryl group or substituted aryl group can be enumerated. Of these substituents, an alkoxy group, an aryloxy group, an acyloxy group, and an arylsulfoxy group are more preferable. Specific examples of the preferred substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxythoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonoxy group, and a phosphonatoxy group.

As the substituted thio group ($R^7S$—), ones in which $R^7$ represents a monovalent non-metallic atomic group other than hydrogen can be used. Examples of the preferred substituted thio group include an alkylthio group, an arylthio group, an alkyldithio group, an aryldithio group, and an acylthio group. In these, as the alkyl group and aryl group, those enumerated above for the alkyl group, substituted alkyl group, aryl group and substituted aryl group can be enumerated; and $R^6$ of the acyl group ($R^6CO$—) in the acylthio group is as defined above. Of these, an alkylthio group and an arylthio group are more preferable. Specific examples of the preferred substituted thio group include a methylthio group, an ethylthio group, a phenylthio group, an ethoxyethylthio group, a carboxyethylthio group, and a methoxycarbonylthio group.

As the substituted amino group ($R^8NH$— or ($R^9$) ($R^{10}$)N—), ones in which $R^3$, $R^9$ and $R^{10}$ each represents a monovalent non-metallic atomic group other than hydrogen can be used. Examples of the preferred substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, an ureido group, an N'-alkylureido group, an N'N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-di-alkyl-N-aryluredio group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, and an N-aryl-N-aryloxy-carbonylamino group.

In these, as the alkyl group and aryl group, those enumerated above for the alkyl group, substituted alkyl group, aryl group and substituted aryl group can be enumerated; and $R^6$ of the acyl group ($R^6CO$—) in the acylamino group, N-alkylacylamino group and N-arylacylamino group is as defined above. Of these, an N-alkylamino group, an N,N-dialkylamino group, an N-arylamino group, and an acylamino group are preferred. Specific examples of the preferred substituted amino group include a methylamino group, an ethylamino group, a diethylamino group, a morpholino group, a piperidino group, a pyrrolidino group, a phenylamino group, a benzoylamino group, and an acetylamino group.

As the substituted carbonyl group ($R^{11}$—CO—), ones in which $R^{11}$ represents a monovalent non-metallic atomic group can be used. Examples of the preferred substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, and an N-alkyl-N-arylcarbamoyl group. In these, as the alkyl group and aryl group, those enumerated above for the alkyl group, substituted alkyl group, aryl group and substituted aryl group can be enumerated. Of these, as the substituted carbonyl group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, and an N-arylcarbamoyl group are more preferable; and a formyl group, an acyl group, an alkoxycarbonyl group, and an aryloxycarbonyl group are further preferable. Specific examples of the preferred substituted carbonyl group include a formyl group, an acetyl group, a benzoyl group, a carboxyl group, a methoxycarbonyl group, an allyloxycarbonyl group, an N-methylcarbamoyl group, an N-phenylcarbamoyl group, an N,N-diethylcarbamoyl group, and a morpholinocarbonyl group.

As the substituted sulfinyl group ($R^{12}$—SO—), ones in which $R^{12}$ represents a monovalent non-metallic atomic group can be used. Preferred examples thereof include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group, and an N-alkyl-N-arylsulfinamoyl group. In these, as the alkyl group and aryl group, those enumerated above for the alkyl group, substituted alkyl group, aryl group and substituted aryl group can be enumerated. Of these, an alkylsulfinyl group and an arylsulfinyl group are more preferable. Specific examples of such a substituted sulfinyl group include a hexylsulfinyl group, a benzylsulfinyl group, and a tolylsulfinyl group.

As the substituted sulfonyl group ($R^{13}$—$SO_2$—), ones in which $R^{13}$ represents a monovalent non-metallic atomic group can be used. Preferred examples thereof include an alkylsulfonyl group and an arylsulfonyl group. In these, as the alkyl group and aryl group, those enumerated above for the alkyl group, substituted alkyl group, aryl group and substituted aryl group can be enumerated. Specific examples of such a substituted sulfonyl group include a butylsulfonyl group and a chlorophenylsulfonyl group.

As described previously, the sulfonato group (—$SO_3^-$) means a conjugated base anion group of a sulfo group (—$SO_3H$) and in general, is preferably used together with a counter cation. Examples of such a counter cation include those which are generally known, that is, various oniums (for example, ammoniums, sulfoniums, phosphoniums, iodoniums, and aziniums) and metal ions (for example, $Na^+$, $K^+$, $Ca^{2+}$, and $Zn^{2+}$).

As described previously, the carboxylato group (—$CO_2^-$) means a conjugated base anion group of a carboxyl group (—$CO_2H$) and in general, is preferably used together with a counter cation. Examples of such a counter cation include those which are generally known, that is, various oniums (for example, ammoniums, sulfoniums, phosphoniums, iodoniums, and aziniums) and metal ions (for example, $Na^+$, $K^+$, $Ca^{2+}$, and $Zn^{2+}$)

The "substituted phosphono group" as referred to herein means one in which one or two hydroxyl groups on a phosphono group are substituted with other organic oxo group. Preferred examples thereof include the foregoing dialkylphosphono group, diarylphosphono group, alkylarylphosphono group, monoalkylphosphono group and monoarylphosphono group. Of these, a dialkylphosphono group and a diarylphosphono group are more preferable. Specific examples of such a substituted phosphono group include a diethylphosphono group, a dibutylphosphono group, and a diphenylphosphono group.

As described previously, the phosphonato group (—$PO_3^{2-}$ or —$PO_3H^-$) means a conjugated base anion group resulting from acid primary dissociation or acid secondary dissociation of a phosphono group (—$PO_3H_2$) and in general, is preferably used together with a counter cation. Examples of such a counter cation include those which are generally known, that is, various oniums (for example, ammoniums, sulfoniums, phosphoniums, iodoniums, and aziniums) and metal ions (for example, $Na^+$, $K^+$, $Ca^{2+}$, and $Zn^{2+}$).

The "substituted phosphonato group" as referred to herein means a conjugated base anion group in which one hydroxyl group on the foregoing substituted phosphono group is substituted with an organic oxo group. Preferred examples thereof include conjugated bases of the foregoing monoalkylphosphono group (—$PO_3H$(alkyl)) or monoarylphosphono group (—$PO_3H$ (aryl)). In general, the substituted phosphonato group is preferably used together with a counter cation. Examples of such a counter cation include those which are generally known, that is, various oniums (for example, ammoniums, sulfoniums, phosphoniums, iodoniums, and aziniums) and metal ions (for example, $Na^+$, $K^+$, $Ca^{2+}$, and $Zn^{2+}$).

In the foregoing formula (VI), preferred specific examples with respect to each of the structures of A and W are ones in which A represents an aromatic ring-containing organic group, and W represents a polyoxyalkylene group-containing nonionic organic group.

Incidentally, for the sake of clarifying the structures of A and W, specific examples represented by A-H and W—H will be given below.

EXAMPLES OF A-H

-continued

⑦

  2.38

(8) Linear or branched $C_nH_{2n+2}$ (n: an integer of 4 or more), 2.09 (in the case of butane)

(9) Linear or branched $C_nH_{2n+2}$ (n: an integer of 4 or more)

(10) Linear or branched $C_nH_{2n+2}$ (n: an integer of 4 or more)

On each of the foregoing structures (1) to (10), the substituent on the hydrocarbon may be substituted against the hydrogen atom.

EXAMPLES OF W—H

①

HO—(CH$_2$CH$_2$O)$_n$—H   (n: an integer of 1 or more)

logP { −0.71 (n = 1), −1.37 (n = 5)
      −2.19 (n = 10), −3.02 (n = 15), −2.69 (n = 13) }

②

HO—(CHCH$_2$O)$_n$—H   (n: an integer of 1 or more)
         |
         CH$_3$       (−0.30 (n = 1), 0.70 (n = 5))  0.95 (n = 6)

③

HO—(CH$_2$CH$_2$O)$_n$——(CHCH$_2$O)$_m$—H
                              |
                              CH$_3$
(n: an integer of 1 or more, m: an integer of 1 or more)

④

HS—(CH$_2$CH$_2$O)$_n$—H   (n: an integer of 1 or more)

⑤

HO—(CH$_2$CH$_2$CH$_2$O)$_n$—H   (n: an integer of 1 or more)

⑥

HO—(CH$_2$CH$_2$NH)$_n$—H   (n: an integer of 1 or more)

⑦

H$_2$N—(CH$_2$CH$_2$NH)$_n$—H   (n: an integer of 1 or more)

⑧

α—(CH$_2$CH)$_n$—ω   (n: an integer of 1 or more)
       |
       OH

⑨

α—(CH$_2$CH)$_n$—ω   (n: an integer of 1 or more)
       |
       NH$_2$

⑩

α—(CH$_2$CH)$_n$—ω   (n: an integer of 1 or more)
       |
       C≡N

⑪

α—(CH$_2$CH)$_n$—ω   (n: an integer of 1 or more)
       |
       CONH$_2$

⑫

α—(CH$_2$CH)$_n$—ω   (n: an integer of 1 or more,
       |               α & ω: —OH, —H,
       CH$_2$OH                  —SH, or —NH$_2$)

⑬

α—(CH$_2$CH)$_n$—ω   (n: an integer of 1 or more)
       |
       CH$_2$NH$_2$

⑭

α—(CH$_2$CH)$_n$—ω   (n: an integer of 1 or more)
       |
       CO$_2$——OH

On each of the foregoing structures (1) to (14), the substituent on the hydrocarbon may be substituted against the hydrogen atom.

Also, specific examples (Y-1 to Y-22) of the nonionic compound represented by the foregoing formula (VI) will be given below.

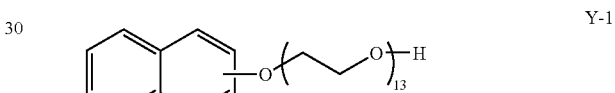  Y-1

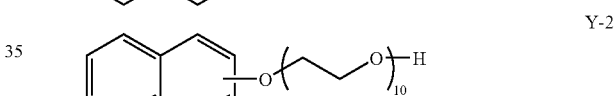  Y-2

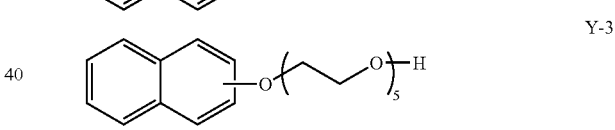  Y-3

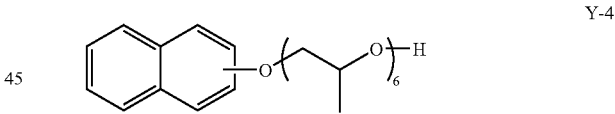  Y-4

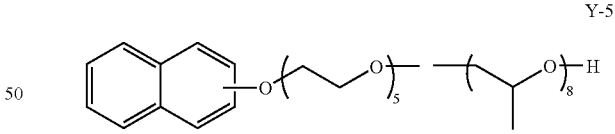  Y-5

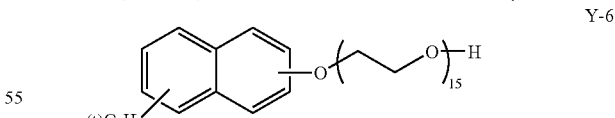  Y-6

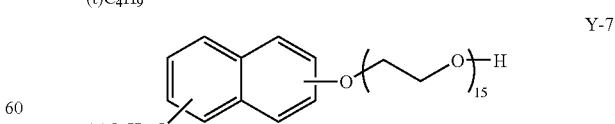  Y-7

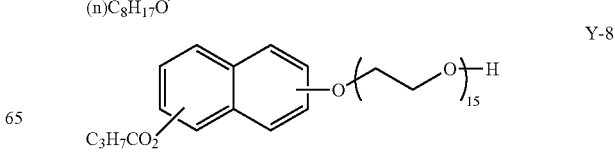  Y-8

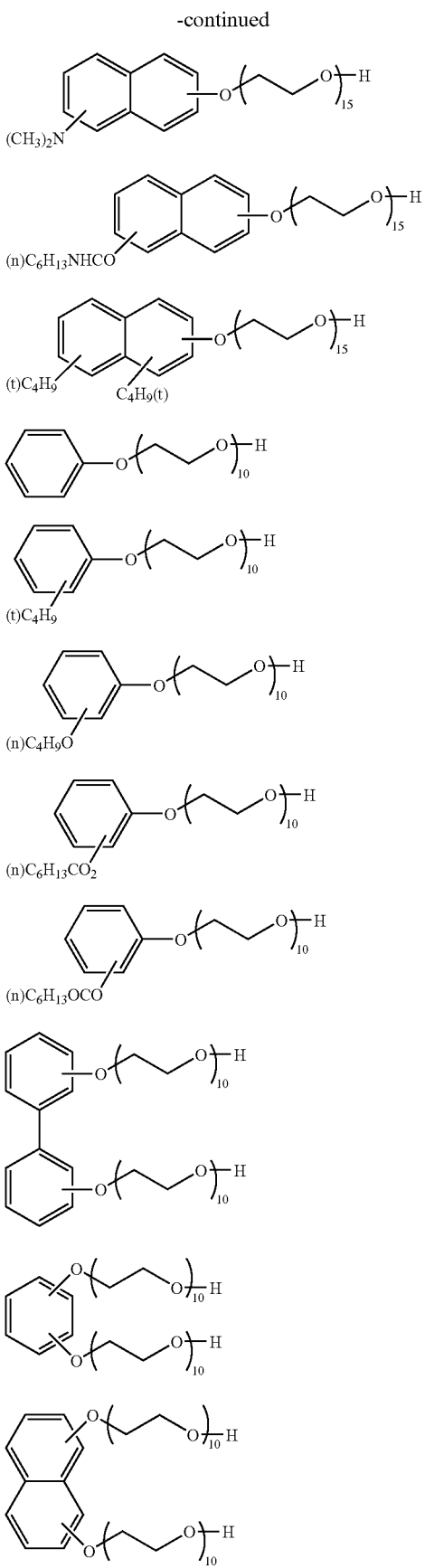

Among the nonionic compounds represented by the foregoing formula (VI), those represented by the following formula (I-A) or (I-B) are more preferable.

$$R^{10}\text{—}\underset{}{\boxed{\phantom{XX}}}\text{—O(CH}_2\text{CH}_2\text{O)}_n(\text{CH}_2\text{CH(CH}_3)\text{O)}_m\text{H} \quad (\text{I-A})$$

$$R^{20}\text{—}\underset{}{\boxed{\phantom{XX}}}\text{—O(CH}_2\text{CH}_2\text{O)}_n(\text{CH}_2\text{CH(CH}_3)\text{O)}_m\text{H} \quad (\text{I-B})$$

In the foregoing formulae, $R^{10}$ and $R^{20}$ each represents H or a hydrocarbon group having from 1 to 100 carbon atoms; and n and m each represents an integer of from 0 to 100 (provided that n and m are not 0 at the same time). Examples of the hydrocarbon group include an alkyl group, an aryl group, and an aralkyl group. Further, the hydrocarbon group includes ones in which these hydrocarbon groups are bonded through an ether binding, an ester binding or an amide binding.

$R^{10}$ and $R^{20}$ are each preferably H or a linear or branched alkyl group having from 1 to 100 carbon atoms. Also, $R^{10}$ and $R^{20}$ may each represent a group, $R^{30}$—X— (wherein $R^{30}$ represents a linear or branched alkyl group having from 1 to 100 carbon atoms; and X represents —O—, —OCO—, —COO—, —NHCO—, or —CONH—).

$R^{10}$ and $R^{20}$ are each more preferably a hydrogen atom, a linear or branched alkyl group having from 1 to 10 carbon atoms, or a group, $R^{30}$—X— (wherein $R^{30}$ represents a linear or branched alkyl group having from 1 to 10 carbon atoms; and X represents —O—, —OCO—, —COO—, —NHCO—, or —CONH—).

Examples of compounds represented by the formula (I-A) include polyoxyethylene phenyl ether, polyoxyethylene methylphenyl ether, polyoxyethylene octylphenyl ether, and polyoxyethylene nonylphenyl ether.

Examples of compounds represented by the formula (I-B) include polyoxyethylene naphthyl ether, polyoxyethylene methylnaphthyl ether, polyoxyethylene octylnaphthyl ether, and polyoxyethylene nonylnapthyl ether.

In the compounds represented by the foregoing formulae (I-A) and (I-B), the number of repeating units of the polyoxyethylene chain is preferably from 3 to 50, and more preferably from 5 to 30. The number of repeating units of the polyoxypropylene chain is preferably from 0 to 10, and more preferably from 0 to 5. The polyoxyethylene segment and the polyoxypropylene segment may be a random or block copolymer.

The nonionic aromatic ether based active agent represented by the foregoing formula (I-A) or (I-B) is used singly or in admixture of two or more thereof.

In the invention, it is effective to add the nonionic compound represented by the foregoing formula (VI) in an amount of from 0.1 to 15% by weight, and preferably from 1.0 to 8.0% by weight in the developing solution. When the addition amount is too low, a lowering of the developability and a lowering of the solubility of the photosensitive layer components occur. On the other hand, when it is too high, the printing resistance of a printing plate is reduced.

In the plate making process of the lithographic printing plate precursor according to the invention, the entire surface may be heated prior to or during exposure or during a period of from exposure to development, as the need arises. By such heating, the image formation reaction in the photosensitive layer is promoted, whereby there give rise to advantages such as enhancement in the sensitivity or printing resistance and stabilization of the sensitivity. Further, for the purpose of enhancing the image strength and printing resistance, it is also effective to undergo entire post heating or entire exposure against an image after the development. In general, it is preferable that heating before the development is carried out under a mild condition at not higher than 150° C. When the temperature is too high, problems such as occurrence of undesired curing reaction in a non-image area region may possibly occur. On the other hand, a very strong condition can be applied to heating after the development. In general, the heat processing is carried out at a temperature in the range of from 200 to 500° C. When the temperature is too low, a sufficient image-reinforcing action cannot be obtained. On the other hand, when it is too high, problems such as deterioration of the support and heat decomposition of the image area occur.

With respect to the exposure method of the lithographic printing plate precursor for scanning exposure according to the invention, known methods can be employed without limitations. The wavelength of the light source is desirably from 350 nm to 450 nm, and specifically, an InGaN based semiconductor laser is suitable. With respect to the exposure mechanism, any of an internal drum system, an external drum system, or a flatbed system is employable. Also, with respect to the photosensitive layer components of the invention, by using ones having high solubility in water, it is possible to make them soluble in neutral water or a weakly alkaline aqueous solution. A lithographic printing plate having such a constitution can be installed on a printing machine and then applied to a system of exposure-to-development on the machine.

As an available laser light source of from 350 to 450 nm, those described below can be applied.

Examples of gas lasers include an Ar ion laser (364 nm, 351 nm, 10 mW to 1 W), a Kr ion laser (356 nm, 351 nm, 10 mW to 1 W), and an He-Cd laser (441 nm, 325 nm, 1 mW to 100 mW); examples of solid lasers include a twice combination of Nd:YAG ($YVO_4$) and an SHG crystal (355 nm, 5 mW to 1 W) and a combination of Cr:LiSAF and an SHG crystal (430 nm, 10 mW); examples of semiconductor laser systems include a $KNbO_3$ ring resonator (430 nm, 30 mW), a combination of a waveguide type wavelength conversion element and an AlGaAs and InGaAs semiconductor (380 nm to 450 nm, 5 mW to 100 mW), a combination of a waveguide type wavelength conversion element and an AlGaInP and AlGaAs semiconductor (300 nm to 350 nm, 5 mW to 100 mW), an AlGaInN (350 nm to 450 nm, 5 mW to 30 mW) semiconductor laser; and examples of pulse lasers include an $N_2$ laser (337 nm, pulse: 0.1 to 10 mJ) and an XeF laser (351 nm, pulse: 10 to 250 mJ).

Of these, an AlGaInN semiconductor laser (commercially available InGaN based semiconductor layer: 400 to 410 nm, 5 to 30 mW) is suitable from the standpoints of wavelength characteristics and costs.

Also, with respect to lithographic printing plate exposure devices of the scanning exposure system, examples of the exposure mechanism include an internal drum system, an external drum system, and a flat bed system. As the light source, all of the foregoing light sources except for the pulse lasers can be applied. Actually, the following exposure devices are especially preferable in relation with the sensitivity of photosensitive material and the plate making time.

A single beam exposure device of the internal drum system using one gas laser or solid laser light source.

A multi-beam exposure device of the flat bed system using a plurality (ten or more) of semiconductor lasers.

A multi-beam exposure device of the external drum system using a plurality (ten or more) of semiconductor lasers.

In the foregoing lithographic printing plates of a laser direct imaging type, in general, the following equation (eq1) is set up among the sensitivity X ($J/Cm^2$) of photosensitive material, the exposure area S ($cm^2$) of photosensitive material, the power q (W) of one laser light source, the laser number n, and the total exposure time t (s).

$$X \cdot S = n \cdot q \cdot t \quad \text{(eq1)}$$

i) In the case of the internal drum (single beam) system, in general, the following equation (eq2) is setup among the laser rotation number f (radian/s), the sub-scanning length Lx (cm) of photosensitive material, the resolution Z (dot/cm), and the total exposure time t (s).

$$f \cdot Z \cdot t = Lx \quad \text{(eq2)}$$

ii) In the case of the external drum (multi-beam) system, in general, the following equation (eq3) is set up among the drum rotation number F(radian/s), the sub-scanning length Lx (cm) of photosensitive material, the resolution Z (dot/cm), the total exposure time t (s), and the beam number n.

$$F \cdot Z \cdot n \cdot t = Lx \quad \text{(eq3)}$$

iii) In the case of the flat bed (multi-beam) system, in general, the following equation (eq4) is set up among the rotation number H (radian/s) of polygonmirror, the sub-scanning length Lx (cm) of photosensitive material, the resolution Z (dot/cm), the total exposure time t (s), and the beam number n.

$$H \cdot Z \cdot n \cdot t = Lx \quad \text{(eq4)}$$

When the resolution (2,560 dpi) required in actual printing plates, the plate size (A1/B1, sub-scanning length: 421 inch), the exposure condition of about 20 sheets per hour, and the photosensitive characteristics (photosensitive wavelength, sensitivity: about 0.1 $mJ/cm^2$) of the photosensitive composition of the invention are substituted in the foregoing equations, it can be understood that in the photosensitive material of the invention, a combination with the multi-beam exposure system of semiconductor laser is more preferable. When the operability, costs and the like are further taken into consideration, a combination with the semiconductor laser multi-beam exposure device of the external drum system is the most preferable.

Also, as other exposure light sources against the photosensitive composition of the invention, a variety of mercury vapor lamps including ultrahigh pressure, high pressure, medium pressure, and low pressure mercury vapor lamps, chemical lamps, carbon arc lamps, xenon lamps, metal halides, various visible or ultraviolet laser lamps, fluorescent lamps, tungsten lamps, and sunlight can be employed.

The photosensitive composition according to the invention can be applied over a wide range of fields known as applications of photocurable resins without limitations, in addition to the photosensitive layer of the lithographic printing plate precursor for scanning exposure described previously in detail. For example, if desired, by applying to the liquid photosensitive composition to be used jointly with a cationic polymerizable compound, high-sensitivity photo shaping materials can be obtained. Also, by utilizing changes in refractive index with the photopolymerization, hologram materials can be formed. By utilizing changes in tackiness of the surface with the photopolymerization, the photosensitive composition according to the invention can be also applied to a variety of transfer materials (for example, peel-apart photosensitive materials and toner developing photosensitive materials). The photosensitive composition according to the invention can be also applied to photocuring of microcapsules. The photosensitive composition according to the invention can be also applied to the production of electronic materials such as photoresists and to photocurable resin materials such as inks, paints, and adhesives.

EXAMPLES

The invention will be described below with reference to the following Examples, but it should not be construed that the invention is limited thereto.

Synthesis Examples 1 to 4

Synthesis Example 1

Synthesis of Illustrative Compound D3

In 450 mL of methanol, 27 g of diphenylaminobenzaldehyde and 3.5 g of piperidine were dissolved, and the solution was stirred for one hour while refluxing. Next, 17 g of 3-ethyl-2-allylimino-oxazolidin-4-one was added, and the mixture was stirred for one hour while refluxing. After completion of the reaction, the reaction mixture was allowed to stand for cooling to room temperature, whereby a yellow crystal was deposited. The deposited crystal was filtered and added to 1,000 mL of methanol, and the mixture was stirred for one hour. The resulting crystal was filtered and dried to obtain 23 g of the following illustrative compound (D3) (yield: 55%). The compound was identified by means of $^1$H-NMR (solvent: CDCl$_3$), infrared absorption spectrum, mass analysis spectrum, and elemental analysis. Melting point: 67° C., electron absorption spectrum (THF): absorption maximum wavelength: 388 nm, absorption maximum molar absorption coefficient: 29,400. Oxidation potential (CH$_3$CN, vs Ag/AgCl): +0.89 V. A chart of $^1$H-NMR is shown in FIG. 1.

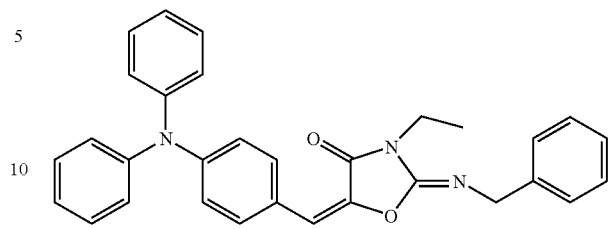

(D3)

Synthesis Example 2

Synthesis of Illustrative Compound D3

In 500 mL of methanol, 35 g of diphenylaminobenzaldehyde and 2.0 g of piperidine were dissolved, and the solution was stirred for one hour while refluxing. Next, 20 g of 3-ethyl-2-thioxo-4-oxazolinedione was added thereto, and the mixture was stirred for 4 hours while refluxing. After completion of the reaction, the reaction mixture was allowed to stand for cooling to room temperature, whereby a yellow crystal was deposited. The deposited crystal was filtered and added to 1,000 mL of methanol, and the mixture was stirred for one hour. The resulting crystal was filtered and dried to obtain 48 g of the following compound (D3') as a dye precursor (yield: 91%). The compound was identified by means of $^1$H-NMR.

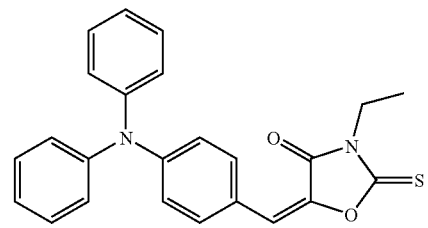

(D3')

Next, 1.7 g of silver nitrate was dissolved in 20 ml of acetonitrile, to which was then added 2.0 g of the foregoing compound (D3') as a dye precursor, and the mixture was stirred at room temperature for 0.5 hours. Next, 1.0 g of benzylamine was dropped, and the mixture was stirred for 1.5 hours. Thereafter, 1.0 g of triethylamine was dropped, and the mixture was further stirred for 1.5 hours. After completion of the reaction, 30 mL of acetone was added to the reaction mixture, and a deposited silver salt was filtered out using Celite. The filtrate was thrown into 150 mL of water. A deposited crystal was collected by filtration and formed into a slurry in methanol, thereby obtaining 1.9 g of the illustrative compound (D3) the same as in Example 1 (yield: 88%). The compound was identified by means of $^1$H-NMR.

Synthesis Example 3

Synthesis of Illustrative Compound D26

Figure 2:
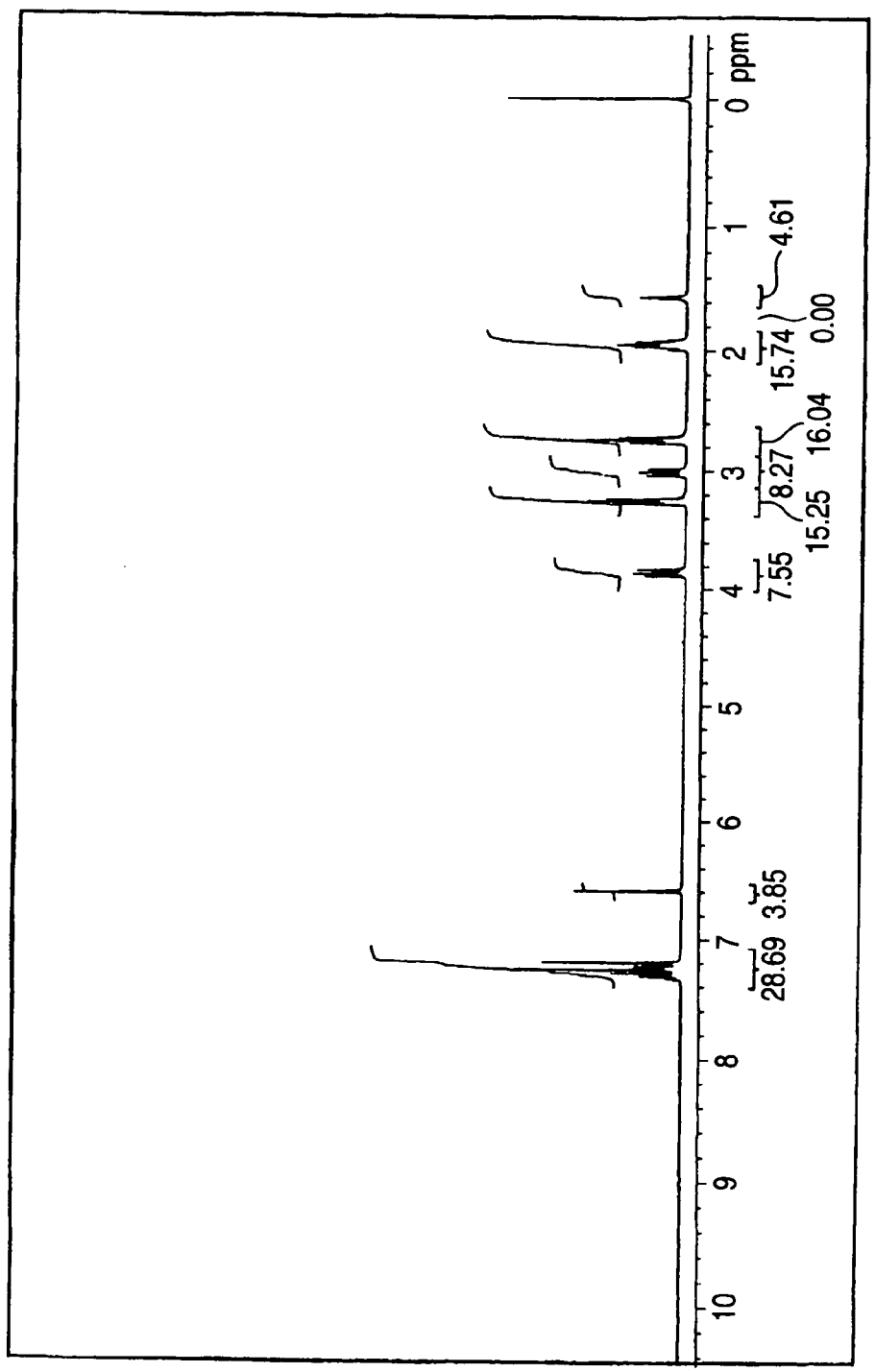
[FIG. 2]
An $^1$H-NMR chart of Illustrative Compound D29 that is a sensitizing dye having an iminooxazolidinone structure represented by the formula (1) according to the invention.

In 400 mL of methanol, 20 g of 2,3,6,7-tetrahydro-1H, 5H-pyrido-[3,2,1-η]-quinoline-9-carboaldehyde and 3.5 g of pyrrolidine were dissolved, and the solution was stirred for 1.5 hours while refluxing. Next, 21 g of 3-phenylethyl-1,3-ozazolidine-2,4-dione was added, and the mixture was stirred for 4 hours while refluxing. After completion of the reaction, the reaction mixture was allowed to stand for cooling to room temperature, whereby a yellow crystal was deposited. The deposited crystal was filtered and added to 800 mL of methanol, and the mixture was stirred for one hour. The resulting crystal was filtered and dried to obtain 33 g of the following illustrative compound (D26) (yield: 85%). The compound was identified by means of $^1$H-NMR (solvent: CDCl$_3$), infrared absorption spectrum, mass analysis spectrum, and elemental analysis. Melting point: 162° C., electron absorption spectrum (THF): absorption maximum wavelength: 412 nm, absorption maximum molar absorption coefficient: 35,500. Oxidation potential (CH$_3$CN, vs Ag/AgCl): +0.64 V. A chart of $^1$H-NMR is shown in FIG. 2.

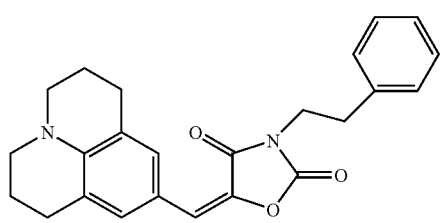

(D26)

Synthesis Example 4

Synthesis of Illustrative Compound D31

The same procedures as in Synthesis Example 2 were followed to synthesize the same compound (D3').

Figure 3:
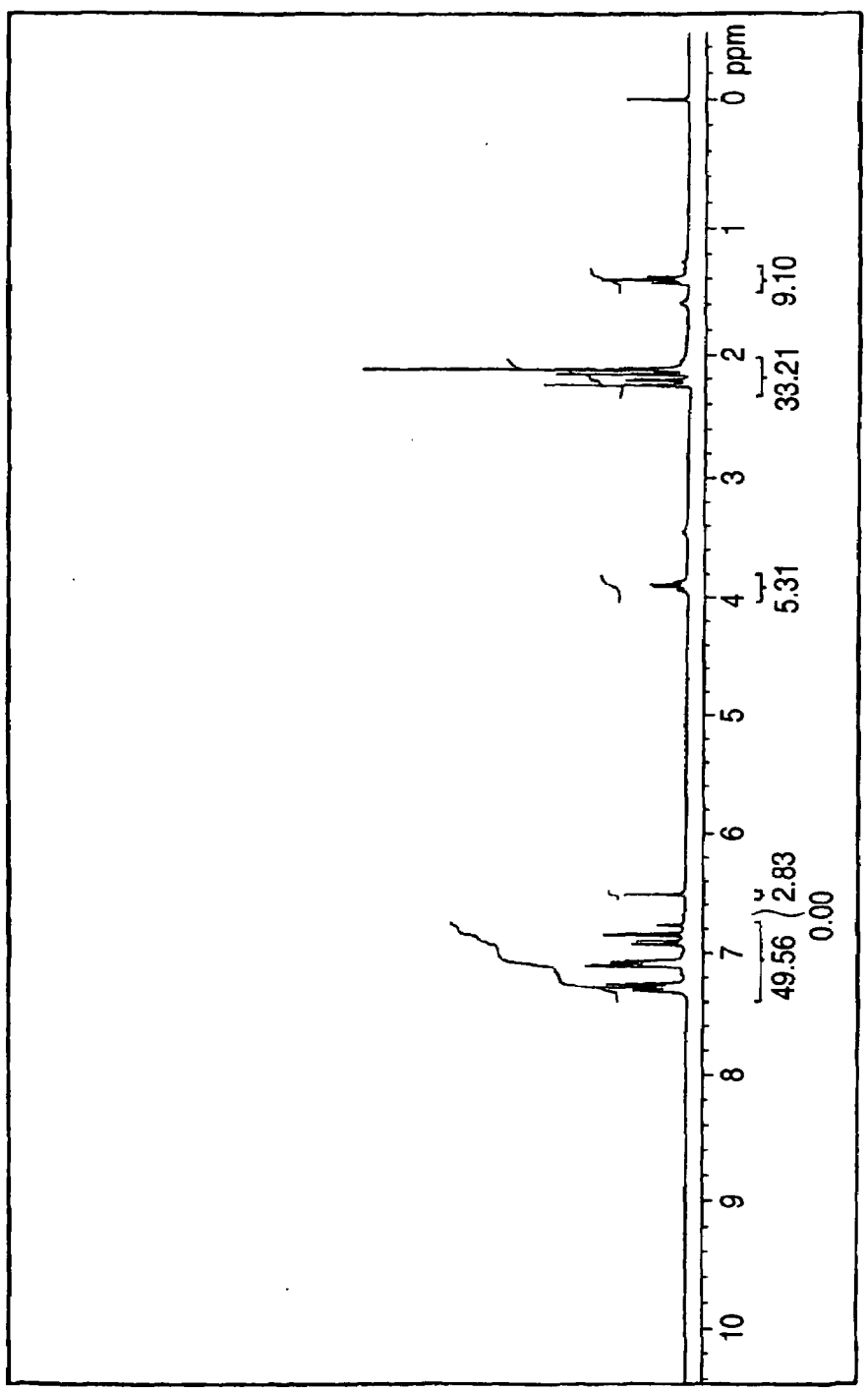
[FIG. 3]

Next, 2.8 g of silver nitrate was dissolved in 40 mL of acetonitrile, to which was then added 3.0 g of the foregoing compound (D3') as a dye precursor, and the mixture was stirred for 0.5 hours. Next, 5 g of 2,4,6-trimethylaniline was added, and the mixture was stirred for 1.5 hours. Thereafter, 1.0 g of triethylamine was dropped, and the mixture was further stirred at 70° C. for one hour. After completion of the reaction, 60 mL of acetone was added to the reaction mixture, and a deposited silver salt was filtered out using Celite. The filtrate was thrown into 300 mL of water. A deposited crystal was collected by filtration and formed into a slurry in methanol, thereby obtaining 3.5 g of the following compound (D31) (yield: 92%). The compound was identified by means of $^1$H-NMR (solvent: CDCl$_3$), infrared absorption spectrum, mass analysis spectrum, and elemental analysis. Melting point: 117° C., electron absorption spectrum (THF): absorption maximum wavelength: 395 nm, absorption maximum molar absorption coefficient: 30,900. Oxidation potential (CH$_3$CN, vs Ag/AgCl): +0.82 V. A chart of $^1$H-NMR is shown in FIG. 3.

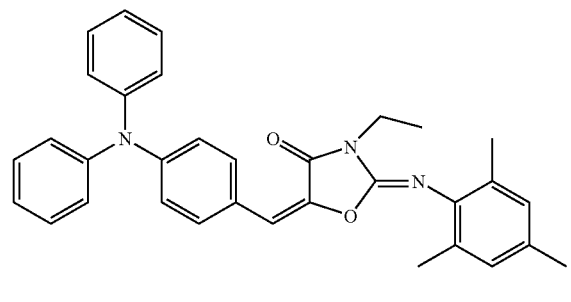

(D31)

Examples 1 to 16 and Comparative Examples 1 to 7

(Preparation of Support)

An aluminum plate having a thickness of 0.3 mm was etched by dipping in 10% by weight sodium hydroxide at 60° C. for 25 seconds, washed with running water, neutralized and rinsed with 20% by weight nitric acid, and then washed with water. The resulting aluminum plate was subjected to electrolytic roughing processing in a 1% by weight nitric acid aqueous solution at a quantity of electricity at anode of 300 coulomb/dm$^2$ using a sinewave alternating waveform current. Subsequently, the resulting aluminum plate was dipped in a 1% by weight sodium hydroxide aqueous solution at 40° C. for 5 seconds and then subjected to desmatting processing at 60° C. for 40 seconds by dipping in a 30% by weight sulfuric acid aqueous solution. Thereafter, the aluminum plate was subjected to anodic oxidation processing in a 20% by weight sulfuric acid aqueous solution at a current density of 2 A/dm$^2$ for 2 minutes such that the thickness of the anodically oxidized film was 2.7 g/m$^2$. The surface roughness was measured and found to be 0.3 μm (in terms of Ra according to JIS B0601).

On the back surface of the thus processed substrate, the following sol-gel reaction solution was coated using a bar coater and dried at 100° C. for one minute. There was thus prepared a support provided with a backcoat layer having a coating amount after drying of 70 mg/m$^2$.

(Sol-gel Reaction Solution)

| | |
|---|---|
| Tetraethyl silicate: | 50 parts by weight |
| Water: | 20 parts by weight |
| Methanol: | 15 parts by weight |
| Phosphoric acid: | 0.05 parts by weight |

The foregoing components were mixed and stirred. About five minutes thereafter, heat generation started. After reacting for 60 minutes, the following liquid was added to prepare a coating solution for backcoat.

| | |
|---|---|
| Pyrrogallol formaldehyde condensation resin (molecular weight: 2,000): | 4 parts by weight |
| Dimethyl phthalate: | 5 parts by weight |
| Fluorine based surfactant (N-Butyl-perfluorooctane/sulfonamidoethyl acrylate/polyoxyethylene acrylate copolymer, molecular weight: 20,000): | 0.7 parts by weight |

-continued

| | |
|---|---|
| Methanol silica gel (manufactured by Nissan Chemical Industries, Ltd., methanol: 30% by weight): | 50 parts by weight |
| Methanol: | 800 parts by weight |

(Preparation of Photosensitive Layer)

On the thus processed aluminum support, a photosensitive composition having the following formulation was coated such that the coating amount after drying was from 1.0 to 2.0 g/m², and then dried at 80° C. for 2 minutes to form a photosensitive layer.

(Photosensitive Composition)

| | |
|---|---|
| Pentaerythritol tetraacrylate: | 1.5 g |
| Allyl methacrylate/methacrylic acid/N-isopropylamide copolymer (copolymerization molar ratio: 70/12/18): | 2.0 g |
| Photopolymerization initiation system (the compounds used are shown in Table 1 along with contents thereof): | |
| Sensitizing dye: | X g |
| Active agent: | Y g |
| Cosensitizer: | Z g |
| Fluorine based nonionic surfactant (Megaface F-177P, manufactured by Dainippon Ink and Chemicals, Incorporated): | 0.03 g |
| Heat polymerization inhibitor (N-Nitrosophenylhydroxylamine aluminum salt): | 0.01 g |
| Pigment dispersion: | 2.0 g |
| (Formulation of pigment dispersion) | |
| Pigment Blue 15:6: | 15 parts by weight |
| Allyl methacrylate/methacrylic acid copolymer (copolymerization molar ratio: 83/17): | 10 parts by weight |
| Cyclohexanone: | 15 parts by weight |
| Methoxypropyl acetate: | 20 parts by weight |
| Propylene glycol monomethyl ether: | 40 parts by weight |
| Methyl ethyl ketone: | 20 g |
| Propylene glycol monomethyl ether: | 20 g |

(Preparation of Protective Layer)

On the photosensitive layer, a 3% by weight aqueous solution of polyvinyl alcohol (degree of hydrolysis: 98% by mole, degree of polymerization: 550) was coated such that the coating weight after drying was 2 g/m² and dried at 100° C. for 2 minutes to form a protective layer. There was thus obtained a lithographic printing plate precursor.

Fuji Step Guide, manufactured by Fuji Photo Film Co., Ltd. (a gray scale in which the transmitted optical density discontinuously changes with ΔD of 0.15) was placed closely on the thus obtained lithographic printing plate precursor and exposed through an optical filter from a xenon lamp so as to have known exposure energy.

Thereafter, the resulting lithographic printing plate precursor was developed by dipping in a developing solution having the following formulation at 25° C. for 10 seconds. The maximum stage number at which an image was completely removed was read, and its exposure energy amount was determined, thereby calculating the sensitivity (unit: mJ/cm²). Evaluation is made in such a manner that the smaller the energy amount, the higher the sensitivity is. For the purpose of estimating exposure adaptability to a short wave semiconductor laser, exposure was carried out with monochromic light of 400 nm using Kenko BP-40 as an optical filter. The results obtained are shown in Table 1.

(Developing Solution)

Aqueous Solution of pH 12.0 having the following Formulation:

| | |
|---|---|
| Potassium hydroxie: | 0.2 g |
| 1K potassium silicate (SiO₂/K₂O = 1.9): | 2.4 g |
| Compound described below: | 5.0 g |
| Tetrasodium ethylenediaminetetraacetate: | 0.1 g |
| Water: | 91.3 g |

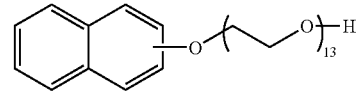

TABLE 1

| | Initiation system | | | Coating amount | Clear sensitivity |
|---|---|---|---|---|---|
| | Sensitizing dye (X g) | Initiator (Y g) | Consensitizer (Z g) | (mg/m²) | (mJ/cm²) |
| Example 1 | D1 (0.07) | A-1 (0.10) | C-1 (0.2) | 1.5 | 0.20 |
| Example 2 | D1 (0.07) | A-2 (0.12) | C-2 (0.2) | 1.5 | 0.25 |
| Example 3 | D1 (0.07) | A-3 (0.08) | Nil | 1.5 | 0.30 |
| Example 4 | D1 (0.07) | A-4 (0.08) | C-3 (0.2) | 1.5 | 0.25 |
| Example 5 | D1 (0.07) | A-5 (0.10) | C-1 (0.5) | 1.2 | 0.25 |
| Example 6 | D11 (0.07) | A-1 (0.12) | Nil | 1.2 | 0.15 |
| Example 7 | D3 (0.07) | A-1 (0.12) | C-2 (0.2) | 1.5 | 0.15 |
| Example 8 | D26 (0.07) | A-2 (0.10) | Nil | 1.5 | 0.20 |
| Example 9 | D16 (0.07) | A-1 (0.08) | Nil | 2.0 | 0.20 |
| Example 10 | D12 (0.07) | A-1 (0.12) | C-1 (0.2) | 1.5 | 0.25 |
| Example 11 | D39 (0.07) | A-2 (0.12) | Nil | 2.0 | 0.30 |
| Example 12 | D25 (0.07) | A-1 (0.12) | Nil | 2.0 | 0.30 |
| Example 13 | D45 (0.08) | A-10 (0.15) | Nil | 1.4 | 0.10 |
| Example 14 | D53 (0.08) | A-10 (0.12) | C-2 (0.20) | 1.4 | 0.10 |

TABLE 1-continued

| | Initiation system | | | Coating amount | Clear sensitivity |
|---|---|---|---|---|---|
| | Sensitizing dye (X g) | Initiator (Y g) | Consensitizer (Z g) | (mg/m$^2$) | (mJ/cm$^2$) |
| Example 15 | D57 (0.08) | A-10 (0.10) | Nil | 1.3 | 0.13 |
| Example 16 | D48 (0.08) | A-10 (0.15) | C-3 (0.20) | 1.4 | 0.15 |
| Comparative Example 1 | D1 (0.07) | Nil | Ni; | 1.2 | An image was not formed. |
| Comparative Example 2 | Nil | A-1 (0.08) | Nil | 1.5 | An image was not formed. |
| Comparative Example 3 | Nil | A-2 (0.10) | C-2 (0.5) | 1.5 | An image was not formed. |
| Comparative Example 4 | DR-1 (0.07) | A-1 (0.08) | C-2 (0.5) | 1.5 | 1.20 |
| Comparative Example 5 | DR-2 (0.07) | A-1 (0.12) | Nil | 1.5 | 2.00 |
| Comparative Example 6 | DR-3 (0.07) | A-1 (0.10) | Nil | 1.5 | 2.00 |
| Comparative Example 7 | DR-3 (0.12) | A-10 (0.15) | Nil | 1.5 | 1.20 |

Incidentally, in Table 1, the structures of the sensitizing dyes according to the invention used in the photopolymerization initiation system are the same in the foregoing illustrative compounds. Also, the structures of the initiator compounds (A-1) to (A-10) and cosensitizers (C-1) to (C-3) are shown below. The following Sensitizing Dyes (DR-1) to (DR-3) used in the Comparative Examples are a dye compound falling outside the scope of the invention. In the following formulae, the term "Ts" represents a tosyl group.

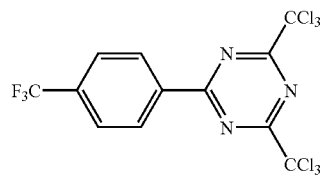
(A-1)

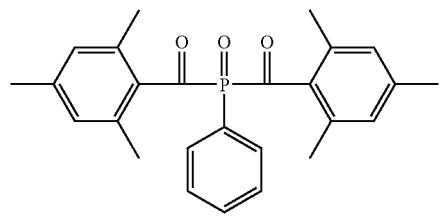
(A-2)

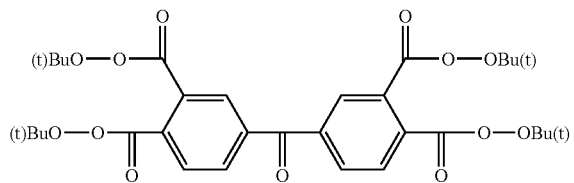
(A-3)

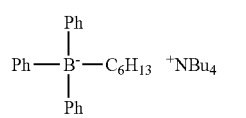
(A-4)

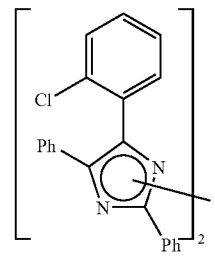
(A-5)

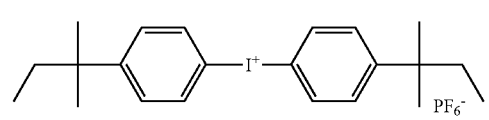
(A-6)

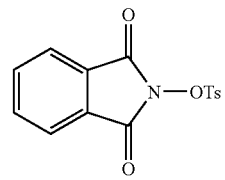
(A-7)

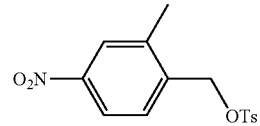
(A-8)

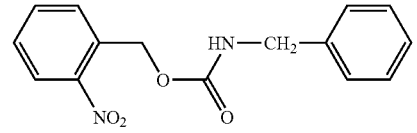
(A-9)

-continued

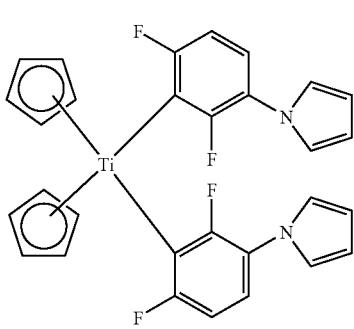
(A-10)

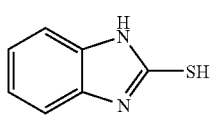
(C-1)

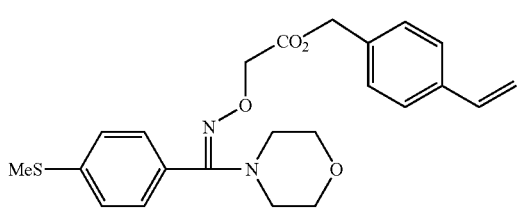
(C-2)

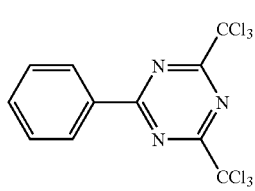
(C-3)

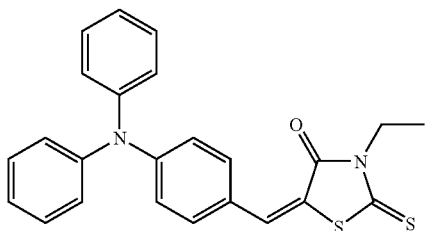
(DR-1)

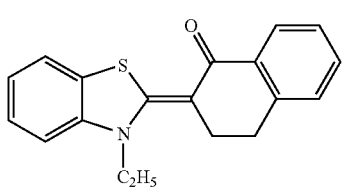
(DR-2)

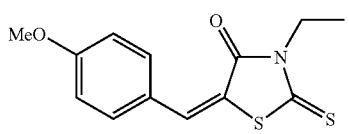
(DR-3)

As is clear from Table 1, it was noted that all of the lithographic printing plate precursors using the photopolymerizable composition of the invention in the photosensitive layer can form an image at a high sensitivity and exhibit a sufficient sensitivity for practical use in the subject photoinitiation system. On the other hand, it was noted that in Comparative Examples 1 to 3 using only an initiator compound, an image is formed and that in the lithographic printing plate precursors of Comparative Examples 4 to 7 using a photoinitiation system comprising a combination of an initiator compound with a known sensitizing dye falling outside the scope of the invention, a sufficient sensitivity for practical use is not obtained. It is noted from Examples 1 to 16 that the photosensitive composition of the invention can be applied over a wide range irrespective of the sensitization mechanism. Further, it is suggested from the comparison of Example 1 with Comparative Examples 4 to 7 that a characteristic feature in structure that the sensitizing dye of the invention exhibits a high sensitivity resides in the iminooxazolidinone structure represented by the foregoing formula (1).

Examples 17 to 29 and Comparative Example 8

On the support used in Examples 1 to 13, the following interlayer, photosensitive layer and protective layer were successively formed, to prepare a lithographic printing plate precursor.

(Coating of Interlayer)

On the surface of the support, a coating solution (A) having the following formulation was prepared such that the coating amount of phenylphosphonic acid was 20 mg/m$^2$ and coated under a condition at 180 rpm using a wheeler, followed by drying at 80° C. for 30 seconds to form an interlayer.

(Coating Solution A for Interlayer)
Phenylphosphonic acid: from 0.07 g to 1.4 g
Methanol: 200 g (Coating of Photosensitive Layer)

On the support having an interlayer provided thereon, a photosensitive composition having the following formulation was prepared such that the coating amount was from 1.0 to 2.0 g/m$^2$ and coated using a wheeler, followed by drying at 100° C. for one minute to form a photosensitive layer.

(Photosensitive Composition)

| | |
|---|---|
| Addition polymerizable compound (compound shown in Table 2): | 1.6 g |
| Binder polymer (compound shown in Table 2): | 2.0 g |
| Sensitizing dye (compound shown in Table 2): | 0.15 g |
| Initiator compound (compound shown in Table 2): | 0.2 g |
| Cosensitizer (compound shown in Table 2): | 0.3 g |
| Coloring pigment dispersion: | 2.0 g |
| (Formulation of pigment dispersion) | |
| Pigment Blue 15:6: | 15 parts by weight |
| Allyl methacrylate/methacrylic acid copolymer (copolymerization molar ratio: 83/17): | 10 parts by weight |
| Cyclohexanone: | 15 parts by weight |
| Methoxypropyl acetate: | 20 parts by weight |
| Propylene glycol monomethyl ether: | 40 parts by weight |
| Heat polymerization inhibitor (N-Nitrosophenylhydroxylamine aluminum salt): | 0.01 g |
| Fluorine based surfactant (Megaface F-177, manufactured by Dainippon Ink and Chemicals, Incorporated): | 0.02 g |
| Methyl ethyl ketone: | 20.0 g |
| Propylene glycol monomethyl ether: | 20.0 g |

(Preparation of Protective Layer)

On the photosensitive layer, a 3% by weight aqueous solution of polyvinyl alcohol (degree of hydrolysis: 98% by mole, degree of polymerization: 550) was coated such that the coating weight after drying was 2 g/m² and dried at 100° C. for 2 minutes to form a protective layer. There was thus obtained a lithographic printing plate precursor.

(Exposure of Lithographic Printing Plate Precursor)

The thus obtained lithographic printing plate precursor was subjected to solid image exposure and dot image exposure of 175 lines/inch changing from 1% to 99% at an interval of 1% using monochromic light of 400 nm as a light source while adjusting the exposure power such that the plate surface energy density was 200 µJ/cm².

(Development and Plate Making)

An automatic processor, LP-850, manufactured by Fuji Photo Film Co., Ltd. was charged with a prescribed developing solution (shown in Table 2) and a finisher, FP-2W, manufactured by Fuji Photo Film Co., Ltd., and the exposed plate was subjected to development and plate making under a condition at a temperature of developing solution of 30° C. for a development time of 18 seconds, to obtain a lithographic printing plate.

(Printing Resistance Test)

The lithographic printing plate was printed using an ink of GEOS-G(N), manufactured by Dainippon Ink and Chemicals, Incorporated by a Roland's R201 printing machine. Printed matters of the solid image area were observed, and printing resistance was examined in terms of the number of sheets at which the image started to become faint. Evaluation is made such that the larger the number of sheets, the more excellent the printing resistance is.

(Forced Dot Printing Resistance Test)

The lithographic printing plate was printed using an ink of GEOS-G(N), manufactured by Dainippon Ink and Chemicals, Incorporated by a Roland's R201 printing machine. At the 5,000-th sheet after start of printing, the dotted area was wiped by a printing sponge immersed with a PS plate cleaner, CL-2, manufactured by Fuji Photo Film Co., Ltd., and the ink on the plate surface was rinsed. Thereafter, printing of 10,000 sheets was carried out, and the presence or absence of dot failure on the printed matter was visually observed.

(Staining Property Test)

The lithographic printing plate was printed using an ink of GEOS-G(S), manufactured by Dainippon Ink and Chemicals, Incorporated by a Roland's R201 printing machine. The resulting printed matter was observed, thereby visually evaluating the state of stains in a non-image area (unexposed area).

(Addition Polymerizable Compound in Table 2)

(M-1): Pentaerythritol tetraacrylate (NK Ester A-TMMT, manufactured by Shin-Nakamura Chemical Co., Ltd.)

(M-2): Glycerin dimethacrylate hexamethylene diisocyanate urethane prepolymer (US101H, manufactured by Kyoeisha Chemical Co., Ltd.)

(Binder Polymer in Table 2)

(B-1): Allyl methacrylate/methacrylic acid/N-isopropyl acrylamide (copolymerization molar ratio: 67/13/20)

Found acid value determined by titration with NaOH: 1.15 meq/g

Weight average molecular weight by GPC measurement: 130,000

(B-2): Allyl methacrylate/methacrylic acid copolymer (co-polymerization molar ratio: 83/17)

Found acid value determined by titration with NaOH: 1.55 meq/g

Weight average molecular weight by GPC measurement: 125,000

(B-3): Polyurethane resin as a condensation polymer of the following diisocyanates and diol 4,4'-Diphenylmethane diisocyanate (MDI)

Hexamethylene diisocyanate (HMDI)

Polypropylene glycol, weight average molecular weight: 1,000 (PPG1000)

2,2-Bis(hydroxymethyl)propionic acid (DMPA) [Copolymerization molar ratio (MDI/HMDI/PGC1000/DMPA): 40/10/15/351]

Found acid value determined by titration with NaOH: 1.05 meq/g

Weight average molecular weight by GPC measurement: 45,000

(Developing Solution in Table 2)

(DV-1)

Aqueous solution of pH 10 having the following formulation:

Monoethanolamine: 0.1 parts by weight
Triethanolamine: 1.5 parts by weight
Compound of the following formula 1: 4.0 parts by weight
Compound of the following formula 2: 2.5 parts by weight
Compound of the following formula 3: 0.2 parts by weight
Water: 91.7 parts by weight (DV-2)

Aqueous solution of pH 10 having the following formulation:

Sodium hydrogencarbonate: 1.2 parts by weight
Sodium carbonate: 0.8 parts by weight
Compound of the following formula 1: 3.0 parts by weight
Compound of the following formula 2: 2.0 parts by weight
Compound of the following formula 3: 0.2 parts by weight
Water: 92.8 parts by weight (DV-3)

Aqueous solution of pH 13 having the following formulation:

1K potassium silicate: 3.0 parts by weight
Potassium hydroxide: 1.5 parts by weight
Compound of the following formula 3: 0.2 parts by weight
Water: 95.3 parts by weight (DV-4)

The foregoing developing solution used in Examples 1 to 13

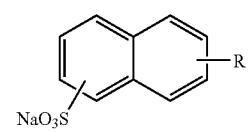

(1)

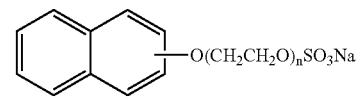

(2)

-continued

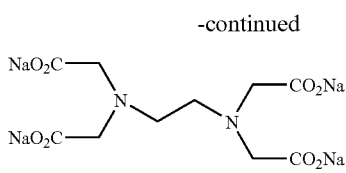
(3)

In the formulae, R represents H or $C_4H_9$; and n is about 4 (mean value).

400 nm under such conditions that the exposure energy density was 0.25 mJ/cm². Next, theplate was heated at 100° C. for 10 seconds and subjected to development processing under the same conditions as in Example 1. As a result, a lithographic printing plate having excellent visibility and having a blue image was obtained.

(Evaluation of Lithographic Printing Plate)

Using the thus obtained lithographic printing plate, offset printing was carried out using a Heidelberg's KOR-D machine. As a result, more than 50,000 sheets having

TABLE 2

| | Photosensitive layer | | | | | Formulation of developing solution | Printing performance | | |
|---|---|---|---|---|---|---|---|---|---|
| | Addition polymerizable compound | Binder polymer | Sensitizing dye | Initiator | Cosensitizer | Coating amount (mg/m²) | | Printing resistance in image area (sheets) | Printing resistance in dotted area | Staining property in non-image area |
| Example 17 | M-1 | B-1 | D24 | A-1 | C-2 | 1.5 | DV-4 | 90,000 | Good | Good |
| Example 18 | M-1 | B-2 | D18 | A-5 | C-1 | 1.5 | DV-2 | 70,000 | Good | Good |
| Example 19 | M-2 | B-1 | D17 | A-2 | C-2 | 1.7 | DV-1 | 45,000 | Good | Good |
| Example 20 | M-2 | B-3 | D41 | A-1 | C-2 | 1.8 | DV-4 | 125,000 | Good | Good |
| Example 21 | M-1 | B-1 | D26 | A-4 | C-3 | 1.6 | DV-4 | 95,000 | Good | Good |
| Example 22 | M-2 | B-3 | D31 | A-1 | C-2 | 1.4 | DV-4 | 100,000 | Good | Good |
| Example 23 | M-2 | B-3 | D22 | A-1 | C-2 | 1.4 | DV-3 | 95,000 | Good | Good |
| Example 24 | M-1 | B-1 | D10 | A-2 | C-2 | 1.5 | DV-4 | 60,000 | Good | Good |
| Example 25 | M-1 | B-2 | D35 | A-5 | C-1 | 2.0 | DV-4 | 85,000 | Good | Good |
| Example 26 | M-1 | B-1 | D53 | A-10 | C-2 | 1.4 | DV-4 | 85,000 | Good | Good |
| Example 27 | M-2 | B-2 | D55 | A-1 | C-1 | 1.5 | DV-4 | 88,000 | Good | Good |
| Example 28 | M-2 | B-3 | D57 | A-3 | C-2 | 1.7 | DV-4 | 85,000 | Good | Good |
| Example 29 | M-1 | B-1 | D54 | A-10 | C-2 | 1.4 | DV-4 | 85,000 | Good | Good |
| Comparative Example 8 | M-2 | B-3 | Nil | A-1 | C-2 | 1.4 | DV-3 | The image was carried away. | The image was carried away. | Good |

As is clear from Table 2, it was noted that all of the lithographic printing plate precursors of Examples 17 to 29 using the photosensitive composition of the invention in the photosensitive layer can provide an excellent lithographic printing plate under conditions under which plate making can be carried out with high productivity by means of scanning exposure, i.e., under exposure conditions of very low energy. On the other hand, in the lithographic printing plate precursor of Comparative Example 8 not using the sensitizing dye according to the invention, a practically useful lithographic printing plate was not obtained.

Examples 30

A lithographic printing plate precursor of Example 30 was prepared in the same manner as in Example 1, except that in the photosensitive composition to be used in the photosensitive layer, the photoinitiation system was changed to one having the following formulation and that the film thickness of the photosensitive layer was changed to 1.5 g/m².

| Sensitizing dye (Illustrative Compound D35): | 0.1 g |
|---|---|
| Initiator compound (A-1): | 0.08 g |
| Cosensitizer (C-2) | 0.2 g |

(Exposure and Development)

The resulting lithographic printing plate precursor was subjected to scanning exposure using monochromic light of excellent image density and having excellent image quality without causing staining in a non-image area could be obtained.

Example 31

The lithographic printing plate precursor obtained in Example 30 was exposed under a yellow lamp for one hour prior to development and then subjected to plate making and printing in a manner exactly the same as in Example 30. Good results exactly the same as in Example 30 were obtained.

Example 32

The lithographic printing plate precursor having been exposed under a yellow lamp for one hour in Example 31 was stored under forced storage conditions at a humidity of 65% and at 45° C. for 3 hours and then subjected to plate making and printing in a manner exactly the same as in Example 30. Good results exactly the same as in Example 30 were obtained.

Example 23

A photosensitive layer using a photosensitive composition having the following formulation was coated on a PET film such that the coating amount was 1.5 g/m².

(Photosensitive Composition)

| | |
|---|---|
| Binder resin (polymethyl methacrylate): | 90% by weight |
| Sensitizing dye D15: | 1.5% by weight |
| Initiator compound A-6: | 5.0% by weight |
| Acid decolorable dye (naphthalenesulfonic acid salt of Victoria Pure Blue): | 2.0% by weight |

The resulting blue photosensitive material was exposed using a metal halide lamp for 30 seconds. The blue color completely decolorized, and the material was changed to a pale yellow transparent film. Thus, by utilizing the acid generation function of the present initiation system, it was possible to apply the photosensitive composition of the invention as an image forming material utilizing a discoloring function.

Example 34

The same procedures as in Example 33 were followed, except that the initiator compound was changed to A-7. Photo-decolorization of the dye in an exposed region was noticed in the same manner as in Example 33.

Example 35

The same procedures as in Example 33 were followed, except that the initiator compound was changed to A-8. Photo-decolorization of the dye in an exposed region was noticed in the same manner as in Example 33.

Example 36

A photosensitive layer using a photosensitive composition having the following formulation was coated on a PET film such that the coating amount was 1.5 g/m².

(Photosensitive Composition)

| | |
|---|---|
| Binder resin (polymethyl methacrylate): | 91% by weight |
| Sensitizing dye D26: | 1.3% by weight |
| Initiator compound A-9: | 7.7% by weight |

The film surface pH on the surface of the resulting photosensitive material was measured and found to be 5.4. Next, the photosensitive material was exposed with a xenon lamp for 5 minutes, and its film surface pH was measured and found to be 9.2. Thus, by utilizing a light-base generation ability of the present initiation system, it was possible to apply the photosensitive composition of the invention as a surface pH modification material.

Example 37

A photosensitive layer using a photosensitive composition having the following formulation was coated on a PET film such that the coating amount was 1.5 g/m².

(Photosensitive Composition)

| | |
|---|---|
| Binder resin (polymethyl methacrylate): | 89.0% by weight |
| Sensitizing dye D25: | 1.3% by weight |
| Initiator compound A-6: | 7.7% by weight |

-continued

| | |
|---|---|
| Oxidative color developing dye (Leuco Crystal Violet): | 2.0% by weight |

The resulting pale yellow transparent photosensitive material was exposed using a metal halide lamp for 30 seconds. As a result, the material caused color development to a vivid blue. It is considered that the leuco dye caused oxidative color development due to the radical generation. Thus, by utilizing the acid generation function of the present initiation system, it was possible to apply the photosensitive composition of the invention as an image forming material utilizing a discoloring function.

The photosensitive composition of the invention has a sufficient sensitivity suited for scanning exposure by a short wave semiconductor layer such as InGaN and is useful as a photosensitive layer of a lithographic printing plate precursor having excellent printing resistance, staining property and stability. Also, when a novel iminooxazolidinone derivative compound of the invention as a sensitizing dye is applied to a photoinitiation system to be used in the foregoing photosensitive composition, there give rise to an effect such that it can generate a radical, an acid, or a base with high sensitivity against an oscillation wavelength of the foregoing short wave semiconductor laser.

This application is based on Japanese Patent application JP 2003-96765, filed Mar. 31, 2003, and Japanese Patent application JP 2003-311253, filed Sep. 3, 2003, the entire contents of those are hereby incorporated by reference, the same as if set forth at length.

What is claimed is:
1. A photosensitive composition containing:
(A) a sensitizing dye represented by the following formula (2):

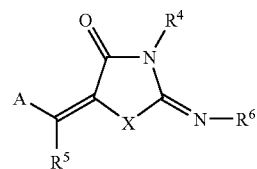

(2)

wherein A represents an optionally substituted aromatic or heterocyclic ring; X represents an oxygen atom; $R^4$ and $R^5$ each independently represents a hydrogen atom or a monovalent non-metallic atomic group; $R^6$ represents a substituted aryl group, wherein the substituent group in the substituted aryl group is selected from the group consisting of an ester group and a cyano group, and wherein the sum of the Hammett's values on the substituent group(s) of the substituted aryl group is greater than 0; and A and $R^4$, $R^5$ or $R^6$ may be bonded to each other to form an aliphatic or aromatic ring;
(B) an initiator compound capable of generating a radical, an acid, or a base; and
(C) a compound whose physical or chemical characteristic irreversibly changes by at least one of a radical, an acid, and a base,
wherein the initiator compound (B) is a hexaaryl biimidazole.
2. The photosensitive composition according to claim 1, further containing (D) a binder polymer.

3. The photosensitive composition according to claim 1, further containing (E-1) a cosensitizer.

4. The photosensitive composition of claim 1, wherein the substituent group in the substituted aryl group is present at an ortho position on the substituted aryl group skeleton.

5. A lithographic printing plate precursor comprising a photosensitive layer containing the photosensitive composition according to claim 1.

6. A compound represented by the following formula (2):

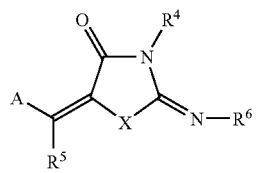

(2)

wherein A represents an optionally substituted aromatic or heterocyclic ring; X represents an oxygen atom; $R^4$ and $R^5$ each independently represents a hydrogen atom or a monovalent non-metallic atomic group; $R^6$ represents a substituted aryl group, wherein the substituent group in the substituted aryl group is selected from the group consisting of an ester group and a cyano group, and wherein the sum of the Hammett's values on the substituent group(s) of the substituted aryl group is greater than 0; and A and $R^4$, $R^5$ or $R^6$ may be bonded to each other to form an aliphatic or aromatic ring.

7. A photosensitive composition containing:
(A-1) a sensitizing dye represented by the following formula (3):

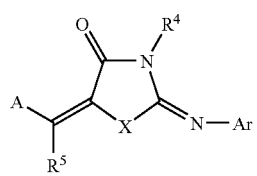

(3)

wherein A represents an optionally substituted aromatic or heterocyclic ring; X represents an oxygen atom, a sulfur atom, or —N($R^1$)—; $R^1$, $R^4$ and $R^5$ each independently represents a hydrogen atom or a monovalent non-metallic atomic group; A and $R^1$, $R^4$ or $R^5$ may be bonded to each other to form an aliphatic or aromatic ring; and Ar represents an aromatic ring or heterocyclic ring having at least one substituent group selected from the group consisting of an ester group and a cyano group, provided that the sum of the Hammett's values of the substituent group(s) on the Ar skeleton is greater than 0;

(B-1) a hexaaryl biimidazole; and
(C-1) an addition polymerizable compound capable of being reacted by at least one of a radical, an acid and a base.

8. The photosensitive composition according to claim 7, further containing (D) a binder polymer.

9. The photosensitive composition according to claim 7, further containing (E-1) a cosensitizer.

10. A photosensitive composition containing:
(A) a sensitizing dye represented by the following formula (2):

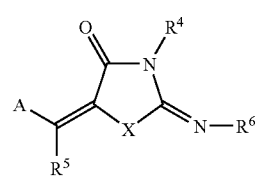

(2)

wherein A represents an optionally substituted aromatic or heterocyclic ring: X represents an oxygen atom; $R^4$ and $R^5$ each independently represents a hydrogen atom or a monovalent non-metallic atomic group; $R^6$ represents a substituted aryl group, wherein the substituent group in the substituted aryl group is selected from the group consisting of an ester group and a cyano group, and wherein the sum of the Hammett's values on the substituent group(s) of the substituted aryl group is greater than 0; and A and $R^4$, $R^5$ or may be bonded to each other to form an aliphatic or aromatic ring;

(B) an initiator compound capable of generating a radical, an acid, or a base; and (C) a compound whose physical or chemical characteristics irreversibly change by at least one of a radical, an acid, and a base, wherein the initiator compound (B) is

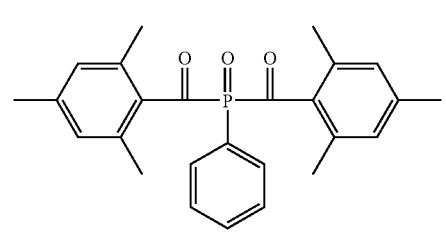

(A-2)

* * * * *